(12) United States Patent
Pan et al.

(10) Patent No.: US 8,598,450 B2
(45) Date of Patent: Dec. 3, 2013

(54) CONJUGATED POLYMERS AND THEIR USE IN OPTOELECTRONIC DEVICES

(75) Inventors: Hualong Pan, Skokie, IL (US); Martin Drees, Glenview, IL (US); Zhengguo Zhu, Chelmsford, MA (US); Yan Yao, Mountain View, CA (US); Shaofeng Lu, Skokie, IL (US); Antonio Facchetti, Chicago, IL (US)

(73) Assignee: Polyera Corporation, Skokie, IL (US)

( * ) Notice: Subject to any disclaimer, the term of this patent is extended or adjusted under 35 U.S.C. 154(b) by 0 days.

(21) Appl. No.: 13/304,379

(22) Filed: Nov. 24, 2011

(65) Prior Publication Data

US 2012/0186652 A1 Jul. 26, 2012

Related U.S. Application Data

(60) Provisional application No. 61/416,890, filed on Nov. 24, 2010.

(51) Int. Cl.
*H01L 31/00* (2006.01)
(52) U.S. Cl.
USPC ...... 136/263; 526/256; 257/40; 257/E51.005; 257/E51.008
(58) Field of Classification Search
USPC ............. 136/263; 526/256; 257/40, E51.005, 257/E51.018
See application file for complete search history.

(56) References Cited

U.S. PATENT DOCUMENTS

| | | | |
|---|---|---|---|
| 2009/0065766 A1 | 3/2009 | Li | 257/40 |
| 2009/0302311 A1* | 12/2009 | Turbiez et al. | 257/40 |
| 2010/0307594 A1* | 12/2010 | Zhu et al. | 136/263 |
| 2011/0226338 A1 | 9/2011 | Lu et al. | 136/263 |
| 2012/0059140 A1 | 3/2012 | Hayoz et al. | 528/8 |
| 2012/0187385 A1 | 7/2012 | Pan et al. | 257/40 |
| 2013/0098448 A1 | 4/2013 | Zhu et al. | 136/263 |

OTHER PUBLICATIONS

Hou et al., "Bandgap and Molecular Energy Level Control of the Low-Bandgap Polymers Based on 3,6-Dithiophen-2-yl-2,5-dihydropyrrolo[3,4-c]pyrrole-1,4-dione toward Highly Efficient Polymer Solar Cells," *Macromolecules*, 42(17): 6564-6571 (2009).
Li et al., "A High Mobility P-Type DPP-Thieno[3,2-b]thiophene Copolymer for Organic Thin-Film Transistors," *Adv. Mater.*, 22:4862-4866 (2010).

* cited by examiner

*Primary Examiner* — Shane Fang
(74) *Attorney, Agent, or Firm* — Karen K. Chan

(57) ABSTRACT

Disclosed are certain polymeric compounds and their use as organic semiconductors in organic and hybrid optical, optoelectronic, and/or electronic devices such as photovoltaic cells, light emitting diodes, light emitting transistors, field effect transistors, and photodetectors. The disclosed compounds can provide improved device performance, for example, as measured by power conversion efficiency, fill factor, open circuit voltage, field-effect mobility, on/off current ratios, and/or air stability when used in photovoltaic cells or transistors. The disclosed compounds can have good solubility in common solvents enabling device fabrication via solution processes.

19 Claims, 3 Drawing Sheets

CONJUGATED POLYMERS AND THEIR USE IN OPTOELECTRONIC DEVICES

CROSS REFERENCE TO RELATED APPLICATIONS

This application claims priority to and the benefit of U.S. Provisional Patent Application Ser. No. 61/416,890, filed on Nov. 24, 2010, the disclosure of which is incorporated by reference herein in its entirety.

BACKGROUND

A new generation of optoelectronic devices such as organic photovoltaics (OPVs), organic field-effect transistors, organic photodetectors, and organic light-emitting transistors (OLETs) are fabricated using organic semiconductors as their active components. To be commercially relevant, these organic semiconductor-based devices should be processable in a cost-effective manner while meeting certain threshold device performance criteria.

Bulk heterojunction (BHJ) solar cells commonly are considered the most promising OPV structures because they can be fabricated using roll-to-roll and large-scale production. BHJ solar cells include a photoactive layer disposed between an anode and a cathode, where the photoactive layer is composed of a blend film including a "donor" material and an "acceptor" material. State-of-the-art BHJ solar cells use fullerene-based compounds as the acceptor material. Typical fullerenes include C60 or C70 "bucky ball" compounds functionalized with solubilizing side chains, such as C60-[6,6]-phenyl-$C_{61}$-butyric acid methyl ester (C60-PCBM) or C70-PCBM. The most common donor material used in BHJ solar cells is poly(3-hexylthiophene) (P3HT). However, it is well known that P3HT has poor air stability. Also, it has proven challenging to attain an overall power conversion efficiency (PCE) over about 5%.

Meanwhile, despite extensive research on organic photodetectors in the past decade, there have been few reports of organic donor materials that provide efficient absorption in near-infrared (>700 nm) photodetectors.

SUMMARY

In light of the foregoing, the present teachings provide certain polymeric compounds that can be used as photoactive semiconductor materials. Also provided are associated devices and related methods for the preparation and use of these compounds. The present compounds can exhibit properties such as optimized optical absorption, good charge transport characteristics and chemical stability in ambient conditions, low-temperature processability, large solubility in common solvents, and processing versatility (e.g., via various solution processes). As a result, optoelectronic devices such as solar cells and photodetectors that incorporate one or more of the present compounds as the photoactive layer can exhibit high performance in ambient conditions, for example, demonstrating one or more of low band-gap, high fill factor, high open circuit voltage, and high power conversion efficiency, and preferably all of these criteria. The present compounds also can exhibit improved surface morphology and other desirable structural properties when prepared as thin films. Similarly, other organic semiconductor-based devices such as OLETs can be fabricated efficiently using the organic semiconductor materials described herein.

The present teachings also provide methods of preparing such compounds and semiconductor materials, as well as various compositions, composites, and devices that incorporate the compounds and semiconductor materials disclosed herein.

The foregoing as well as other features and advantages of the present teachings will be more fully understood from the following figures, description, examples, and claims.

BRIEF DESCRIPTION OF DRAWINGS

It should be understood that the drawings described below are for illustration purposes only. The drawings are not necessarily to scale, with emphasis generally being placed upon illustrating the principles of the present teachings. The drawings are not intended to limit the scope of the present teachings in any way.

DETAILED DESCRIPTION

Figure 1:
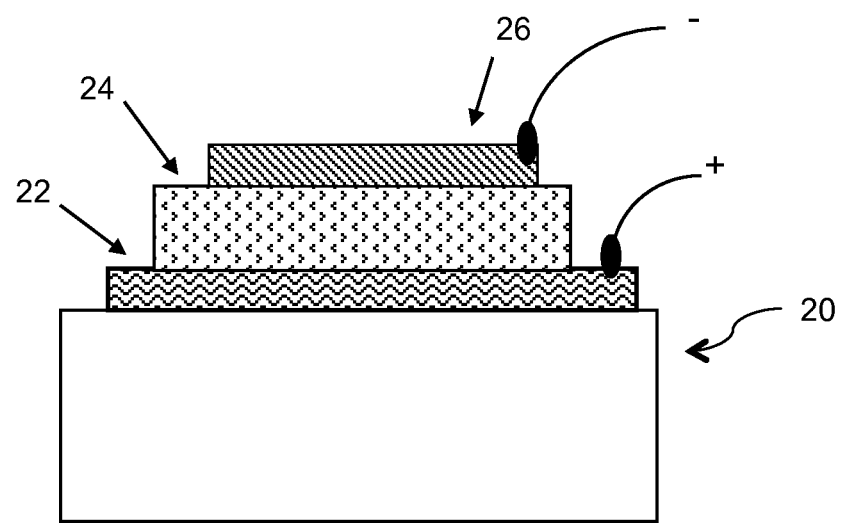
FIG. 1 illustrates a representative bulk-heterojunction (BHJ) organic photovoltaic device (also known as a solar cell) structure, which can incorporate one or more compounds of the present teachings as its photoactive layer.

The present teachings provide polymeric compounds including a repeating unit of the formula:

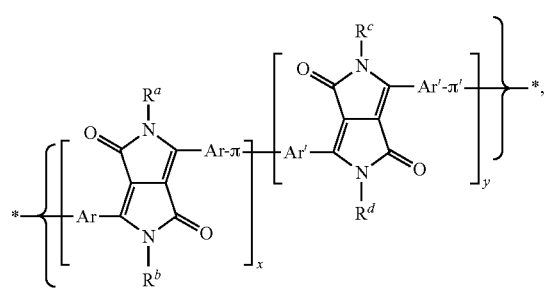

where Ar are alkylated heteroaryl groups; Ar' are optionally alkylated heteroaryl groups; and $R^a$, $R^b$, $R^c$, $R^d$, $\pi$, $\pi'$, x and y are as defined herein.

Compounds of the present teachings can exhibit semiconductor behavior such as optimized light absorption/charge separation in a photovoltaic device; charge transport/recombination/light emission in a light-emitting device; and/or high carrier mobility and/or good current modulation characteristics in a field-effect device. In addition, the present compounds can possess certain processing advantages such as solution-processability and/or good stability (e.g., air stability) in ambient conditions. The compounds of the present teachings can be used to prepare either p-type (donor or hole-transporting), n-type (acceptor or electron-transporting), or ambipolar semiconductor materials, which in turn can be used to fabricate various organic or hybrid optoelectronic articles, structures and devices, including organic photovoltaic devices, organic field-effect transistors, organic light-emitting transistors, and organic photodetectors.

Throughout the application, where compositions are described as having, including, or comprising specific components, or where processes are described as having, including, or comprising specific process steps, it is contemplated that compositions of the present teachings also consist essentially of, or consist of, the recited components, and that the processes of the present teachings also consist essentially of, or consist of, the recited process steps.

In the application, where an element or component is said to be included in and/or selected from a list of recited elements or components, it should be understood that the element or component can be any one of the recited elements or components, or the element or component can be selected from a group consisting of two or more of the recited elements or components. Further, it should be understood that elements and/or features of a composition, an apparatus, or a method described herein can be combined in a variety of ways without departing from the spirit and scope of the present teachings, whether explicit or implicit herein.

The use of the terms "include," "includes", "including," "have," "has," or "having" should be generally understood as open-ended and non-limiting unless specifically stated otherwise.

The use of the singular herein includes the plural (and vice versa) unless specifically stated otherwise. In addition, where the use of the term "about" is before a quantitative value, the present teachings also include the specific quantitative value itself, unless specifically stated otherwise. As used herein, the term "about" refers to a ±10% variation from the nominal value unless otherwise indicated or inferred.

It should be understood that the order of steps or order for performing certain actions is immaterial so long as the present teachings remain operable. Moreover, two or more steps or actions may be conducted simultaneously.

As used herein, a "p-type semiconductor material" or a "donor" material refers to a semiconductor material, for example, an organic semiconductor material, having holes as the majority current or charge carriers. In some embodiments, when a p-type semiconductor material is deposited on a substrate, it can provide a hole mobility in excess of about $10^{-5}$ cm$^2$/Vs. In the case of field-effect devices, a p-type semiconductor also can exhibit a current on/off ratio of greater than about 10.

As used herein, an "n-type semiconductor material" or an "acceptor" material refers to a semiconductor material, for example, an organic semiconductor material, having electrons as the majority current or charge carriers. In some embodiments, when an n-type semiconductor material is deposited on a substrate, it can provide an electron mobility in excess of about $10^{-5}$ cm$^2$/Vs. In the case of field-effect devices, an n-type semiconductor also can exhibit a current on/off ratio of greater than about 10.

As used herein, "mobility" refers to a measure of the velocity with which charge carriers, for example, holes (or units of positive charge) in the case of a p-type semiconductor material and electrons (or units of negative charge) in the case of an n-type semiconductor material, move through the material under the influence of an electric field. This parameter, which depends on the device architecture, can be measured using a field-effect device or space-charge limited current measurements.

As used herein, a compound can be considered "ambient stable" or "stable at ambient conditions" when a transistor incorporating the compound as its semiconducting material exhibits a carrier mobility that is maintained at about its initial measurement when the compound is exposed to ambient conditions, for example, air, ambient temperature, and humidity, over a period of time. For example, a compound can be described as ambient stable if a transistor incorporating the compound shows a carrier mobility that does not vary more than 20% or more than 10% from its initial value after exposure to ambient conditions, including, air, humidity and temperature, over a 3 day, 5 day, or 10 day period.

As used herein, the "fill factor (FF)" of a solar cell is the ratio (given as a percentage) of the actual maximum obtainable power, ($P_m$ or $V_{mp}*J_{mp}$), to the theoretical (not actually obtainable) power, ($J_{sc}*V_{oc}$). Accordingly, FF can be determined using the equation:

$$FF=(V_{mp}*J_{mp})/(J_{sc}*V_{oc})$$

where $J_{mp}$ and $V_{mp}$ represent the current density and voltage at the maximum power point ($P_m$), respectively, this point being obtained by varying the resistance in the circuit until J*V is at its greatest value; and $J_{sc}$, and $V_{oc}$ represent the short circuit current and the open circuit voltage, respectively. Fill factor is a key parameter in evaluating the performance of solar cells. Commercial solar cells typically have a fill factor of about 0.60% or greater.

As used herein, the "open-circuit voltage ($V_{oc}$)" of a solar cell is the difference in the electrical potentials between the anode and the cathode of the solar cell when there is no external load connected.

As used herein, the "power conversion efficiency (PCE)" of a solar cell is the percentage of power converted from absorbed light to electrical energy. The PCE of a solar cell can be calculated by dividing the maximum power point ($P_m$) by the input light irradiance (E, in W/m$^2$) under standard test conditions (STC) and the surface area of the solar cell ($A_c$ in m$^2$). STC typically refers to a temperature of 25° C. and an irradiance of 1000 W/m$^2$ with an air mass 1.5 (AM 1.5) spectrum.

As used herein, a component (such as a thin film layer) can be considered "photoactive" if it contains one or more compounds that can absorb photons to produce excitons for the generation of a photocurrent.

As used herein, "solution-processable" refers to compounds (e.g., polymers), materials, or compositions that can be used in various solution-phase processes including spin-coating, printing (e.g., inkjet printing, gravure printing, offset printing and the like), spray coating, electrospray coating, drop casting, dip coating, and blade coating.

As used herein, a "semicrystalline polymer" refers to a polymer that has an inherent tendency to crystallize at least partially either when cooled from a melted state or deposited from solution, when subjected to kinetically favorable conditions such as slow cooling, or low solvent evaporation rate and so forth. The crystallization or lack thereof can be readily identified by using several analytical methods, for example, differential scanning calorimetry (DSC) and/or X-ray diffraction (XRD).

As used herein, "annealing" refers to a post-deposition heat treatment to the semicrystalline polymer film in ambient or under reduced/increased pressure for a time duration of more than 100 seconds, and "annealing temperature" refers to the maximum temperature that the polymer film is exposed to for at least 60 seconds during this process of annealing. Without wishing to be bound by any particular theory, it is believed that annealing can result in an increase of crystallinity in the polymer film, where possible, thereby increasing field effect mobility. The increase in crystallinity can be monitored by several methods, for example, by comparing the differential scanning calorimetry (DSC) or X-ray diffraction (XRD) measurements of the as-deposited and the annealed films.

As used herein, a "polymeric compound" (or "polymer") refers to a molecule including a plurality of one or more repeating units connected by covalent chemical bonds. A polymeric compound can be represented by the general formula:

wherein M is the repeating unit or monomer. The polymeric compound can have only one type of repeating unit as well as two or more types of different repeating units. When a polymeric compound has only one type of repeating unit, it can be referred to as a homopolymer. When a polymeric compound has two or more types of different repeating units, the term "copolymer" or "copolymeric compound" can be used instead. For example, a copolymeric compound can include repeating units

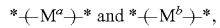

where $M^a$ and $M^b$ represent two different repeating units. Unless specified otherwise, the assembly of the repeating units in the copolymer can be head-to-tail, head-to-head, or tail-to-tail. In addition, unless specified otherwise, the copolymer can be a random copolymer, an alternating copolymer, or a block copolymer. For example, the general formula:

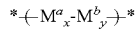

can be used to represent a copolymer of $M^a$ and $M^b$ having x mole fraction of $M^a$ and y mole fraction of $M^b$ in the copolymer, where the manner in which comonomers $M^a$ and $M^b$ is repeated can be alternating, random, regiorandom, regioregular, or in blocks. In addition to its composition, a polymeric compound can be further characterized by its degree of polymerization (n) and molar mass (e.g., number average molecular weight ($M_n$) and/or weight average molecular weight ($M_w$) depending on the measuring technique(s)).

As used herein, "halo" or "halogen" refers to fluoro, chloro, bromo, and iodo.

As used herein, "oxo" refers to a double-bonded oxygen (i.e., =O).

As used herein, "alkyl" refers to a straight-chain or branched saturated hydrocarbon group. Examples of alkyl groups include methyl (Me), ethyl (Et), propyl (e.g., n-propyl and iso-propyl), butyl (e.g., n-butyl, iso-butyl, sec-butyl, tert-butyl), pentyl groups (e.g., n-pentyl, iso-pentyl, neo-pentyl), hexyl groups, and the like. In various embodiments, an alkyl group can have 1 to 40 carbon atoms (i.e., $C_{1-40}$ alkyl group), for example, 1-20 carbon atoms (i.e., $C_{1-20}$ alkyl group). In some embodiments, an alkyl group can have 1 to 6 carbon atoms, and can be referred to as a "lower alkyl group." Examples of lower alkyl groups include methyl, ethyl, propyl (e.g., n-propyl and iso-propyl), and butyl groups (e.g., n-butyl, iso-butyl, sec-butyl, tert-butyl). In some embodiments, alkyl groups can be substituted as described herein. An alkyl group is generally not substituted with another alkyl group, an alkenyl group, or an alkynyl group.

As used herein, "haloalkyl" refers to an alkyl group having one or more halogen substituents. At various embodiments, a haloalkyl group can have 1 to 40 carbon atoms (i.e., $C_{1-40}$ haloalkyl group), for example, 1 to 20 carbon atoms (i.e., $C_{1-20}$ haloalkyl group). Examples of haloalkyl groups include $CF_3$, $C_2F_5$, $CHF_2$, $CH_2F$, $CCl_3$, $CHCl_2$, $CH_2Cl$, $C_2Cl_5$, and the like. Perhaloalkyl groups, i.e., alkyl groups where all of the hydrogen atoms are replaced with halogen atoms (e.g., $CF_3$ and $C_2F_5$), are included within the definition of "haloalkyl." For example, a $C_{1-40}$ haloalkyl group can have the formula $-C_sH_{2s+1-t}X^0_t$, where $X^0$, at each occurrence, is F, Cl, Br or I, s is an integer in the range of 1 to 40, and t is an integer in the range of 1 to 81, provided that t is less than or equal to 2s+1. Haloalkyl groups that are not perhaloalkyl groups can be substituted as described herein.

As used herein, "alkoxy" refers to —O-alkyl group. Examples of alkoxy groups include, but are not limited to, methoxy, ethoxy, propoxy (e.g., n-propoxy and isopropoxy), t-butoxy, pentoxyl, hexoxyl groups, and the like. The alkyl group in the —O-alkyl group can be substituted as described herein.

As used herein, "alkylthio" refers to an —S-alkyl group. Examples of alkylthio groups include, but are not limited to, methylthio, ethylthio, propylthio (e.g., n-propylthio and iso-propylthio), t-butylthio, pentylthio, hexylthio groups, and the like. The alkyl group in the —S-alkyl group can be substituted as described herein.

As used herein, "alkenyl" refers to a straight-chain or branched alkyl group having one or more carbon-carbon double bonds. Examples of alkenyl groups include ethenyl, propenyl, butenyl, pentenyl, hexenyl, butadienyl, pentadienyl, hexadienyl groups, and the like. The one or more carbon-carbon double bonds can be internal (such as in 2-butene) or terminal (such as in 1-butene). In various embodiments, an alkenyl group can have 2 to 40 carbon atoms (i.e., $C_{2-40}$ alkenyl group), for example, 2 to 20 carbon atoms (i.e., $C_{2-20}$ alkenyl group). In some embodiments, alkenyl groups can be substituted as described herein. An alkenyl group is generally not substituted with another alkenyl group, an alkyl group, or an alkynyl group.

As used herein, "alkynyl" refers to a straight-chain or branched alkyl group having one or more triple carbon-carbon bonds. Examples of alkynyl groups include ethynyl, propynyl, butynyl, pentynyl, hexynyl, and the like. The one or more triple carbon-carbon bonds can be internal (such as in 2-butyne) or terminal (such as in 1-butyne). In various embodiments, an alkynyl group can have 2 to 40 carbon atoms (i.e., $C_{2-40}$ alkynyl group), for example, 2 to 20 carbon atoms (i.e., $C_{2-20}$ alkynyl group). In some embodiments, alkynyl groups can be substituted as described herein. An alkynyl group is generally not substituted with another alkynyl group, an alkyl group, or an alkenyl group.

As used herein, a "cyclic moiety" can include one or more (e.g., 1-6) carbocyclic or heterocyclic rings. The cyclic moiety can be a cycloalkyl group, a heterocycloalkyl group, an aryl group, or a heteroaryl group (i.e., can include only saturated bonds, or can include one or more unsaturated bonds regardless of aromaticity), each including, for example, 3-24 ring atoms and optionally can be substituted as described herein. In embodiments where the cyclic moiety is a "monocyclic moiety," the "monocyclic moiety" can include a 3-14 membered aromatic or non-aromatic, carbocyclic or heterocyclic ring. A monocyclic moiety can include, for example, a phenyl group or a 5- or 6-membered heteroaryl group, each of which optionally can be substituted as described herein. In embodiments where the cyclic moiety is a "polycyclic moiety," the "polycyclic moiety" can include two or more rings fused to each other (i.e., sharing a common bond) and/or connected to each other via a spiro atom, or one or more bridged atoms. A polycyclic moiety can include an 8-24 membered aromatic or non-aromatic, carbocyclic or heterocyclic ring, such as a $C_{8-24}$ aryl group or an 8-24 membered heteroaryl group, each of which optionally can be substituted as described herein.

As used herein, a "fused ring" or a "fused ring moiety" refers to a polycyclic ring system having at least two rings where at least one of the rings is aromatic and such aromatic ring (carbocyclic or heterocyclic) has a bond in common with at least one other ring that can be aromatic or non-aromatic, and carbocyclic or heterocyclic. These polycyclic ring systems can be highly π-conjugated and can include polycyclic aromatic hydrocarbons such as rylenes (or analogs thereof containing one or more heteroatoms) having the formula:

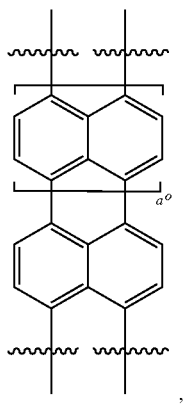

where $a°$ can be an integer in the range of 0-3; coronenes (or analogs thereof containing one or more heteroatoms) having the formula:

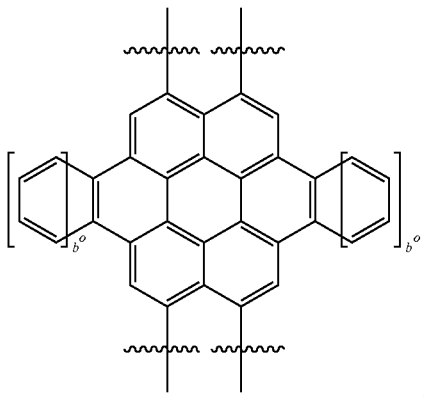

where $b°$ can be an integer in the range of 0-3; and linear acenes (or analogs thereof containing one or more heteroatoms) having the formula:

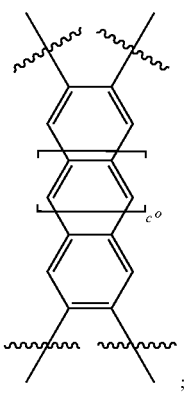

where $c°$ can be an integer in the range of 0-4. The fused ring moiety can be optionally substituted as described herein.

As used herein, "cycloalkyl" refers to a non-aromatic carbocyclic group including cyclized alkyl, alkenyl, and alkynyl groups. In various embodiments, a cycloalkyl group can have 3 to 24 carbon atoms, for example, 3 to 20 carbon atoms (e.g., $C_{3-14}$ cycloalkyl group). A cycloalkyl group can be monocyclic (e.g., cyclohexyl) or polycyclic (e.g., containing fused, bridged, and/or spiro ring systems), where the carbon atoms are located inside or outside of the ring system. Any suitable ring position of the cycloalkyl group can be covalently linked to the defined chemical structure. Examples of cycloalkyl groups include cyclopropyl, cyclobutyl, cyclopentyl, cyclohexyl, cycloheptyl, cyclopentenyl, cyclohexenyl, cyclohexadienyl, cycloheptatrienyl, norbornyl, norpinyl, norcaryl, adamantyl, and spiro[4.5]decanyl groups, as well as their homologs, isomers, and the like. In some embodiments, cycloalkyl groups can be substituted as described herein.

As used herein, "heteroatom" refers to an atom of any element other than carbon or hydrogen and includes, for example, nitrogen, oxygen, silicon, sulfur, phosphorus, and selenium.

As used herein, "cycloheteroalkyl" refers to a non-aromatic cycloalkyl group that contains at least one ring heteroatom selected from O, S, Se, N, P, and Si (e.g., O, S, and N), and optionally contains one or more double or triple bonds. A cycloheteroalkyl group can have 3 to 24 ring atoms, for example, 3 to 20 ring atoms (e.g., 3-14 membered cycloheteroalkyl group). One or more N, P, S, or Se atoms (e.g., N or S) in a cycloheteroalkyl ring may be oxidized (e.g., morpholine N-oxide, thiomorpholine S-oxide, thiomorpholine S,S-dioxide). In some embodiments, nitrogen or phosphorus atoms of cycloheteroalkyl groups can bear a substituent, for example, a hydrogen atom, an alkyl group, or other substituents as described herein. Cycloheteroalkyl groups can also contain one or more oxo groups, such as oxopiperidyl, oxooxazolidyl, dioxo-(1H,3H)-pyrimidyl, oxo-2(1H)-pyridyl, and the like. Examples of cycloheteroalkyl groups include, among others, morpholinyl, thiomorpholinyl, pyranyl, imidazolidinyl, imidazolinyl, oxazolidinyl, pyrazolidinyl, pyrazolinyl, pyrrolidinyl, pyrrolinyl, tetrahydrofuranyl, tetrahydrothiophenyl, piperidinyl, piperazinyl, and the like. In some embodiments, cycloheteroalkyl groups can be substituted as described herein.

As used herein, "aryl" refers to an aromatic monocyclic hydrocarbon ring system or a polycyclic ring system in which two or more aromatic hydrocarbon rings are fused (i.e., having a bond in common with) together or at least one aromatic monocyclic hydrocarbon ring is fused to one or more cycloalkyl and/or cycloheteroalkyl rings. An aryl group can have 6 to 24 carbon atoms in its ring system (e.g., $C_{6-20}$ aryl group), which can include multiple fused rings. In some embodiments, a polycyclic aryl group can have 8 to 24 carbon atoms. Any suitable ring position of the aryl group can be covalently linked to the defined chemical structure. Examples of aryl groups having only aromatic carbocyclic ring(s) include phenyl, 1-naphthyl (bicyclic), 2-naphthyl (bicyclic), anthracenyl (tricyclic), phenanthrenyl (tricyclic), pentacenyl (pentacyclic), and like groups. Examples of polycyclic ring systems in which at least one aromatic carbocyclic ring is fused to one or more cycloalkyl and/or cycloheteroalkyl rings include, among others, benzo derivatives of cyclopentane (i.e., an indanyl group, which is a 5,6-bicyclic cycloalkyl/aromatic ring system), cyclohexane (i.e., a tetrahydronaphthyl group, which is a 6,6-bicyclic cycloalkyl/aromatic ring system), imidazoline (i.e., a benzimidazolinyl group, which is a 5,6-bicyclic cycloheteroalkyl/aromatic ring system), and pyran (i.e., a chromenyl group, which is a 6,6-bicyclic cycloheteroalkyl/aromatic ring system). Other examples of aryl groups include benzodioxanyl, benzodioxolyl, chromanyl, indolinyl groups, and the like. In some embodiments, aryl groups can be substituted as described herein. In some embodiments, an aryl group can have one or more halogen substituents, and can be referred to as a "haloaryl" group. Perhaloaryl groups, i.e., aryl groups where all of the hydrogen atoms are replaced with halogen atoms (e.g., $—C_6F_5$), are included within the definition of "haloaryl." In certain embodiments, an aryl group is substituted with another aryl group and can be referred to as a biaryl group. Each of the aryl groups in the biaryl group can be substituted as disclosed herein.

As used herein, "arylalkyl" refers to an -alkyl-aryl group, where the arylalkyl group is covalently linked to the defined chemical structure via the alkyl group. An arylalkyl group is within the definition of a $—Y—C_{6-14}$ aryl group, where Y is as defined herein. An example of an arylalkyl group is a benzyl group ($—CH_2—C_6H_5$). An arylalkyl group can be optionally substituted, i.e., the aryl group and/or the alkyl group, can be substituted as disclosed herein.

As used herein, "heteroaryl" refers to an aromatic monocyclic ring system containing at least one ring heteroatom selected from oxygen (O), nitrogen (N), sulfur (S), silicon (Si), and selenium (Se) or a polycyclic ring system where at least one of the rings present in the ring system is aromatic and contains at least one ring heteroatom. Polycyclic heteroaryl groups include those having two or more heteroaryl rings fused together, as well as those having at least one monocyclic heteroaryl ring fused to one or more aromatic carbocyclic rings, non-aromatic carbocyclic rings, and/or non-aromatic cycloheteroalkyl rings. A heteroaryl group, as a whole, can have, for example, 5 to 24 ring atoms and contain 1-5 ring heteroatoms (i.e., 5-20 membered heteroaryl group). The heteroaryl group can be attached to the defined chemical structure at any heteroatom or carbon atom that results in a stable structure. Generally, heteroaryl rings do not contain O—O, S—S, or S—O bonds. However, one or more N or S atoms in a heteroaryl group can be oxidized (e.g., pyridine N-oxide, thiophene S-oxide, thiophene S,S-dioxide). Examples of heteroaryl groups include, for example, the 5- or 6-membered monocyclic and 5-6 bicyclic ring systems shown below:

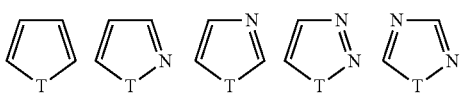

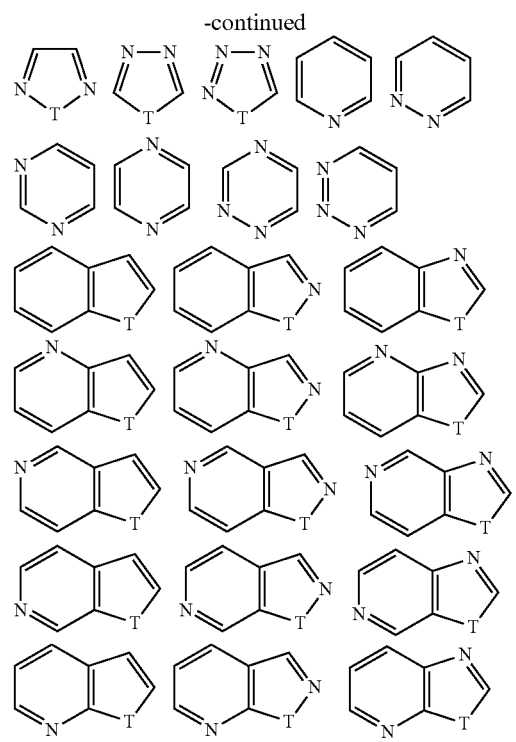

where T is O, S, NH, N-alkyl, N-aryl, N-(arylalkyl) (e.g., N-benzyl), $SiH_2$, SiH(alkyl), $Si(alkyl)_2$, SiH(arylalkyl), $Si(arylalkyl)_2$, or Si(alkyl)(arylalkyl). Examples of such heteroaryl rings include pyrrolyl, furyl, thienyl, pyridyl, pyrimidyl, pyridazinyl, pyrazinyl, triazolyl, tetrazolyl, pyrazolyl, imidazolyl, isothiazolyl, thiazolyl, thiadiazolyl, isoxazolyl, oxazolyl, oxadiazolyl, indolyl, isoindolyl, benzofuryl, benzothienyl, quinolyl, 2-methylquinolyl, isoquinolyl, quinoxalyl, quinazolyl, benzotriazolyl, benzimidazolyl, benzothiazolyl, benzisothiazolyl, benzisoxazolyl, benzoxadiazolyl, benzoxazolyl, cinnolinyl, 1H-indazolyl, 2H-indazolyl, indolizinyl, isobenzofuyl, naphthyridinyl, phthalazinyl, pteridinyl, purinyl, oxazolopyridinyl, thiazolopyridinyl, imidazopyridinyl, furopyridinyl, thienopyridinyl, pyridopyrimidinyl, pyridopyrazinyl, pyridopyridazinyl, thienothiazolyl, thienoxazolyl, thienoimidazolyl groups, and the like. Further examples of heteroaryl groups include 4,5,6,7-tetrahydroindolyl, tetrahydroquinolinyl, benzothienopyridinyl, benzofuropyridinyl groups, and the like. In some embodiments, heteroaryl groups can be substituted as described herein.

Compounds of the present teachings can include a "divalent group" defined herein as a linking group capable of forming a covalent bond with two other moieties. For example, compounds of the present teachings can include a divalent $C_{1-20}$ alkyl group (e.g., a methylene group), a divalent $C_{2-20}$ alkenyl group (e.g., a vinylyl group), a divalent $C_{2-20}$ alkynyl group (e.g., an ethynylyl group). a divalent $C_{6-14}$ aryl group (e.g., a phenylyl group); a divalent 3-14 membered cycloheteroalkyl group (e.g., a pyrrolidylyl), and/or a divalent 5-14 membered heteroaryl group (e.g., a thienylyl group). Generally, a chemical group (e.g., —Ar—) is understood to be divalent by the inclusion of the two bonds before and after the group.

The electron-donating or electron-withdrawing properties of several hundred of the most common substituents, reflecting all common classes of substituents have been determined, quantified, and published. The most common quantification of electron-donating and electron-withdrawing properties is in terms of Hammett σ values. Hydrogen has a Hammett σ value of zero, while other substituents have Hammett σ values that increase positively or negatively in direct relation to their electron-withdrawing or electron-donating characteristics. Substituents with negative Hammett σ values are considered electron-donating, while those with positive Hammett σ values are considered electron-withdrawing. See Lange's Handbook of Chemistry, 12th ed., McGraw Hill, 1979, Table 3-12, pp. 3-134 to 3-138, which lists Hammett σ values for a large number of commonly encountered substituents and is incorporated by reference herein.

It should be understood that the term "electron-accepting group" can be used synonymously herein with "electron acceptor" and "electron-withdrawing group". In particular, an "electron-withdrawing group" ("EWG") or an "electron-accepting group" or an "electron-acceptor" refers to a functional group that draws electrons to itself more than a hydrogen atom would if it occupied the same position in a molecule. Examples of electron-withdrawing groups include, but are not limited to, halogen or halo (e.g., F, Cl, Br, I), —$NO_2$, —CN, —NC, —$S(R^0)_2^+$, —$N(R^0)_3^+$, —$SO_3H$, —$SO_2R^0$, —$SO_3R^0$, —$SO_2NHR^0$, —$SO_2N(R^0)_2$, —COOH, —$COR^0$, —$COOR^0$, —$CONHR^0$, —$CON(R^0)_2$, $C_{1-40}$ haloalkyl groups, $C_{6-14}$ aryl groups, and 5-14 membered electron-poor heteroaryl groups; where $R^0$ is a $C_{1-20}$ alkyl group, a $C_{2-20}$ alkenyl group, a $C_{2-20}$ alkynyl group, a $C_{1-20}$ haloalkyl group, a $C_{1-20}$ alkoxy group, a $C_{6-14}$ aryl group, a $C_{3-14}$ cycloalkyl group, a 3-14 membered cycloheteroalkyl group, and a 5-14 membered heteroaryl group, each of which can be optionally substituted as described herein. For example, each of the $C_{1-20}$ alkyl group, the $C_{2-20}$ alkenyl group, the $C_{2-20}$ alkynyl group, the $C_{1-20}$ haloalkyl group, the $C_{1-20}$ alkoxy group, the $C_{6-14}$ aryl group, the $C_{3-14}$ cycloalkyl group, the 3-14 membered cycloheteroalkyl group, and the 5-14 membered heteroaryl group can be optionally substituted with 1-5 small electron-withdrawing groups such as F, Cl, Br, —$NO_2$, —CN, —NC, —$S(R^0)_2^+$, —$N(R^0)_3^+$, —$SO_3H$, —$SO_2R^0$, —$SO_3R^0$, —$SO_2NHR^0$, —$SO_2N(R^0)_2$, —COOH, —$COR^0$, —$COOR^0$, —$CONHR^0$, and —$CON(R^0)_2$.

It should be understood that the term "electron-donating group" can be used synonymously herein with "electron donor." In particular, an "electron-donating group" or an "electron-donor" refers to a functional group that donates electrons to a neighboring atom more than a hydrogen atom would if it occupied the same position in a molecule. Examples of electron-donating groups include —OH, —$OR^0$, —$NH_2$, —$NHR^0$, —$N(R^0)_2$, and 5-14 membered electron-rich heteroaryl groups, where $R^0$ is a $C_{1-20}$ alkyl group, a $C_{2-20}$ alkenyl group, a $C_{2-20}$ alkynyl group, a $C_{6-14}$ aryl group, or a $C_{3-14}$ cycloalkyl group.

Various unsubstituted heteroaryl groups can be described as electron-rich (or π-excessive) or electron-poor (or π-deficient). Such classification is based on the average electron density on each ring atom as compared to that of a carbon atom in benzene. Examples of electron-rich systems include 5-membered heteroaryl groups having one heteroatom such as furan, pyrrole, and thiophene; and their benzofused counterparts such as benzofuran, benzopyrrole, and benzothiophene. Examples of electron-poor systems include 6-membered heteroaryl groups having one or more heteroatoms such as pyridine, pyrazine, pyridazine, and pyrimidine; as well as their benzofused counterparts such as quinoline, isoquinoline, quinoxaline, cinnoline, phthalazine, naphthyridine, quinazoline, phenanthridine, acridine, and purine. Mixed heteroaromatic rings can belong to either class depending on the type, number, and position of the one or more heteroatom(s) in the ring. See Katritzky, A. R and Lagowski, J. M., *Heterocyclic Chemistry* (John Wiley & Sons, New York, 1960).

At various places in the present specification, substituents are disclosed in groups or in ranges. It is specifically intended that the description include each and every individual sub-combination of the members of such groups and ranges. For example, the term "$C_{1-6}$ alkyl" is specifically intended to individually disclose $C_1$, $C_2$, $C_3$, $C_4$, $C_5$, $C_6$, $C_{1-6}$, $C_{1-5}$, $C_{1-4}$, $C_{1-3}$, $C_{1-2}$, $C_{2-6}$, $C_{2-5}$, $C_{2-4}$, $C_{2-3}$, $C_{3-6}$, $C_{3-5}$, $C_{3-4}$, $C_{4-6}$, $C_{4-5}$, and $C_{5-6}$ alkyl. By way of other examples, an integer in the range of 0 to 40 is specifically intended to individually disclose 0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, and 40, and an integer in the range of 1 to 20 is specifically intended to individually disclose 1, 2, 3, 4, 5, 6, 7, 8, 9, 10, 11, 12, 13, 14, 15, 16, 17, 18, 19, and 20. Additional examples include that the phrase "optionally substituted with 1-5 substituents" is specifically intended to individually disclose a chemical group that can include 0, 1, 2, 3, 4, 5, 0-5, 0-4, 0-3, 0-2, 0-1, 1-5, 1-4, 1-3, 1-2, 2-5, 2-4, 2-3, 3-5, 3-4, and 4-5 substituents.

Compounds described herein can contain an asymmetric atom (also referred as a chiral center) and some of the compounds can contain two or more asymmetric atoms or centers, which can thus give rise to optical isomers (enantiomers) and geometric isomers (diastereomers). The present teachings include such optical and geometric isomers, including their respective resolved enantiomerically or diastereomerically pure isomers (e.g., (+) or (−) stereoisomer) and their racemic mixtures, as well as other mixtures of the enantiomers and diastereomers. In some embodiments, optical isomers can be obtained in enantiomerically enriched or pure form by standard procedures known to those skilled in the art, which include, for example, chiral separation, diastereomeric salt formation, kinetic resolution, and asymmetric synthesis. The present teachings also encompass cis- and trans-isomers of compounds containing alkenyl moieties (e.g., alkenes, azo, and imines). It also should be understood that the compounds of the present teachings encompass all possible regioisomers in pure form and mixtures thereof. In some embodiments, the preparation of the present compounds can include separating such isomers using standard separation procedures known to those skilled in the art, for example, by using one or more of column chromatography, thin-layer chromatography, simulated moving-bed chromatography, and high-performance liquid chromatography. However, mixtures of regioisomers can be used similarly to the uses of each individual regioisomer of the present teachings as described herein and/or known by a skilled artisan.

It is specifically contemplated that the depiction of one regioisomer includes any other regioisomers and any regioisomeric mixtures unless specifically stated otherwise.

As used herein, a "leaving group" ("LG") refers to a charged or uncharged atom (or group of atoms) that can be displaced as a stable species as a result of, for example, a substitution or elimination reaction. Examples of leaving groups include, but are not limited to, halogen (e.g., Cl, Br, I), azide ($N_3$), thiocyanate (SCN), nitro ($NO_2$), cyanate (CN), water ($H_2O$), ammonia ($NH_3$), and sulfonate groups (e.g., $OSO_2$—R, wherein R can be a $C_{1-10}$ alkyl group or a $C_{6-14}$ aryl group each optionally substituted with 1-4 groups independently selected from a $C_{1-10}$ alkyl group and an electron-withdrawing group) such as tosylate (toluenesulfonate, OTs), mesylate (methanesulfonate, OMs), brosylate (p-bromobenzenesulfonate, OBs), nosylate (4-nitrobenzenesulfonate, ONs), and triflate (trifluoromethanesulfonate, OTf).

Throughout the specification, structures may or may not be presented with chemical names. Where any question arises as to nomenclature, the structure prevails.

The present teachings relate to polymeric compounds that can be used as photoactive semiconductor materials. The present compounds can have good solubility in various common solvents and good stability in air. When incorporated into optical, electrical, or optoelectronic devices including, but not limited to, photovoltaic or solar cells, light emitting diodes, light emitting transistors, photodetectors, and field-effect transistors, the present compounds can confer various desirable performance properties. For example, when the present compounds are used as the donor material in the photoactive layer of an organic solar cell, the organic solar cell can exhibit high power conversion efficiency (e.g., about 5.0% or greater). When the present compounds are used as the donor material in the photoactive layer of an organic photodetector, the organic photodetector can exhibit high absorption (e.g., about 50% or greater EQE) in the near infrared range (e.g., about 700-800 nm).

More specifically, the present teachings provide polymeric compounds (or polymers) having a repeating unit of the formula:

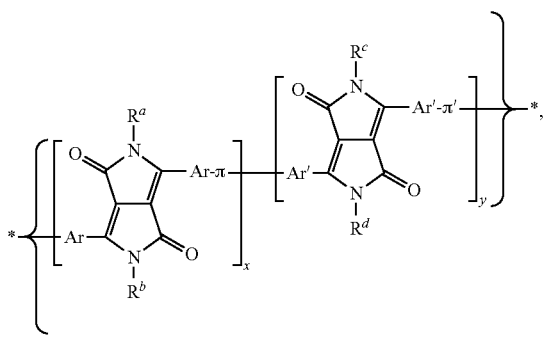

where:
each Ar is an alkylated heteroaryl group;
each Ar' is an optionally alkylated heteroaryl group;
$R^a$, $R^b$, $R^c$, and $R^d$ independently are selected from a $C_{1-40}$ alkyl group, a $C_{2-40}$ alkenyl group, and a $C_{1-40}$ haloalkyl group;
π and π' independently are optionally substituted polycyclic conjugated moieties; and
x and y are real numbers representing mole fractions, wherein $0.05 \leq x \leq 0.95$, $0.05 \leq y \leq 0.95$, and the sum of x and y is about 1.

In various embodiments, the present polymers can have a molecular weight in the range of about 1,000 to about 500,000, for example, about 3,000 to about 300,000.

In some embodiments, the first unit and the second unit

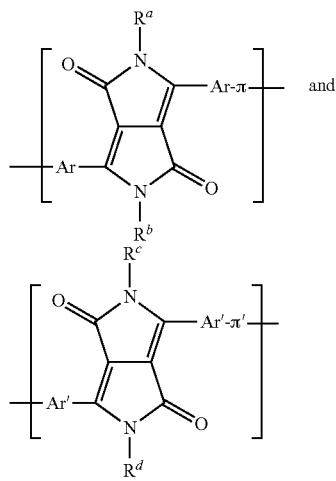

can be identical, that is, Ar is identical to Ar', π is identical to π'; $R^a$ is identical to $R^c$ or $R^d$; and $R^b$ is identical to the other of $R^c$ and $R^d$. In these embodiments, the present polymers can be represented by the formula:

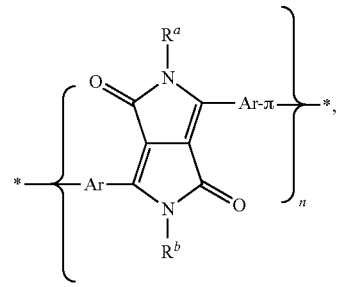

where Ar, $R^a$, $R^b$, and π are as defined herein, and n is the degree of polymerization and can be an integer ranging from 3 to 1,000, for example, from 5 to 1,000, from 8 to 1,000, or from 10 to 1,000.

In other embodiments, the first unit and the second unit can be different from each other in one or more ways, for example, the identity of the Ar/Ar' groups and/or the π/π' groups can be different, and/or the substitution of at least one of the Ar/Ar' groups, the π/π' groups, and the diketopyrrolopyrrole groups can be different. Embodiments of the present compounds including different first unit and second unit can have the two units repeated in a random or alternating manner.

In preferred embodiments, the present compounds are random copolymers wherein the first unit and the second unit are different based on the substitution of at least one of the Ar/Ar' groups, the π/π' groups, and the diketopyrrolopyrrole groups. The mole fraction of the two units can be between about 0.05 and about 0.95. For example, the respective mole fractions (x and y) of the two units can be between about 0.1 and about 0.9, between about 0.2 and about 0.8, between about 0.3 and about 0.7, between about 0.4 and about 0.6, or between about 0.45 and about 0.55. In certain embodiments, the present polymers can include the same mole fraction of the first unit as the second unit (i.e., x=y=0.5).

The inventors have surprisingly discovered that when a diketopyrrolopyrrole-based polymer includes a repeating unit where the diketopyrrolopyrrole group is immediately coupled to two heteroaryl groups which are alkylated at the specific positions described herein, the resulting polymer exhibits significantly higher external quantum efficiencies (EQE) compared to an otherwise identical diketopyrrolopyrrole-based polymer where the two heteroaryl groups are either unsubstituted or alkylated at different positions. Without wishing to be bound by any particular theory, it is believed that the higher efficiencies provided by the present polymers may be attributed to reduced domain sizes. More specifically, the specific substitution pattern of the Ar group described herein is believed to confer improved flexibility to the overall polymer, which leads to finer crystalline domains, for example, a domain size in the range of about 5 nm to about 30 nm. The finer crystalline domains allow more excitons to reach the interface of n-type and p-type material for charge separation. By comparison, diketopyrrolopyrrole-based polymers where the diketopyrrolopyrrole group is immediately coupled to two unsubstituted heteroaryl groups are more rigid and have been shown to have large crystalline domains, typically having a domain size in the range of about 70 nm to about 100 nm. Because the exciton diffusion length in conjugated polymers is believed to be in the range of about 5 nm to about 20 nm, a polymer having large crystalline domains would suggest that many excitons will extinguish before reaching the interface of n-type and p-type material for charge separation. The inventors also surprisingly have discovered that random copolymers having a first unit and a second unit represented by the structures:

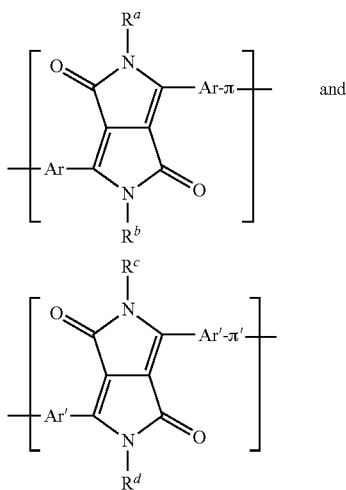

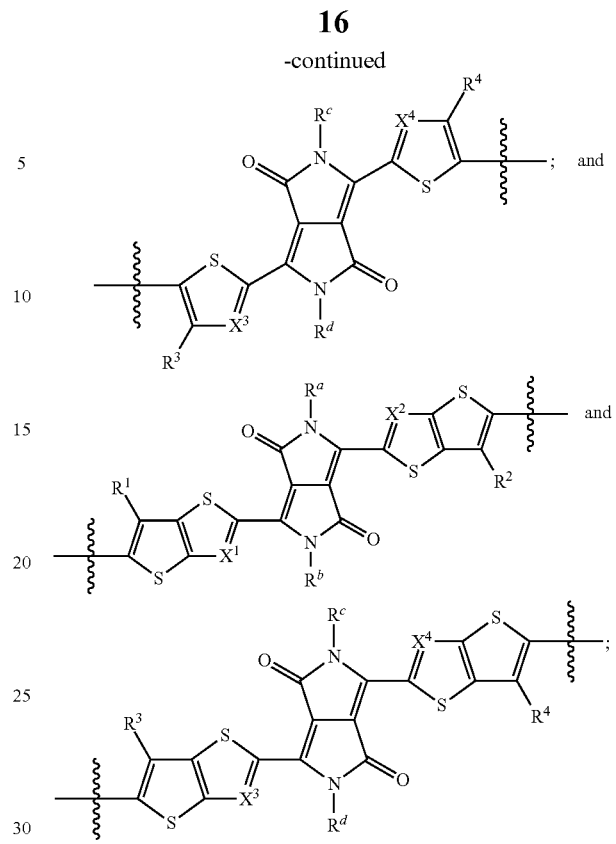

that are substantially similar but for the substitution groups on the Ar/Ar' groups, the π/π' groups, and/or the diketopyrrolopyrrole groups can provide certain advantages, for example, as exhibited in the performance of an optoelectronic device where the polymer is incorporated as the donor material in the photoactive component of the device.

Accordingly, in some embodiments, the moieties

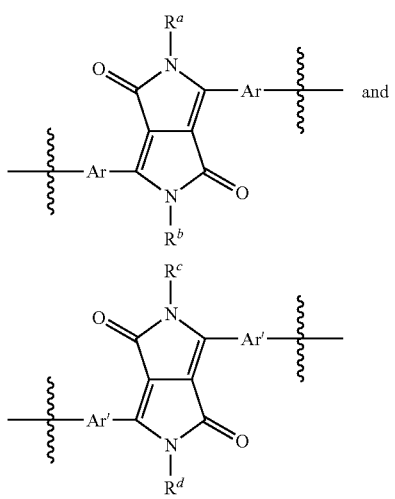

in the present polymers can be selected from:

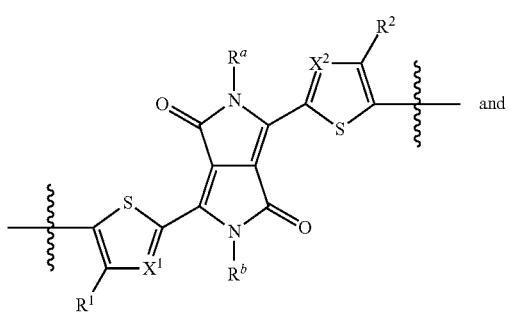

where:
$R^1$ and $R^2$ independently can be a $C_{1-40}$ alkyl group or a $C_{1-40}$ haloalkyl group;
$R^3$ and $R^4$ independently can be selected from H, a $C_{1-40}$ alkyl group, and a $C_{1-40}$ haloalkyl group;
$X^1$, $X^2$, $X^3$, and $X^4$ independently can be N or CH; and
$R^a$, $R^b$, $R^c$, and $R^d$ are as defined herein.

In various embodiments, π and π' can be a polycyclic conjugated moiety. The polycyclic conjugated moiety can have two, three, four, or five rings that are fused together, and can include 8-24 ring atoms, where 1-6 of the ring atoms can be heteroatoms selected from oxygen (O), nitrogen (N), sulfur (S), silicon (Si), or selenium (Se). The polycyclic conjugated moiety can provide a series of conjugated bonds along the polymer backbone and can be connected to other groups in the polymer backbone via atoms in two different rings. For example, the polycyclic conjugated moieties π and π' can be represented by the formula:

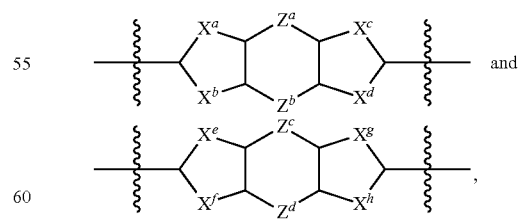

where $X^a$, $X^b$, $X^c$, $X^d$, $X^e$, $X^f$, $X^g$, and $X^h$ independently can be selected from —S—, -O-, -N=, —CH=CH—, and —CH=; and
$Z^a$, $Z^b$, $Z^c$, and $Z^d$ independently can be selected from —CR$^6$=, —SiR$^6$R$^6$—, —NR$^6$—, and a covalent bond, where $R^6$, at each occurrence, independently can be selected from —$R^5$, —$OR^5$, —$SR^5$, and —Y—$R^5$, provided that at least one of $Z^a$ and $Z^b$ and at least one of $Z^c$, and $Z^d$ are —$CR^6$=, —$SiR^6R^6$—, or —$NR^6$— (i.e., not a covalent bond); Y can be a divalent $C_{6-14}$ aryl (e.g., phenyl) group or a divalent 5-14 membered heteroaryl (e.g., thienyl) group; and $R^5$, at each occurrence, independently can be selected from a $C_{1-40}$ alkyl group, a $C_{2-40}$ alkenyl group, and a $C_{1-40}$ haloalkyl group.

Accordingly, in various embodiments described herein, the nitrogen atoms of the diketopyrrolopyrrole groups can be substituted with $C_{1-40}$ alkyl groups, $C_{2-40}$ alkenyl groups, and/or $C_{1-40}$ haloalkyl groups, where each of these groups can be optionally substituted. In certain embodiments, $R^a$, $R^b$, $R^c$, and $R^d$ independently can be selected from a $C_{3-40}$ alkyl group, a $C_{4-40}$ alkenyl group, and a $C_{3-40}$ haloalkyl group, where each of these groups can be linear or branched, and can be optionally substituted as described herein. In certain embodiments, $R^a$, $R^b$, $R^c$, and $R^d$ independently can be selected from a $C_{6-40}$ alkyl group, a $C_{6-40}$ alkenyl group, and a $C_{6-40}$ haloalkyl group, each of which can be linear or branched, and can be optionally substituted as described herein. In particular embodiments, $R^a$, $R^b$, $R^c$, and $R^d$ independently can be a $C_{6-40}$ alkyl group or a $C_{6-40}$ haloalkyl group, which can be either linear or branched, and can be optionally substituted as described herein. For example, $R^a$, $R^b$, $R^c$, and $R^d$ independently can be a branched $C_{3-40}$ alkyl group selected from:

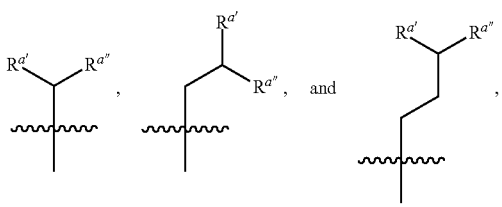

where $R^{a'}$ and $R^{a'''}$ independently are a linear $C_{1-20}$ alkyl group. In certain embodiments, $R^a$, $R^b$, $R^c$, and $R^d$ independently can be a branched $C_{4-40}$ alkenyl group (such as the branched $C_{3-40}$ alkyl groups specified above but with one or more —$CH_2CH_2$— groups replaced by —CH=CH— groups). In certain embodiments, $R^a$, $R^b$, $R^c$, and $R^d$ independently can be a branched $C_{3-40}$ haloalkyl group (such as the branched $C_{3-40}$ alkyl groups specified above but with one or more hydrogen atoms replaced by halogen atoms such as F).

In various embodiments, at least one of $Z^a$ and $Z^b$ in the π group and at least one of $Z^c$ and $Z^d$ in the π' group can be selected from —$CR^6$=, —$SiR^6R^6$—, and —$NR^6$—, where $R^6$, at each occurrence, independently can be a linear or branched $C_{1-40}$ alkyl, $C_{2-40}$ alkenyl, or $C_{1-40}$ haloalkyl group ($R^5$), a linear or branched —O—$C_{1-40}$ alkyl, $C_{2-40}$ alkenyl, or $C_{1-40}$ haloalkyl group ($OR^5$), or a linear or branched -thienyl-$C_{1-40}$ alkyl, $C_{2-40}$ alkenyl, or $C_{1-40}$ haloalkyl group ($YR^5$). In certain embodiments, $R^5$ can be a branched $C_{3-40}$ alkyl group selected from:

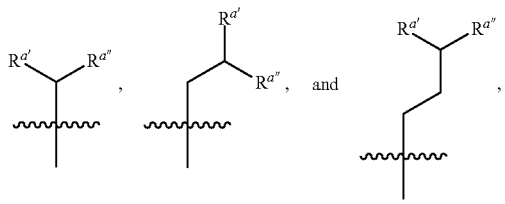

where $R^{a'}$ and $R^{a'''}$ independently are a linear $C_{1-20}$ alkyl group. In certain embodiments, $R^5$ can be a branched $C_{4-40}$ alkenyl group (such as the branched $C_{3-40}$ alkyl groups specified above but with one or more —$CH_2CH_2$— groups replaced by —CH=CH— groups). In certain embodiments, $R^5$ can be a branched $C_{3-40}$ haloalkyl group (such as the linear or branched $C_{3-40}$ alkyl groups specified above but with one or more hydrogen atoms replaced by halogen atoms such as F).

In various embodiments, a $C_{1-40}$ alkyl group or a $C_{2-40}$ alkenyl group can be optionally substituted, i.e., one or more hydrogen atoms can be replaced by a functional group. For example, each $C_{1-40}$ alkyl group or $C_{2-40}$ alkenyl group optionally can be substituted with 1-10 substituents independently selected from a halogen (e.g., F, Cl, Br, I), —CN, —$NO_2$, OH, —$NH_2$, —NH($C_{1-20}$ alkyl), —N($C_{1-20}$ alkyl)$_2$, —S(O)$_2$OH, —CHO, —C(O)—$C_{1-20}$ alkyl, —C(O)OH, —C(O)—O$C_{1-20}$ alkyl, —C(O)$NH_2$, —C(O)NH—$C_{1-20}$ alkyl, —C(O)N($C_{1-20}$ alkyl)$_2$, —O—$C_{1-20}$ alkyl, —S—$C_{1-20}$ alkyl, —$SiH_3$, —SiH($C_{1-20}$ alkyl)$_2$, —$SiH_2$($C_{1-20}$ alkyl), and —Si($C_{1-20}$ alkyl)$_3$. In various embodiments, one or more —$CH_2$— groups (typically non-adjacent —$CH_2$— groups) in the $C_{1-40}$ alkyl group or $C_{2-40}$ alkenyl group optionally can be replaced by a group independently selected from —O—, —S—, —NH—, —N($C_{1-20}$ alkyl)-, —C(O)—, —C(O)O—, and —Si($C_{1-20}$ alkyl)$_2$-.

To illustrate, in some embodiments, the present polymers can be represented by formula (I):

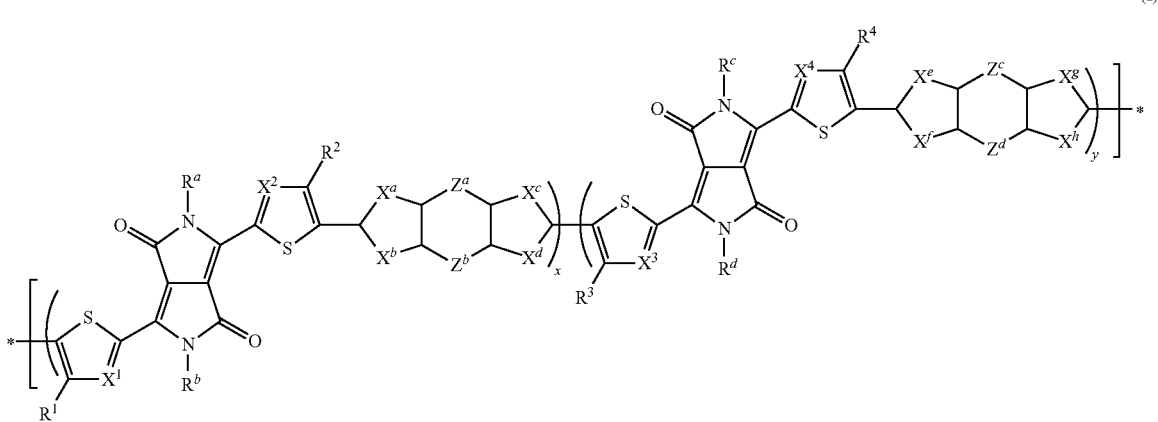

(I)

where:

$R^1$ and $R^2$ independently can be a $C_{1-40}$ alkyl group or a $C_{1-40}$ haloalkyl group;

$R^3$ and $R^4$ independently can be selected from H, a $C_{1-40}$ alkyl group, and a $C_{1-40}$ haloalkyl group;

$R^a$, $R^b$, $R^c$, and $R^d$ independently can be selected from a $C_{1-40}$ alkyl group, a $C_{2-40}$ alkenyl group, and a $C_{1-40}$ haloalkyl group;

$X^1$, $X^2$, $X^3$, and $X^4$ independently can be N or CH;

$X^a$, $X^b$, $X^c$, $X^d$, $X^e$, $X^f$, $X^g$, and $X^h$ independently can be selected from —S—, —O—, —N═, —CH═CH—, and —CH═;

$Z^a$, $Z^b$, $Z^c$, and $Z^d$ independently can be selected from —CR$^6$═, —SiR$^6$R$^6$—, —NR$^6$—, and a covalent bond, where $R^6$, at each occurrence, independently can be selected from —R$^5$, —OR$^5$, —SR$^5$, and —Y—R$^5$, provided that at least one of $Z^a$ and $Z^b$ and at least one of $Z^c$ and $Z^d$ are selected from —CR$^6$═, —SiR$^6$R$^6$—, and —NR$^6$—;

Y can be a divalent $C_{6-14}$ aryl group or a divalent 5-14 membered heteroaryl group;

$R^5$, at each occurrence, independently can be selected from a $C_{1-40}$ alkyl group, a $C_{2-40}$ alkenyl group, and a $C_{1-40}$ haloalkyl group, where each of the $C_{1-40}$ alkyl group, the $C_{2-40}$ alkenyl group, and the $C_{1-40}$ haloalkyl group optionally can be substituted with 1-10 substituents independently selected from a halogen, —CN, —NH$_2$, —NH($C_{1-20}$ alkyl), —N($C_{1-20}$ alkyl)$_2$, —SiH$_3$, —SiH($C_{1-20}$ alkyl)$_2$, —SiH$_2$($C_{1-20}$ alkyl), and —Si($C_{1-20}$ alkyl)$_3$, an —O—$C_{1-20}$ alkyl group, and an —S—$C_{1-20}$ alkyl group; and x and y can be real numbers representing mole fractions, wherein $0.05 \leq x \leq 0.95$, $0.05 \leq y \leq 0.95$, and the sum of x and y is about 1;

where the polymer can have a molecular weight in the range of about 3,000 to about 300,000.

In certain embodiments, π and π' can be a polycyclic conjugated moiety selected from:

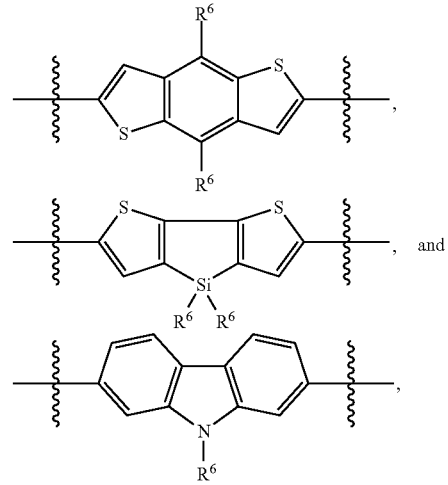

where $R^6$ is as defined herein.

Accordingly, certain polymers of the present teachings can be represented by formula (IIa), (IIb) or (IIc):

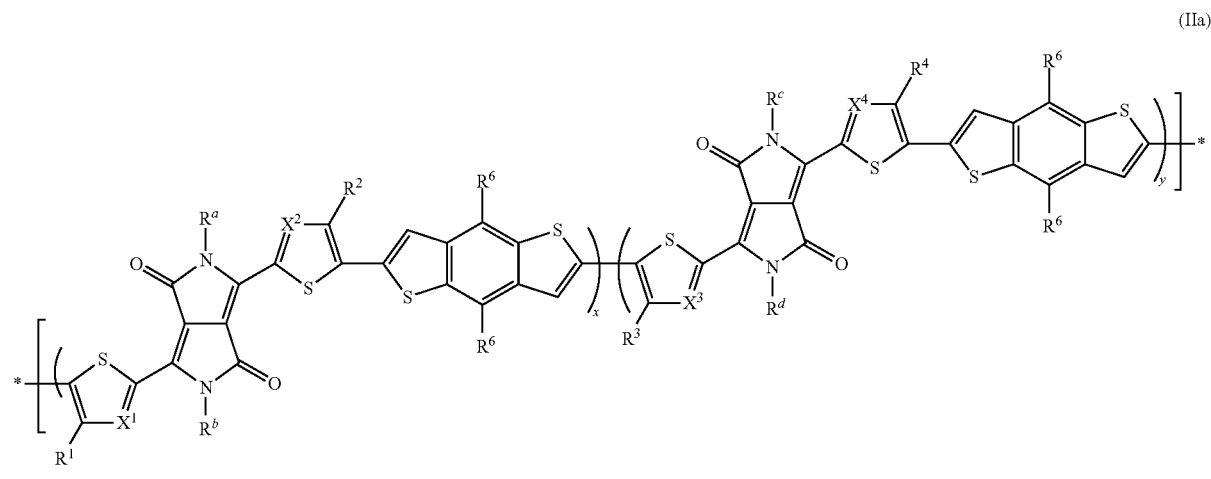

(IIa)

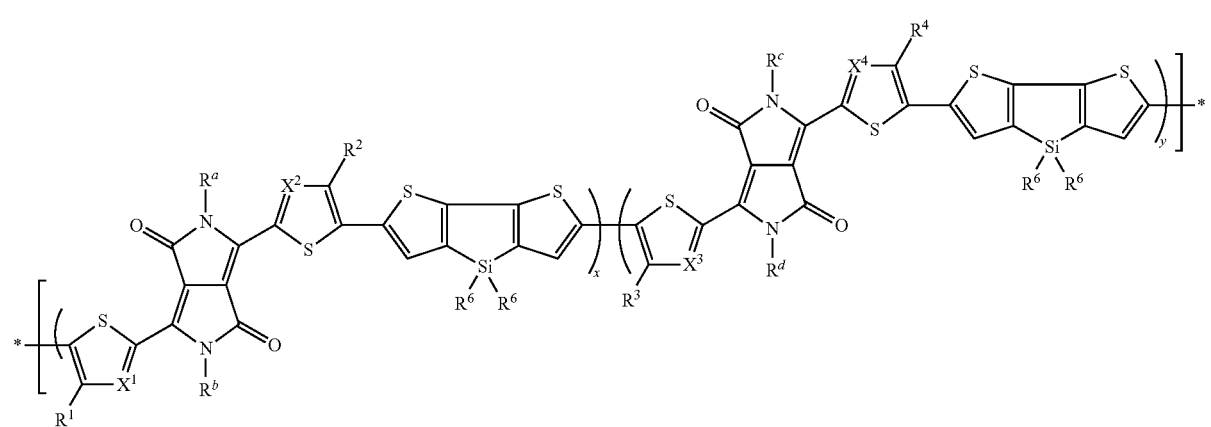

(IIb)

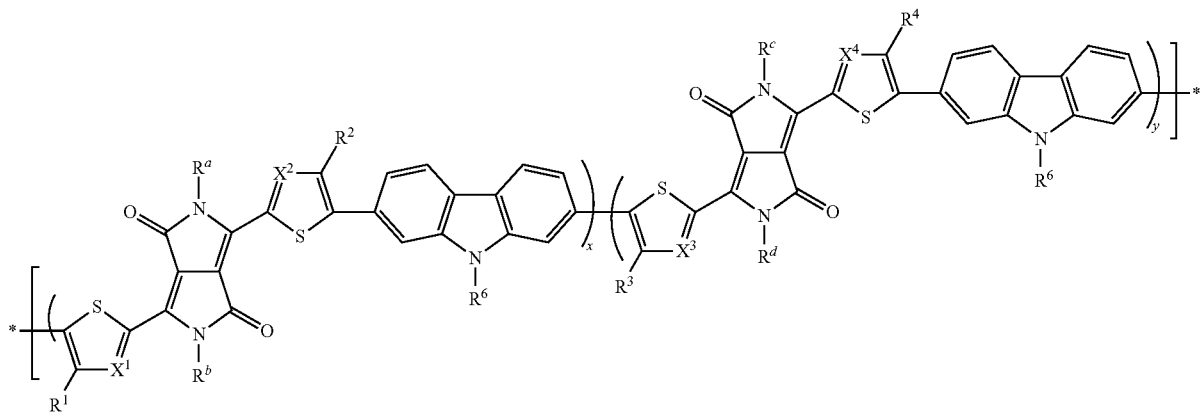
where $R^1, R^2, R^3, R^4, R^6, R^a, R^b, R^c, R^d, X^1, X^2, X^3, X^4$, x and y are as defined herein.
In particular embodiments, each of $X^1$, $X^2$, $X^3$, and $X^4$ can be CH. Accordingly, particular embodiments of the polymers of the present teachings can be represented by formula (IIIa), (IIIb) or (IIIc):
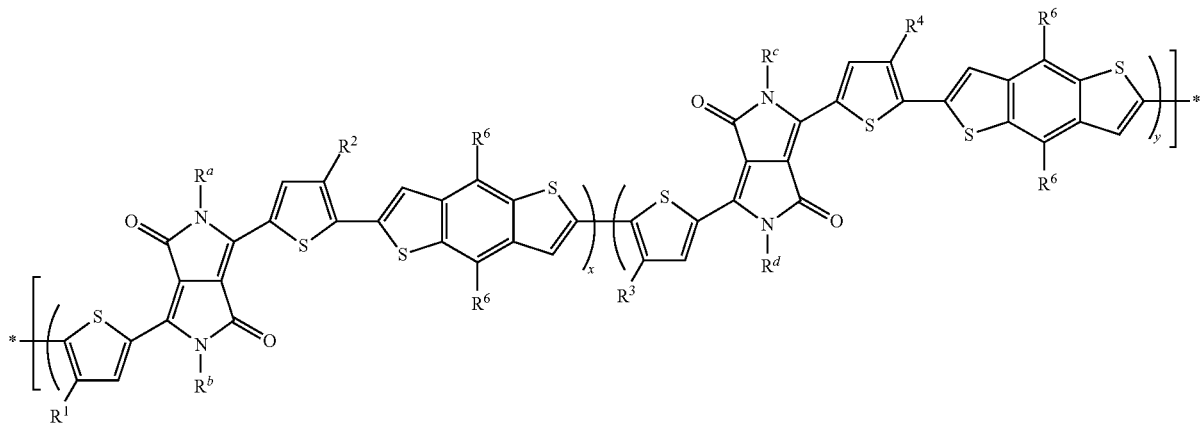
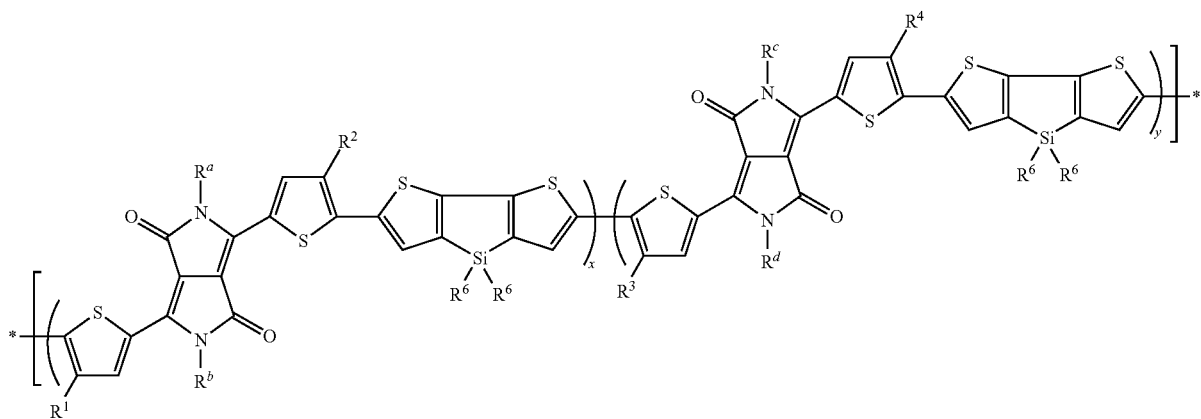

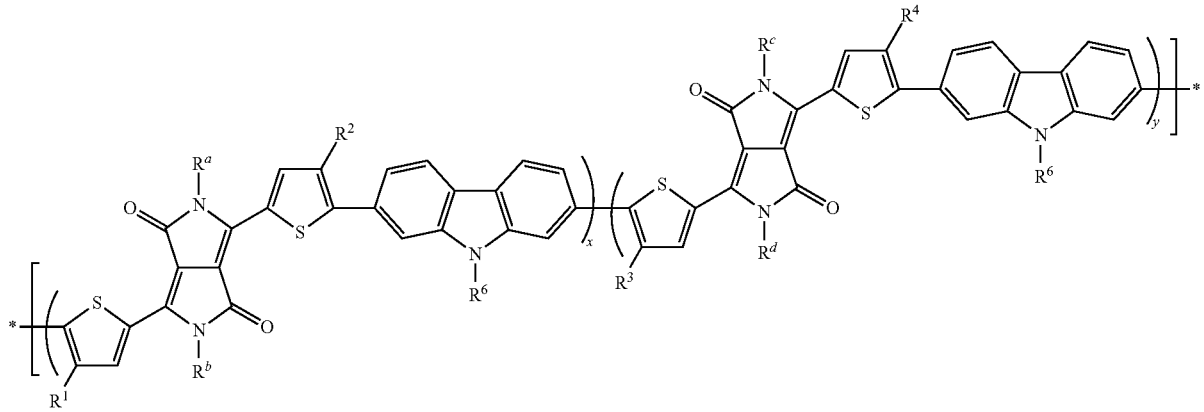

(IIIc)

where $R^1$, $R^2$, $R^3$, $R^4$, $R^6$, $R^a$, $R^b$, $R^c$, $R^d$, x and y are as defined herein.

In certain embodiments of formula (I), (IIa), (IIb), (IIc), (IIIa), (IIIb), or (IIIc), the first unit and the second unit can be different due to at least differences in $R^1$ and $R^2$ versus $R^3$ and $R^4$. For example, $R^3$ and $R^4$ can be H. In some of these embodiments, x can be about 0.5 and y can be about 0.5, and the first unit and the second unit can be repeated in either an alternating or random manner. In other embodiments, x and y can be different, and the first unit and the second unit can be repeated in a random manner. In particular embodiments, the unit comprising y mole fraction of the polymer (i.e., the unit including the unsubstituted thienyl groups) can be present at a higher mole fraction than the unit comprising x mole fraction of the polymer (i.e., the unit including the substituted thienyl groups). More specifically, y can be at least about 0.5, that is, 0.5≤x≤0.9 and 0.1≤y≤0.5, where the sum of x and y is about 1. In particular embodiments, x and y can be real numbers in the range of 0.2≤x≤0.5 and 0.5≤x≤0.8, where the sum of x and y is about 1.

In some embodiments, each of $R^1$, $R^2$, $R^3$ and $R^4$ independently can be a $C_{1-40}$ alkyl group or a $C_{1-40}$ haloalkyl group. For example, formula (IVa) can be used to represent these embodiments:

where:
$R^a$, $R^b$, $R^c$, and $R^d$ can be identical or different and independently can be a branched $C_{6-40}$ alkyl group;
$R^{5a}$ and $R^{5b}$ can be identical or different and independently can be a $C_{1-40}$ alkyl group or a $C_{1-40}$ haloalkyl group;
$R^{6a}$ and $R^{6b}$ can be identical or different and independently can be selected from —$R^5$, —$OR^5$, and —$SR^5$, wherein $R^5$, at each occurrence, independently can be a $C_{6-40}$ alkyl group optionally substituted with 1-5 substituents independently selected from a halogen, —CN, —$NH_2$, —NH($C_{1-20}$ alkyl), —N($C_{1-20}$ alkyl)$_2$, —$SiH_3$, —SiH($C_{1-20}$ alkyl)$_2$, —$SiH_2$($C_{1-20}$ alkyl), —Si($C_{1-20}$ alkyl)$_3$, an —O—$C_{1-20}$ alkyl group, and an —S—$C_{1-20}$ alkyl group; and x and y are as defined herein.

In certain embodiments of the polymers represented by formula (IVa), $R^{5a}$ and $R^{5b}$ can be identical $C_{6-40}$ alkyl groups. In other embodiments, $R^{5a}$ and $R^{5b}$ can be different $C_{6-40}$ alkyl groups. In certain embodiments, $R^{6a}$ and $R^{6b}$ can be identical or different from each other and independently can be selected from —$R^5$ and —$OR^5$, wherein $R^5$, at each occurrence, independently can be a linear or branched $C_{6-40}$ alkyl group which can be optionally substituted as described herein. For example, in particular embodiments, $R^{6a}$ and $R^{6b}$ can be identical or different —O—$C_{6-40}$ alkyl groups, which can be optionally substituted with a —Si($C_{1-20}$ alkyl)$_3$ group. In other embodiments, $R^{6a}$ and $R^{6b}$ can be identical or different $C_{6-40}$ alkyl groups, which can be optionally substituted with a —Si($C_{1-20}$ alkyl)$_3$ group.

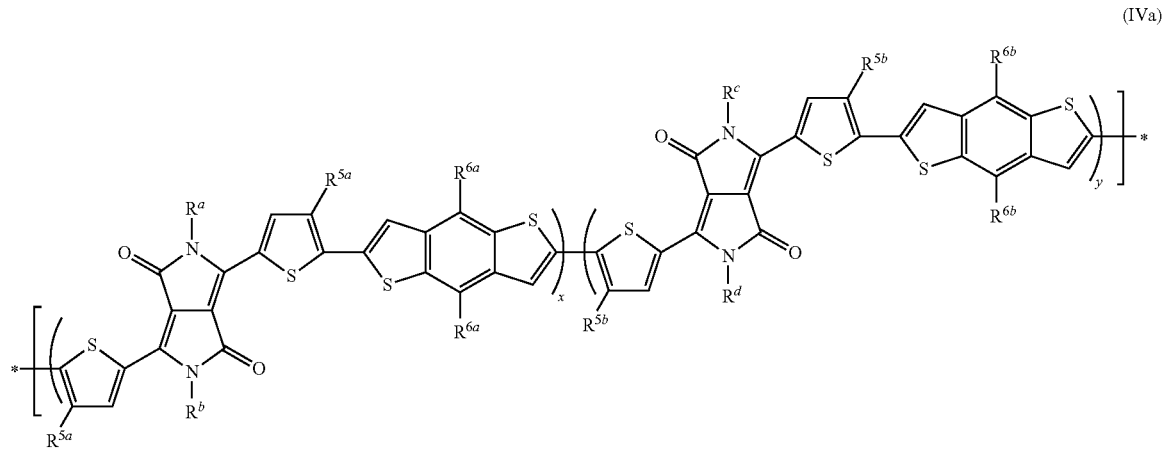

(IVa)

In certain embodiments, the present polymers can be represented by formula (V):

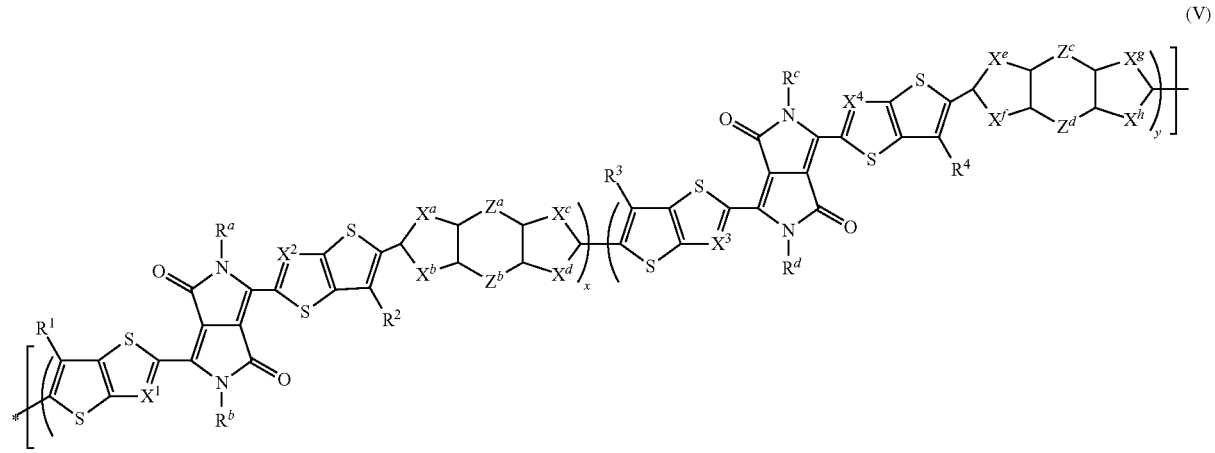

(V)

where:
R$^1$ and R$^2$ independently can be a C$_{1-40}$ alkyl group or a C$_{1-40}$ haloalkyl group;
R$^3$ and R$^4$ independently can be selected from H, a C$_{1-40}$ alkyl group, and a C$_{1-40}$ haloalkyl group;
R$^a$, R$^b$, R$^c$, and R$^d$ independently can be selected from a C$_{1-40}$ alkyl group, a C$_{2-40}$ alkenyl group, and a C$_{1-40}$ haloalkyl group;
X$^1$, X$^2$, X$^3$, and X$^4$ independently can be N or CH;
X$^a$, X$^b$, X$^c$, X$^d$, X$^e$, X$^f$, X$^g$, and X$^h$ independently can be selected from —S—, —O—, —N═, —CH═CH—, and —CH═;
Z$^a$, Z$^b$, Z$^c$, and Z$^d$ independently can be selected from —CR$^6$═, —SiR$^6$R$^6$—, —NR$^6$—, and a covalent bond, where R$^6$, at each occurrence, independently can be selected from —R$^5$, —OR$^5$, —SR$^5$, and —Y—R$^5$, provided that at least one of Z$^a$ and Z$^b$ and at least one of Z$^c$ and Z$^d$ are selected from —CR$^6$═, —SiR$^6$R$^6$—, and —NR$^6$—;
Y can be a divalent C$_{6-14}$ aryl group or a divalent 5-14 membered heteroaryl group;
R$^5$, at each occurrence, independently can be selected from a C$_{1-40}$ alkyl group, a C$_{2-40}$ alkenyl group, and a C$_{1-40}$ haloalkyl group, where each of the C$_{1-40}$ alkyl group, the C$_{2-40}$ alkenyl group, and the C$_{1-40}$ haloalkyl group optionally can be substituted with 1-10 substituents independently selected from a halogen, —CN, —NH$_2$, —NH(C$_{1-20}$ alkyl), —N(C$_{1-20}$ alkyl)$_2$, —SiH$_3$, —SiH(C$_{1-20}$ alkyl)$_2$, —SiH$_2$(C$_{1-20}$ alkyl), and —Si(C$_{1-20}$ alkyl)$_3$, an —O—C$_{1-20}$ alkyl group, and an —S—C$_{1-20}$ alkyl group; and x and y can be real numbers representing mole fractions, wherein 0.05≤x≤0.95, 0.05≤y≤0.95, and the sum of x and y is about 1;
where the polymer can have a molecular weight in the range of about 3,000 to about 300,000.

In certain embodiments, π and π' can be a polycyclic aromatic moiety selected from:

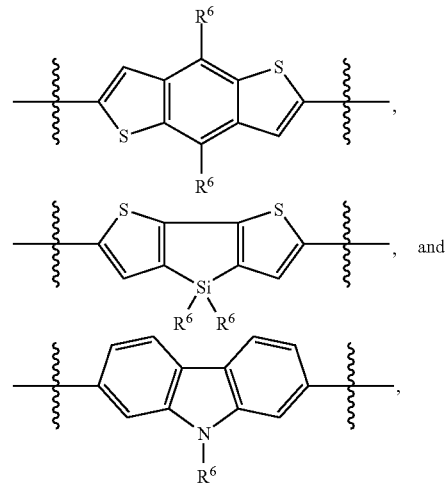

where R$^6$ is as defined herein.

Accordingly, certain polymers of the present teachings can be represented by formula (VIa), (VIb) or (VIc):

(VIa)

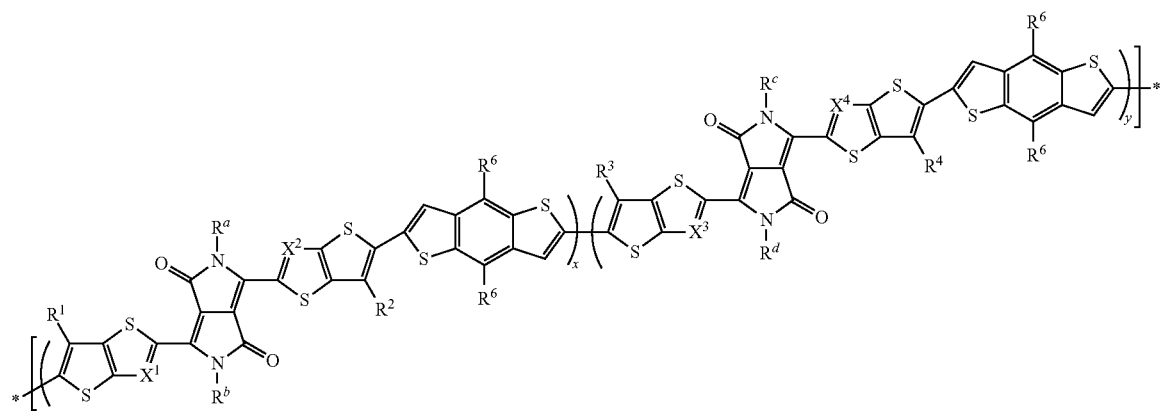

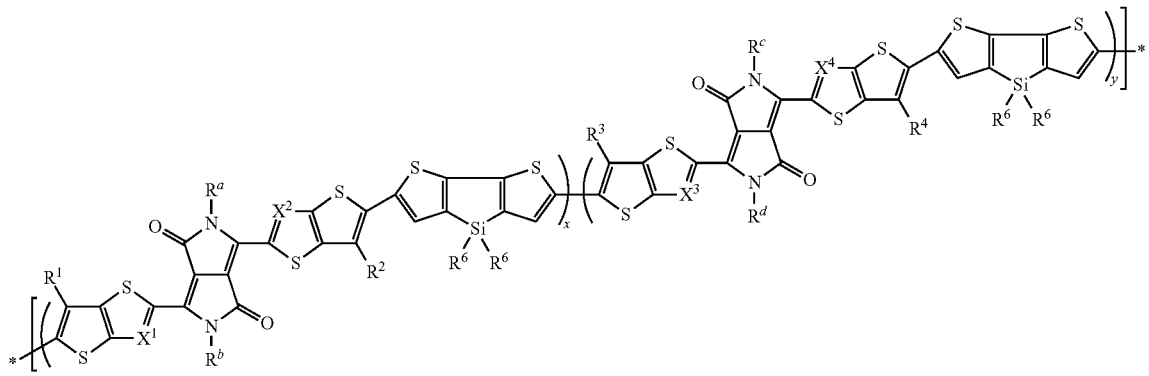
(VIb)
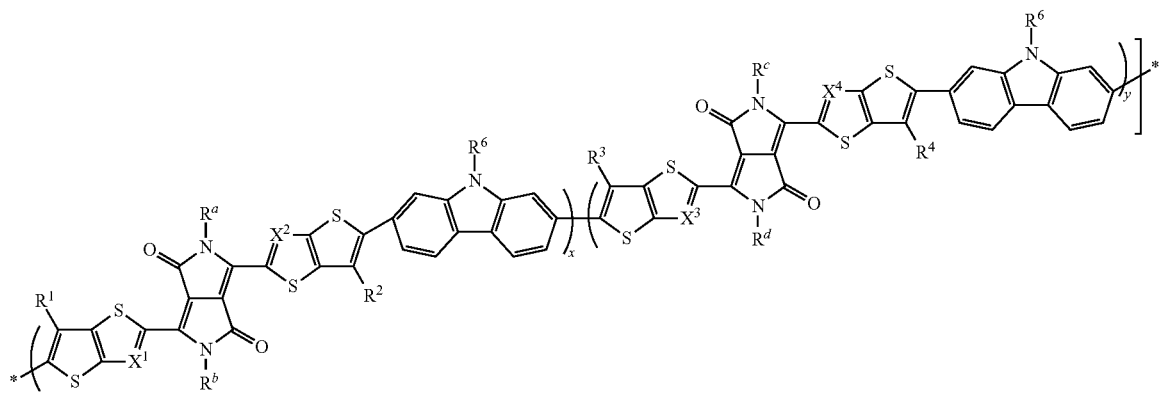
(VIc)
where $R^1$, $R^2$, $R^3$, $R^4$, $R^6$, $R^a$, $R^b$, $R^c$, $R^d$, $X^1$, $X^2$, $X^3$, $X^4$, x and y are as defined herein.
In particular embodiments, each of $X^1$, $X^2$, $X^3$, and $X^4$ can be CH. Accordingly, particular embodiments of the polymers of the present teachings can be represented by formula (VIIa), (VIIb) or (VIIc):
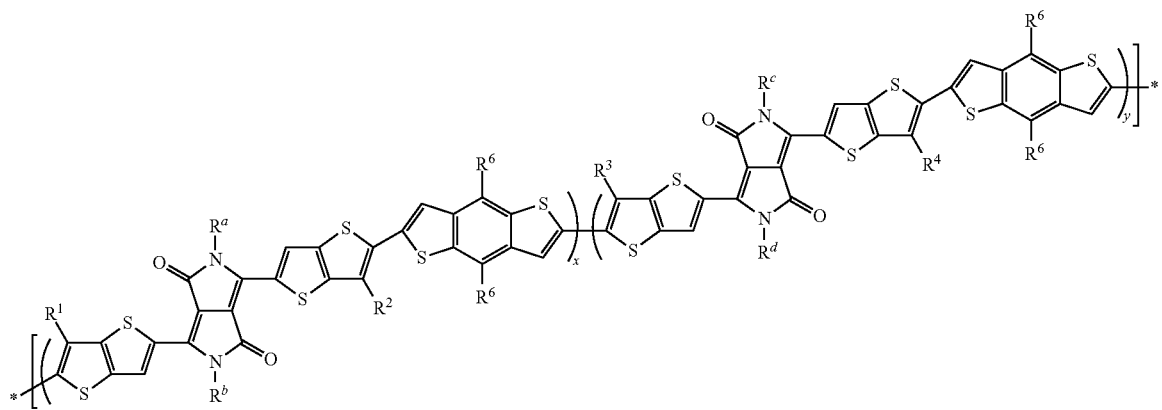
(VIIa)

-continued

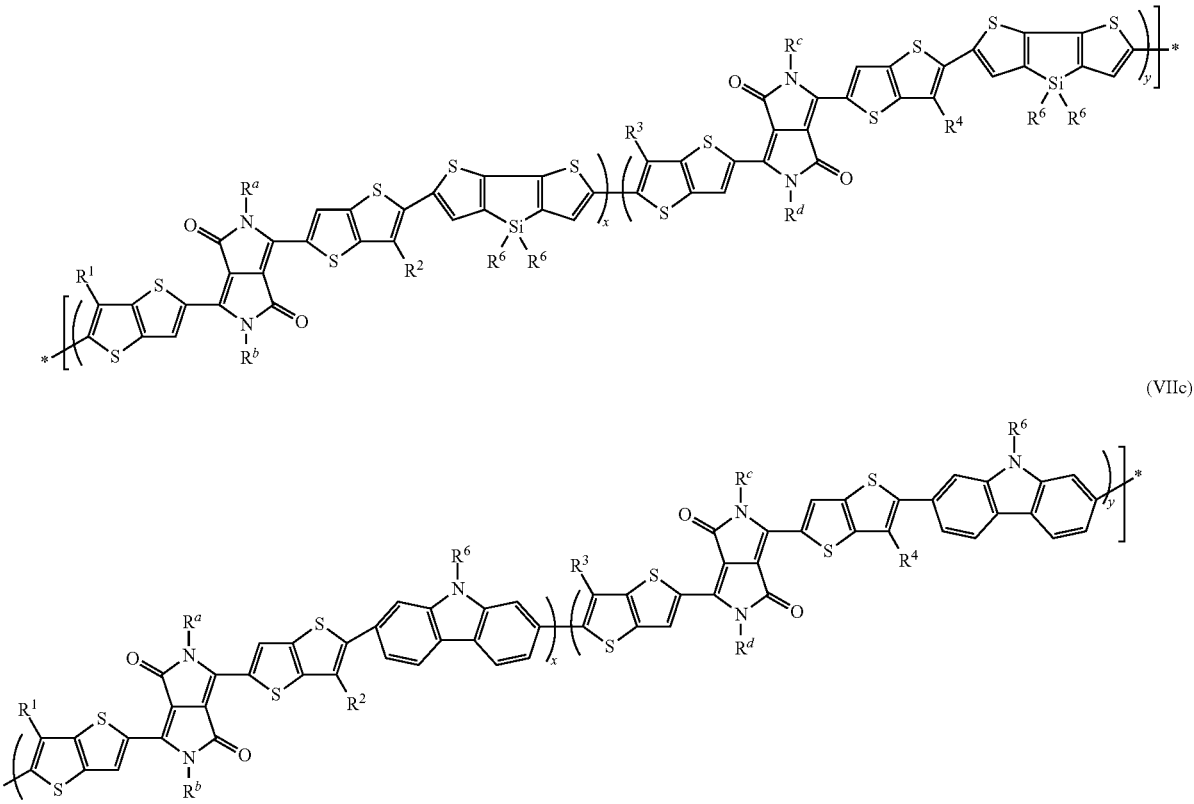

(VIIb)

(VIIc)

where $R^1, R^2, R^3, R^4, R^6, R^a, R^b, R^c, R^d$, x and y are as defined herein.

In certain embodiments of formula (V), (VIa), (VIb), (VIc), (VIIa), (VIIb), or (VIIc), the first unit and the second unit can be different due to at least differences in $R^1$ and $R^2$ versus $R^3$ and $R^4$. For example, $R^3$ and $R^4$ can be H. In some of these embodiments, x can be about 0.5 and y can be about 0.5, and the first unit and the second unit can be repeated in either an alternating or random manner. In other embodiments, x and y can be different, and the first unit and the second unit can be repeated in a random manner. In particular embodiments, the unit comprising y mole fraction of the polymer (i.e., the unit including the unsubstituted thienyl groups) can be present at a higher mole fraction than the unit comprising x mole fraction of the polymer (i.e., the unit including the substituted thienothiophenyl groups). More specifically, y can be at least about 0.5, that is, $0.5 \le x \le 0.9$ and $0.1 \le y \le 0.5$, where the sum of x and y is about 1. In particular embodiments, x and y can be real numbers in the range of $0.2 \le x \le 0.5$ and $0.5 \le x \le 0.8$, where the sum of x and y is about 1.

In some embodiments, each of $R^1, R^2, R^3$ and $R^4$ independently can be a $C_{1-40}$ alkyl group or a $C_{1-40}$ haloalkyl group. For example, formula (VIIIa) can be used to represent these embodiments:

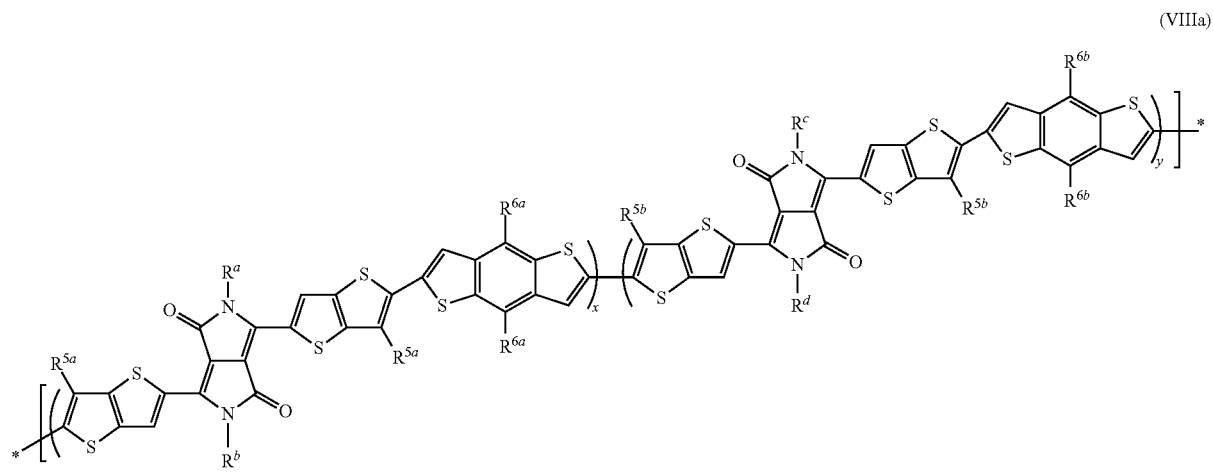

(VIIIa)

where:

$R^a$, $R^b$, $R^c$, and $R^d$ can be identical or different and independently can be a branched $C_{6-40}$ alkyl group;

$R^{5a}$ and $R^{5b}$ can be identical or different and independently can be a $C_{1-40}$ alkyl group or a $C_{1-40}$ haloalkyl group;

$R^{6a}$ and $R^{6b}$ can be identical or different and independently can be selected from —$R^5$, —$OR^5$, and —$SR^5$, wherein $R^5$, at each occurrence, independently can be a $C_{6-40}$ alkyl group optionally substituted with 1-5 substituents independently selected from a halogen, —CN, —$NH_2$, —NH($C_{1-20}$ alkyl), —N($C_{1-20}$ alkyl)$_2$, —$SiH_3$, —SiH($C_{1-20}$ alkyl)$_2$, —$SiH_2$($C_{1-20}$ alkyl), —Si($C_{1-20}$ alkyl)$_3$, an —O—$C_{1-20}$ alkyl group, and an —S—$C_{1-20}$ alkyl group; and x and y are as defined herein.

In certain embodiments of the polymers represented by formula (VIIIa), $R^{5a}$ and $R^{5b}$ can be identical $C_{6-40}$ alkyl groups. In other embodiments, $R^{5a}$ and $R^{5b}$ can be different $C_{6-40}$ alkyl groups. In certain embodiments, $R^{6a}$ and $R^{6b}$ can be identical or different from each other and independently can be selected from —$R^5$ and —$OR^5$, wherein $R^5$, at each occurrence, independently can be a linear or branched $C_{6-40}$ alkyl group which can be optionally substituted as described herein. For example, in particular embodiments, $R^{6a}$ and $R^{6b}$ can be identical or different —O—$C_{6-40}$ alkyl groups, which can be optionally substituted with a —Si($C_{1-20}$ alkyl)$_3$ group. In other embodiments, $R^{6a}$ and $R^{6b}$ can be identical or different $C_{6-40}$ alkyl groups, which can be optionally substituted with a —Si($C_{1-20}$ alkyl)$_3$ group.

While certain embodiments of the present polymers can be represented by formulae (I), (IIa), (IIb), (IIc), (IIIa), (IIIb), (IIIc), (IVa), (V), (VIa), (VIb), (VIc), (VIIa), (VIIb), (VIIc), and (VIIIa), Ar, more generally, can be a substituted thiophene-containing polycyclic heteroaryl group. For example, the moiety:

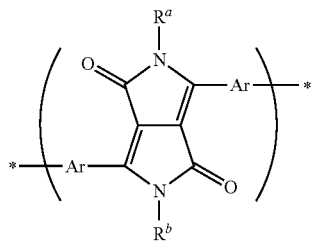

can be selected from:

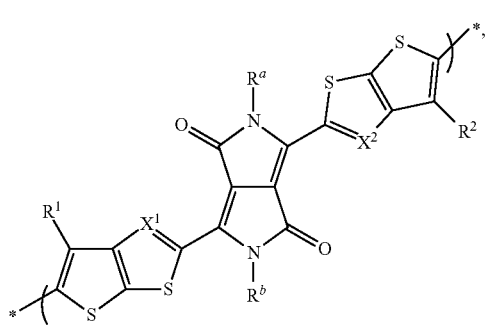

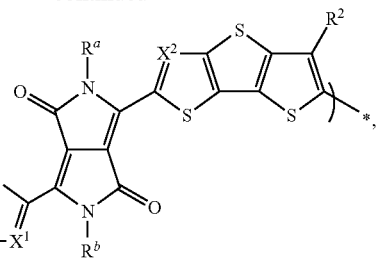

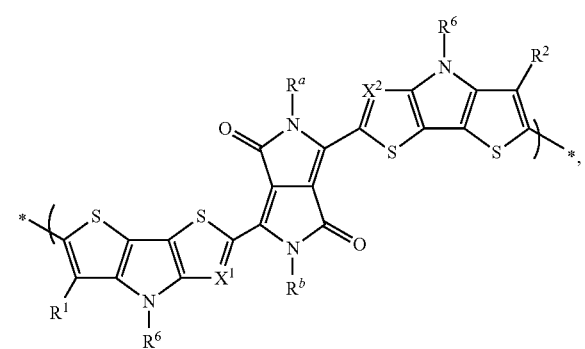

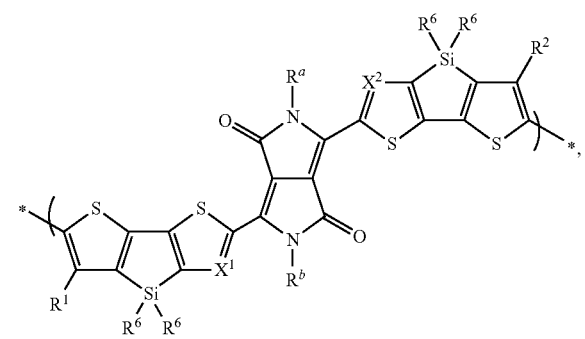

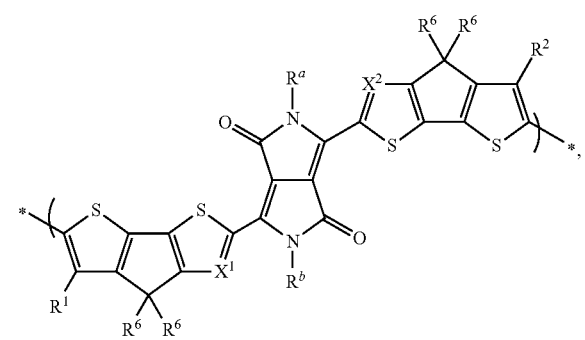

33
-continued
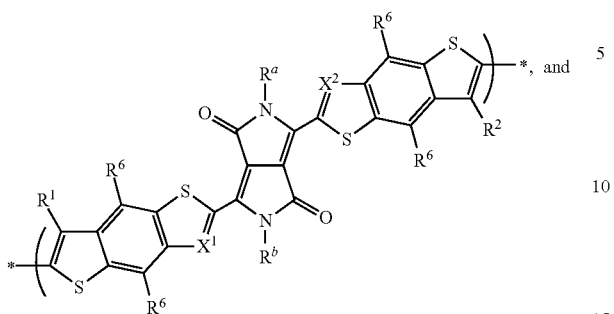
34
-continued
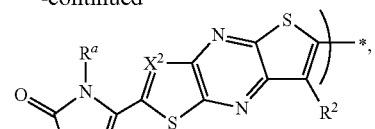
where $R^1$, $R^2$, $R^6$, $R^a$, $R^b$, $X^1$, and $X^2$ are as defined herein.
Exemplary polymers according to the present teachings include:
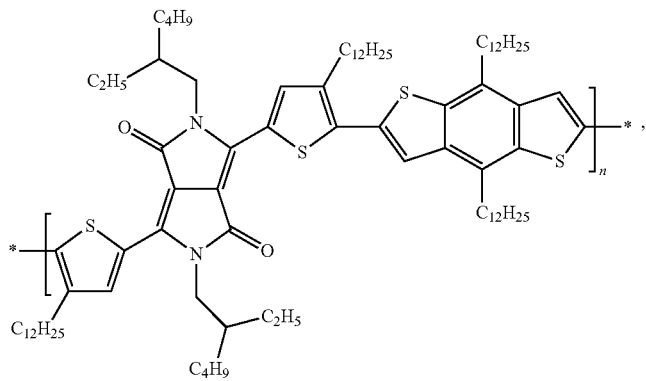
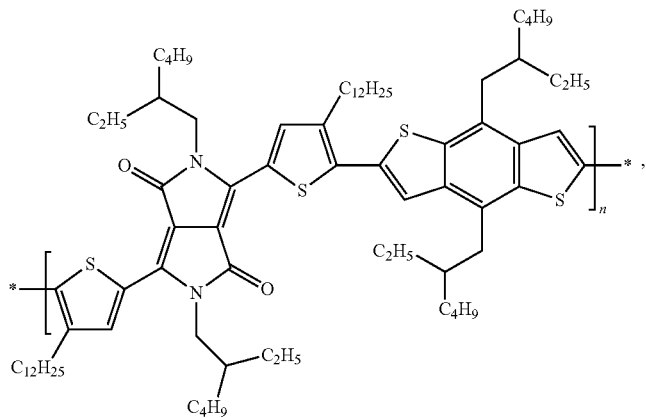
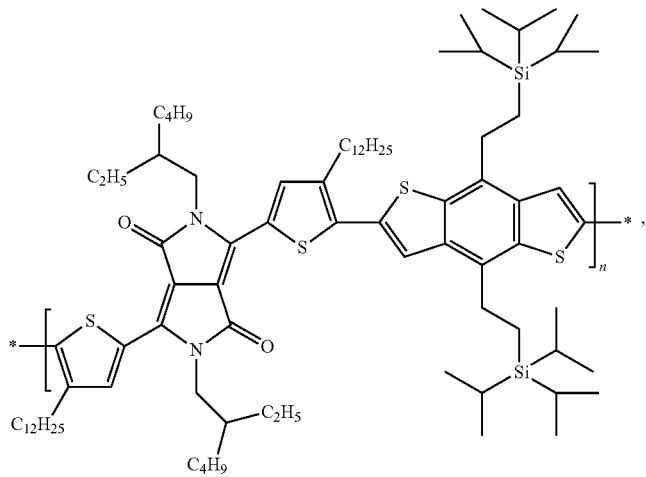

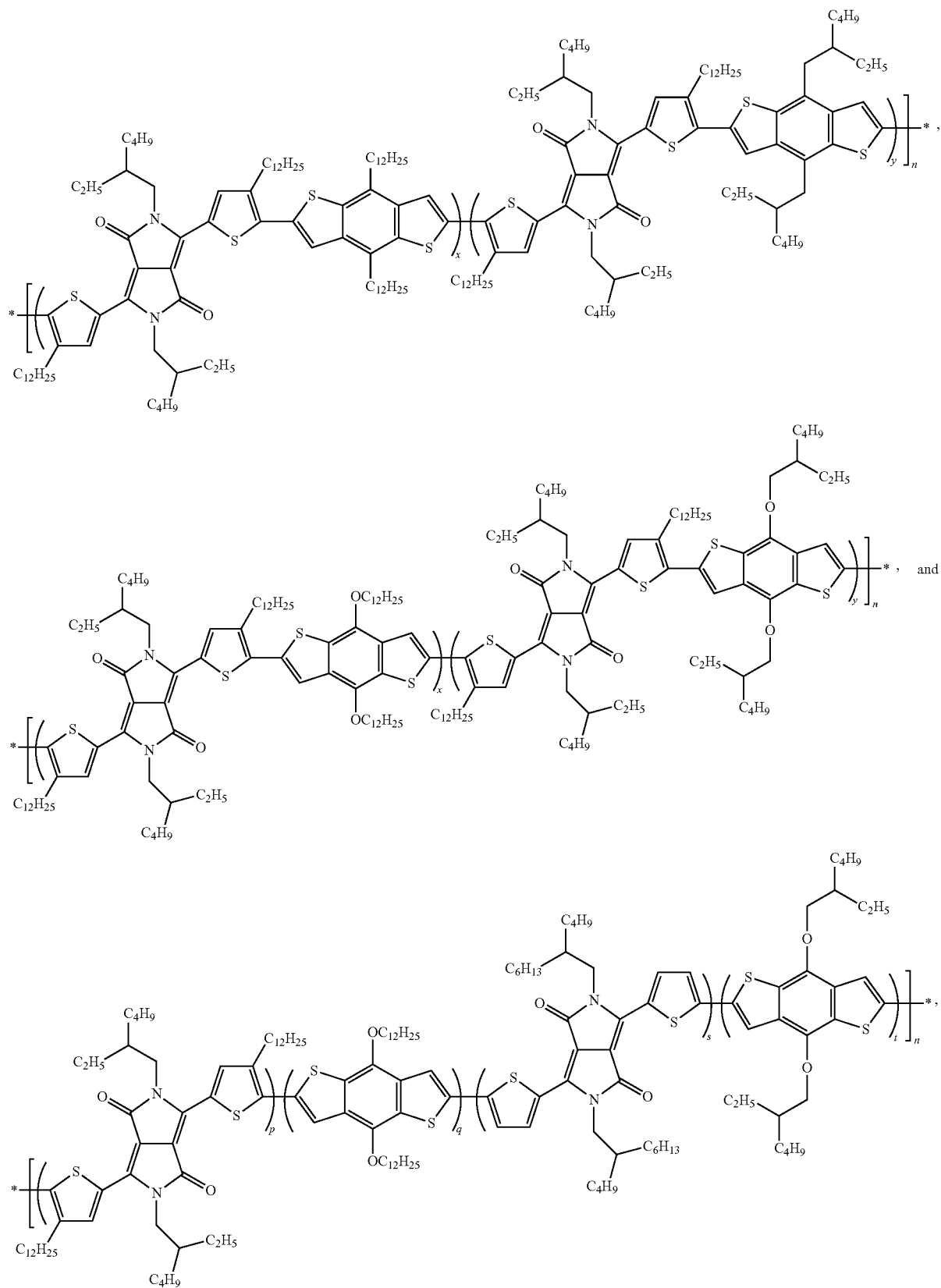

where n is the degree of polymerization and can be an integer ranging from 3 to 1,000, for example, from 5 to 1,000, from 8 to 1,000, or from 10 to 1,000; p, q, s, and t are real numbers representing mole fractions, wherein $0.025 \leq p \leq 0.975$, $0.025 \leq q \leq 0.975$, $0.025 \leq s \leq 0.975$, $0.025 \leq p \leq 0.975$, $0.05 \leq t \leq 0.95$, and the sum of p, q, s, and t is about 1; and x and y are as defined herein.

Compounds of the present teachings and monomers leading to the present compounds can be prepared according to procedures analogous to those described in the Examples. In particular, Stille coupling or Suzuki coupling reactions can be used to prepare polymeric compounds according to the present teachings with high molecular weights and in high yields (≥75%) and purity, as confirmed by $^1$H NMR spectra, elemental analysis, and/or GPC measurements.

Scheme 1 below illustrates one approach to synthesis of polymers including random copolymers according to formula (I):

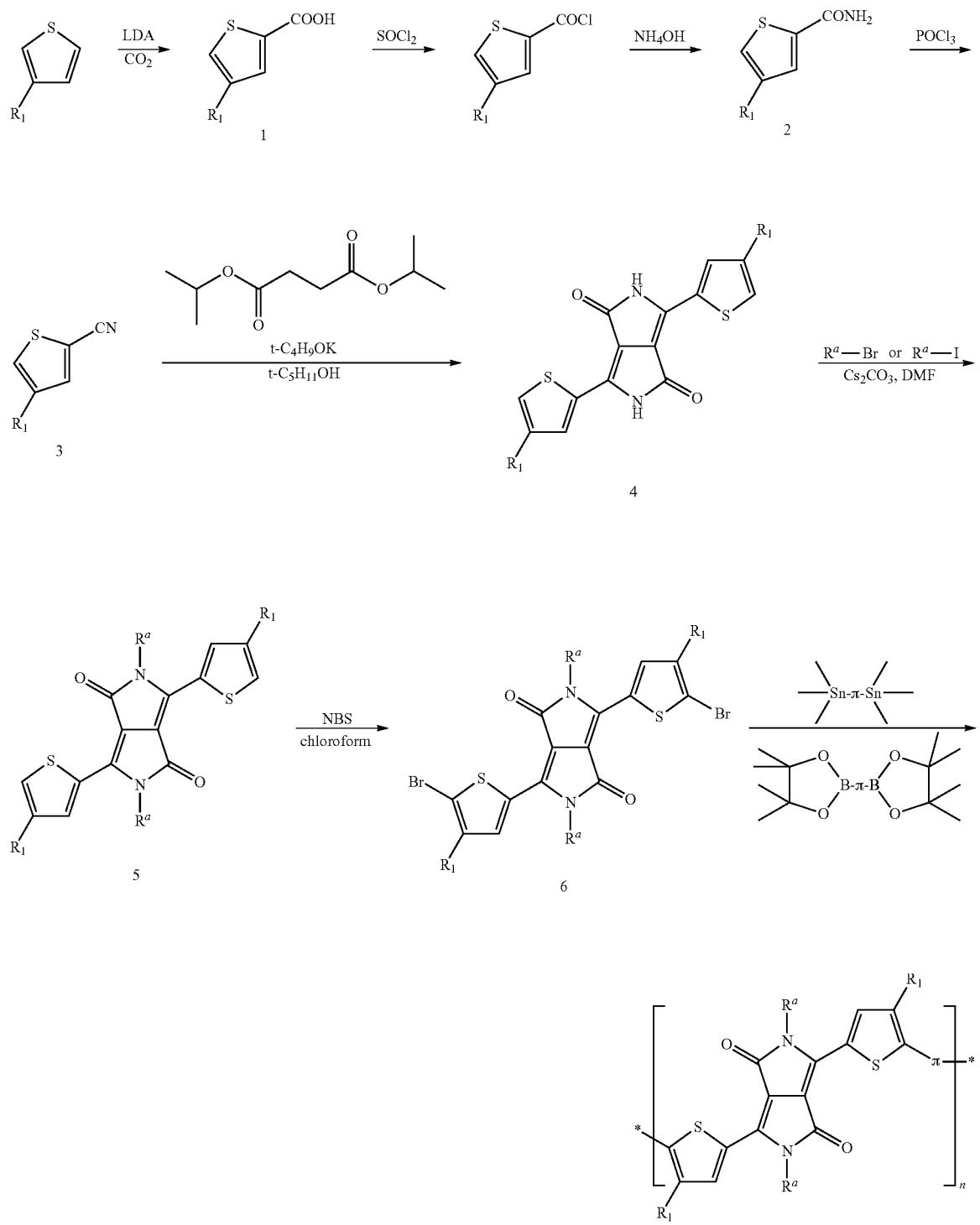

Scheme 2 below illustrates one approach to synthesis of polymers including random copolymers according to formula (V):
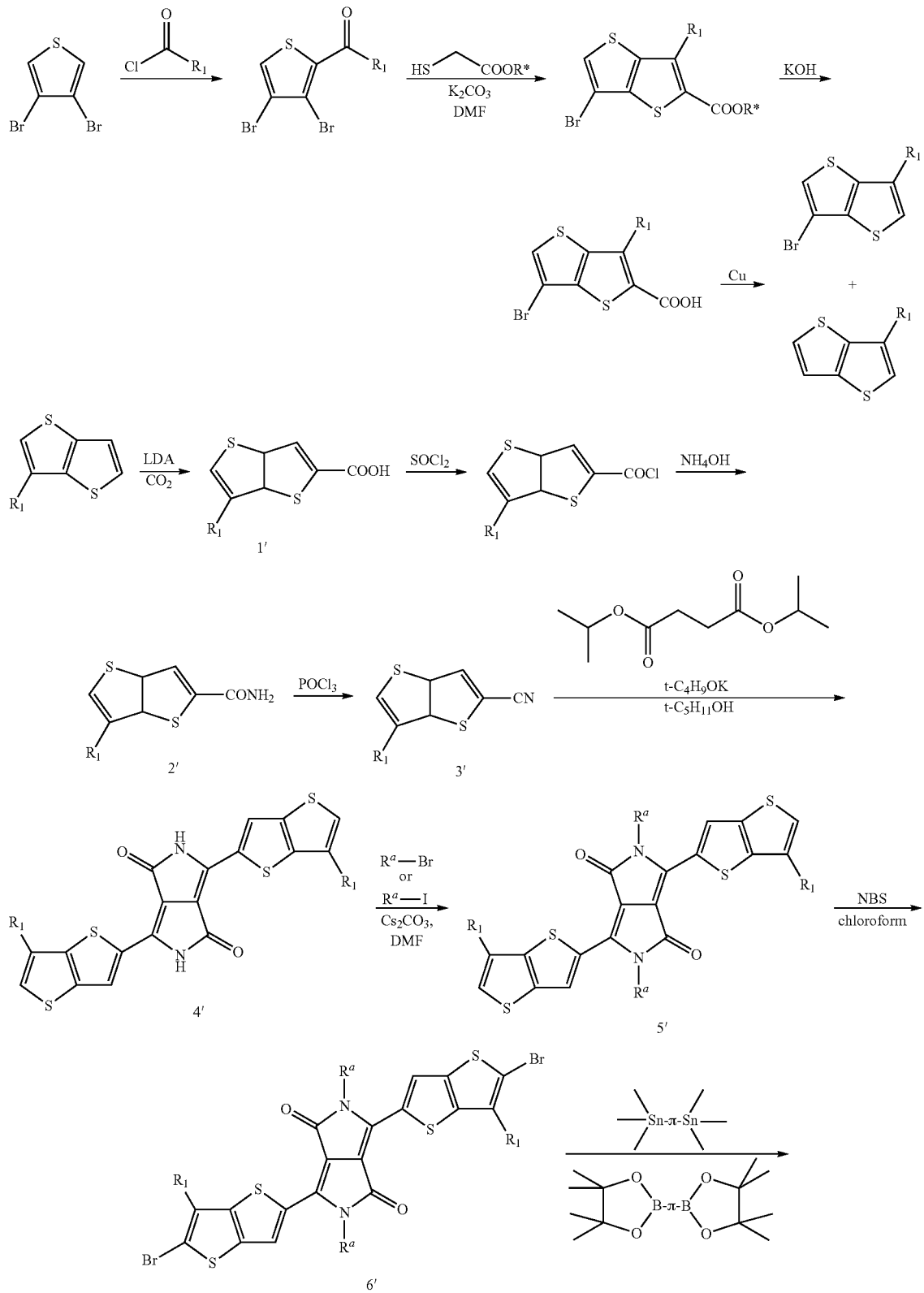

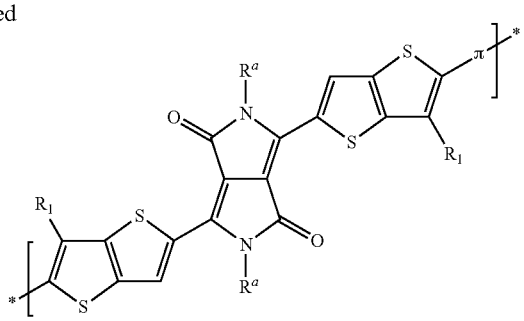

Alternatively, the present compounds can be prepared from commercially available starting materials, compounds known in the literature, or via other readily prepared intermediates, by employing standard synthetic methods and procedures known to those skilled in the art. Standard synthetic methods and procedures for the preparation of organic molecules and functional group transformations and manipulations can be readily obtained from the relevant scientific literature or from standard textbooks in the field. It will be appreciated that where typical or preferred process conditions (i.e., reaction temperatures, times, mole ratios of reactants, solvents, pressures, etc.) are given, other process conditions can also be used unless otherwise stated. Optimum reaction conditions can vary with the particular reactants or solvent used, but such conditions can be determined by one skilled in the art by routine optimization procedures. Those skilled in the art of organic synthesis will recognize that the nature and order of the synthetic steps presented can be varied for the purpose of optimizing the formation of the compounds described herein.

The processes described herein can be monitored according to any suitable method known in the art. For example, product formation can be monitored by spectroscopic means, such as nuclear magnetic resonance spectroscopy (NMR, e.g., $^1$H or $^{13}$C), infrared spectroscopy (IR), optical absorption/emission spectroscopy (e.g., UV-visible), mass spectrometry (MS), or by chromatography such as high pressure liquid chromatography (HPLC), gas chromatography (GC), gel-permeation chromatography (GPC), or thin layer chromatography (TLC).

The reactions or the processes described herein can be carried out in suitable solvents which can be readily selected by one skilled in the art of organic synthesis. Suitable solvents typically are substantially nonreactive with the reactants, intermediates, and/or products at the temperatures at which the reactions are carried out, i.e., temperatures that can range from the solvent's freezing temperature to the solvent's boiling temperature. A given reaction can be carried out in one solvent or a mixture of more than one solvent. Depending on the particular reaction step, suitable solvents for a particular reaction step can be selected.

Certain embodiments disclosed herein can be stable in ambient conditions ("ambient stable") and soluble in common solvents. As used herein, a compound can be considered electrically "ambient stable" or "stable at ambient conditions" when a transistor incorporating the compound as its semiconducting material exhibits a carrier mobility that is maintained at about its initial measurement when the compound is exposed to ambient conditions, for example, air, ambient temperature, and humidity, over a period of time. For example, a compound according to the present teachings can be described as ambient stable if a transistor incorporating the compound shows a carrier mobility that does not vary more than 20% or more than 10% from its initial value after exposure to ambient conditions, including, air, humidity and temperature, over a 3 day, 5 day, or 10 day period. In addition, a compound can be considered ambient stable if the optical absorption of the corresponding film does not vary more than 20% (preferably, does not vary more than 10%) from its initial value after exposure to ambient conditions, including air, humidity and temperature, over a 3 day, 5 day, or 10 day period.

As used herein, a compound can be considered "soluble" in a solvent when at least 0.1 mg of the compound can be dissolved in 1 mL of the solvent. Examples of common organic solvents include petroleum ethers; acetonitrile; aromatic hydrocarbons such as benzene, toluene, xylene, and mesitylene; ketones such as acetone, and methyl ethyl ketone; ethers such as tetrahydrofuran, dioxane, bis(2-methoxyethyl) ether, diethyl ether, di-isopropyl ether, and t-butyl methyl ether; alcohols such as methanol, ethanol, butanol, and isopropyl alcohol; aliphatic hydrocarbons such as hexanes; esters such as methyl acetate, ethyl acetate, methyl formate, ethyl formate, isopropyl acetate, and butyl acetate; amides such as dimethylformamide and dimethylacetamide; sulfoxides such as dimethylsulfoxide; halogenated aliphatic and aromatic hydrocarbons such as dichloromethane, chloroform, ethylene chloride, chlorobenzene, dichlorobenzene, and trichlorobenzene; and cyclic solvents such as cyclopentanone, cyclohexanone, and 2-methypyrrolidone.

The present compounds can be fabricated into various articles of manufacture using solution processing techniques in addition to other more expensive processes such as vapor deposition. Various solution processing techniques have been used with organic electronics. Common solution processing techniques include, for example, spin coating, drop-casting, zone casting, dip coating, blade coating, or spraying. Another example of solution processing technique is printing. As used herein, "printing" includes a noncontact process such as inkjet printing, microdispensing and the like, and a contact process such as screen-printing, gravure printing, offset printing, flexographic printing, lithographic printing, pad printing, microcontact printing and the like.

Compounds of the present teachings can be used alone or in combination with other compounds to prepare semiconductor materials (e.g., compositions and composites), which in turn can be used to fabricate various articles of manufacture, structures, and devices. In some embodiments, semiconductor materials incorporating one or more compounds of the present teachings can exhibit p-type semiconductor activity, ambipolar activity, light absorption, and/or light emission.

The present teachings, therefore, further provide methods of preparing a semiconductor material. The methods can include preparing a composition (e.g., a solution or dispersion) that includes one or more compounds disclosed herein dissolved or dispersed in a liquid medium such as a solvent or a mixture of solvents, depositing the composition on a substrate to provide a semiconductor material precursor, and processing (e.g., heating) the semiconductor precursor to provide a semiconductor material (e.g., a photoactive layer) that includes a compound disclosed herein. In various embodiments, the liquid medium can be an organic solvent, an inorganic solvent such as water, or combinations thereof. In some embodiments, the composition can further include one or more additives independently selected from viscosity modulators, detergents, dispersants, binding agents, compatibilizing agents, curing agents, initiators, humectants, antifoaming agents, wetting agents, pH modifiers, biocides, and bacteriostats. For example, surfactants and/or polymers (e.g., polystyrene, polyethylene, poly-alpha-methylstyrene, polyisobutene, polypropylene, polymethylmethacrylate, and the like) can be included as a dispersant, a binding agent, a compatibilizing agent, and/or an antifoaming agent. In some embodiments, the depositing step can be carried out by printing, including inkjet printing and various contact printing techniques (e.g., screen-printing, gravure printing, offset printing, pad printing, lithographic printing, flexographic printing, and microcontact printing). In other embodiments, the depositing step can be carried out by spin coating, dropcasting, zone casting, dip coating, blade coating, or spraying.

Various articles of manufacture including optical devices, optoelectronic devices, and electronic devices such as thin film semiconductors, photovoltaic devices, photodetectors, organic light emitting devices such as organic light emitting transistors (OLETs), that make use of the compounds disclosed herein are within the scope of the present teachings as are methods of making the same. The present compounds can offer processing and operation advantages in the fabrication and/or the use of these devices.

For example, articles of manufacture such as the various devices described herein can be an optical or optoelectronic device including a first electrode, a second electrode, and a photoactive component disposed between the first electrode and the second electrode, where the photoactive component includes a compound of the present teachings.

In various embodiments, the optical or optoelectronic device can be configured as a solar cell, in particular, a bulk heterojunction solar cell. Compounds of the present teachings can exhibit broad optical absorption and/or a tuned redox properties and bulk carrier mobilities, making them desirable for such applications. In various embodiments, the bulk heterojunction solar cells according to the present teachings can incorporate a blend material (e.g., a blended film) including a compound of the present teachings as the donor material and an acceptor material as the photoactive layer.

Typical acceptor materials include fullerene-based compounds. The term "fullerene" as used herein includes various cage-like molecules of pure carbon, including Buckministerfullerene ($C_{60}$) "bucky ball" and related "spherical" fullerenes. Fullerenes useful for the present teachings can have a broad range of sizes (number of carbon atoms per molecule). For example, a fullerene compound according to the present teachings can be selected from those known in the art ranging from, for example, $C_{20}$-$C_{1000}$. Preferably, the fullerene compound is selected from the range of $C_{60}$ to $C_{96}$, and most preferably, the fullerene compound is $C_{60}$ or $C_{70}$. The fullerene compound can be chemically modified, provided that the modified fullerene compound retains acceptor-type and electron mobility characteristics. For example, the acceptor material can be various organic small molecules, polymers, carbon nanotubes, or inorganic particles (quantum dots, quantum rods, quantum tripods, $TiO_2$, ZnO etc.).

A photoactive component according to the present teachings can be prepared as a blended film deposited from a solution or dispersion containing a mixture of one or more of the present compounds and an acceptor compound such as fullerene (e.g., PCBM). The ratio of the present polymer to the acceptor compound can range from about 10:1 to about 1:10 by weight; for example, from about 5:1 to about 1:5 by weight, from about 3:1 to about 1:3 by weight, or from about 2:1 to about 1:2 by weight. The photoactive layer also can contain a polymeric binder, which can be present from about 5 to about 95% by weight. The polymeric binder, for example, can be a semicrystalline polymer selected from polystyrene (PS), high density polyethylene (HDPE), polypropylene (PP) and polymethylmethacrylate (PMMA).

FIG. 1 illustrates a representative structure of a bulk-heterojunction organic solar cell which can incorporate one or more compounds of the present teachings as the donor and/or acceptor materials. As shown, a representative solar cell generally includes a substrate 20, an anode 22, a cathode 26, and a photoactive layer 24 between the anode and the cathode that can incorporate one or more compounds of the present teachings as the electron donor (p-channel) and/or electron acceptor (n-channel) materials. In some embodiments, one or more optional layers, for example, a smoothing layer, an exciton blocking layer and/or a charge transport layer, can be present between the anode and the photoactive layer.

The substrate can be, for example, glass or a flexible substrate (e.g., plastic). The electrodes can be composed of metals or transparent conducting oxides such as indium tin oxide (ITO), gallium indium tin oxide (GITO), and zinc indium tin oxide (ZITO). For example, the cathode can be composed of aluminum or calcium, while the anode can be composed of ITO.

In various embodiments, an optional smoothing layer can be present between the anode and the photoactive layer. For example, the smoothing layer can include a film of 3,4-polyethylenedioxythiophene (PEDOT), or 3,4-polyethylenedioxythiophene:polystyrene-sulfonate (PEDOT:PSS).

In certain embodiments, a solar cell according to the present teachings can include a transparent glass substrate onto which an electrode layer (anode) made of indium tin oxide (ITO) is applied. This electrode layer can have a relatively rough surface, and a smoothing layer made of a polymer, typically PEDOT:PSS made electrically conductive through doping, can be applied on top of the electrode layer to enhance its surface morphology. Other similar interlayers can be optionally present between the anode and the photoactive layer for improving mechanical, chemical, and/or electronic properties of the device. The photoactive layer generally is made of two components as described above, and can have a layer thickness of, e.g., about 100 nm to a few microns. Before a counter electrode is applied (cathode), an electrically insulating transition layer can be applied onto the photoactive layer. This transition layer can be made of an alkali halogenide, e.g., LiF, and can be vapor-deposited in vacuum. Again, similar to the anode, other similar interlayers can be optionally present between the photoactive layer and the cathode for improving mechanical, chemical, and/or electronic properties of the device.

In certain embodiments, the optical or optoelectronic device can be configured as a photodetector. As known by those skilled in the art, photodetectors have a structure similar to that of solar cells, specifically, including a substrate, an anode, a cathode, and a photoactive layer between the anode and the cathode that can incorporate one or more compounds of the present teachings as the electron donor material.

Another aspect of the present teachings relates to methods of fabricating an organic light-emitting transistor or an organic light-emitting diode (OLED) that incorporates one or more semiconductor materials of the present teachings. For example, in an OLED, one or more compounds of the present teachings can be used as electron-transporting and/or emissive and/or hole-transporting materials. An OLED generally includes a substrate, a transparent anode (e.g., ITO), a cathode (e.g., metal), and one or more organic layers which can incorporate one or more compounds of the present teachings as hole-transporting (p-channel) and/or emissive and/or electron-transporting (n-channel) materials. In embodiments where the present compounds only have one or two of the properties of hole transport, electron transport, and emission, the present compounds can be blended with one or more further organic compounds having the remaining required property or properties.

In other embodiments, the article of manufacture can be an electronic or optoelectronic device (e.g., an organic light-emitting transistor) including a first electrode, a second electrode, and a semiconducting component in contact with the first electrode and the second electrode, where the semiconducting component includes a compound of the present teachings. These devices can include a composite having a semiconducting component (or semiconductor material) of the present teachings and a substrate component and/or a dielectric component. The substrate component can be selected from doped silicon, an indium tin oxide (ITO), ITO-coated glass, ITO-coated polyimide or other plastics, aluminum or other metals alone or coated on a polymer or other substrate, a doped polythiophene, and the like. The dielectric component can be prepared from inorganic dielectric materials such as various oxides (e.g., $SiO_2$, $Al_2O_3$, $HfO_2$), organic dielectric materials such as various polymeric materials (e.g., polycarbonate, polyester, polystyrene, polyhaloethylene, polyacrylate), and self-assembled superlattice/self-assembled nanodielectric (SAS/SAND) materials (e.g., as described in Yoon, M-H. et al., *PNAS*, 102 (13): 4678-4682 (2005), the entire disclosure of which is incorporated by reference herein), as well as hybrid organic/inorganic dielectric materials (e.g., described in U.S. patent application Ser. No. 11/642,504, the entire disclosure of which is incorporated by reference herein). In some embodiments, the dielectric component can include the crosslinked polymer blends described in U.S. patent application Ser. Nos. 11/315,076, 60/816,952, and 60/861,308, the entire disclosure of each of which is incorporated by reference herein. The composite also can include one or more electrical contacts. Suitable materials for the source, drain, and gate electrodes include metals (e.g., Au, Al, Ni, Cu), transparent conducting oxides (e.g., ITO, IZO, ZITO, GZO, GIO, GITO), and conducting polymers (e.g., poly(3,4-ethylenedioxythiophene) poly(styrenesulfonate) (PEDOT:PSS), polyaniline (PANI), polypyrrole (PPy)). One or more of the composites described herein can be embodied within various organic electronic, optical, and optoelectronic devices such as organic photovoltaics (OPV) and organic light-emitting transistors (OLETs) as described above.

The following examples are provided to illustrate further and to facilitate the understanding of the present teachings and are not in any way intended to limit the invention.

All reagents were purchased from commercial sources and used without further purification unless otherwise noted. Specifically, dioxane, dichlorobenzene (DCB), chloroform ($CHCl_3$), and other chlorinated hydrocarbons (CHCs) used for dielectric and semiconductor formulations were purchased from Sigma Aldrich and distilled before use. Anhydrous tetrahydrofuran (THF) was distilled from Na/benzophenone. Conventional Schlenk techniques were used and reactions were carried out under $N_2$ unless otherwise noted. 4,7-Bis(4-dodecyl-2-thienyl)-2,1,3-benzothiadiazole (Yue et al., *Macromolecules*, 42: 6510-6518 (2009)) and 4,7-bis(5-bromo-2-thienyl)-2,1,3-benzothiadiazole (Moule et al., *Chem. Mater*, 20: 4045-4050 (2008)) were prepared according to literature procedure.

Characterization data are provided in some cases by $^1$H-NMR, $^{13}$C-NMR, and/or elemental analysis. NMR spectra were recorded on an Inova 500 NMR spectrometer ($^1$H, 500 MHz). Elemental analyses were performed by Midwest Microlab, LLC. Polymer molecular weights were determined on a Waters GPC system (Waters Pump 510) in THF at room temperature versus polystyrene standards.

Example 1

Synthesis of Monomers

Example 1A

Preparation of 3,6-bis-(5-bromo-4-dodecyl-thiophen-2-yl)-2,5-bis-(2-ethyl-hexyl)-2,5-dihydro-pyrrolo[3,4-c]pyrrole-1,4-dione (6)

Step 1: 4-Dodecyl-thiophene-2-carboxylic acid (1)

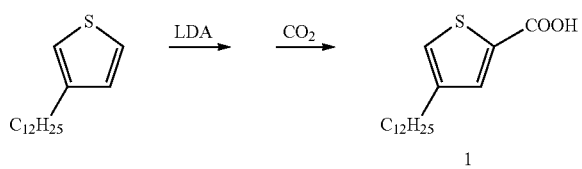

A 500 mL flask was vacuumed and backfilled with argon three times before di-iso-propylamine (5.06 g, 50 mmol) was added. The system was flushed with argon for 10 minutes before 300 mL of anhydrous THF was added. After the solution was cooled to −78° C., 20 mL of butyl lithium (2.5 M in hexane, 50 mmol) was added drop-wise. The resulting mixture containing lithium di-iso-propylamide (LDA) was stirred at −78° C. for 30 minutes before being warmed up to room temperature. 3-Dodecylthiophene (12.6 g, 50 mmol) was added drop-wise into the flask at 0° C. and the reaction mixture was stirred at 0° C. for 30 minutes before being cooled to −78° C. The system was purged overnight with $CO_2$ gas, which was generated with dry ice at room temperature and dried with concentrated $H_2SO_4$. The pH of the mixture was raised to about 1 with 1M HCl. The THF solvent was removed before 200 mL ethyl acetate was added. The organic layer was washed with water three times before the solvent was removed using a rotary evaporator. The product (10.0 g, 67.5% yield) was obtained as white solid after recrystallized from ethanol.

¹H NMR (DMSO-d$_6$, 500 MHz): δ 7.250 (s, 1H), 7.143 (s, 1H), 2.52 (t, 2H, J=7.0), 1.53 (t, 2H, J=7.0), 1.234 (b, 18H), 0.852 (t, 3H, J=7.0).

Step 2: 4-Dodecyl-thiophene-2-carboxylic acid amide (2)

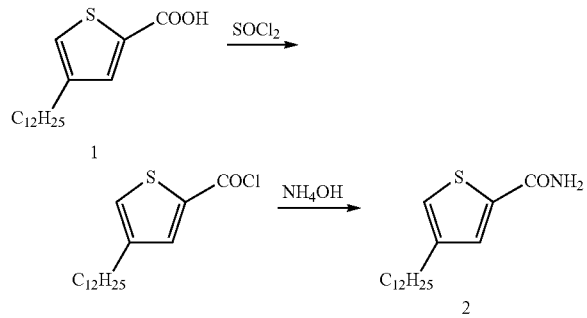

The mixture of 4-dodecyl-thiophene-2-carboxylic acid 1 (10.0 g, 33.8 mmol) and 60 mL of thionyl chloride (SOCl$_2$) was heated at reflux temperature for 3 hours before excess thionyl chloride was removed by rotary evaporator. Dichloromethane (100 mL) was added and the resulting solution was added drop-wise slowly into a mixture of NH$_4$OH (70 mL, 28-30%) in 200 mL of dichloromethane cooled in an ice/salt bath and the reaction temperature was kept below −5° C. White precipitates formed immediately. The mixture was stirred for another 20 minutes. The precipitate was collected by vacuum filtration and washed with water three times and weighed 9.49 g (95% yield) after being dried in vacuo at 60° C.

¹H NMR (DMSO-d$_6$, 500 MHz): δ 7.87 (b, 1H), 7.60 (s, 1H), 7.34 (s, 1H), 2.53 (t, 2H, J=7.5), 1.55 (b, 2H), 1.24 (b, 18H), 0.85 (t, 3H, J=7.5). ¹³C NMR (DMSO-d$_6$, 500 MHz): δ 162.83, 143.14, 139.69, 129.52, 125.59, 31.21, 29.82, 29.67, 28.96, 28.95, 28.93, 28.87, 28.72, 28.64, 28.52, 22.00, 13.89.

Step 3: 4-Dodecyl-thiophene-2-carbonitrile (3)

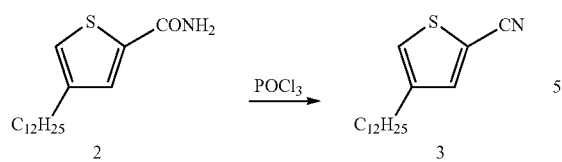

4-Dodecyl-thiophene-2-carboxylic acid amide 2 (5.0 g, 16.9 mmol) was mixed with 50 mL of POCl$_3$ and the mixture was heated at reflux temperature for 2 hours before POCl$_3$ was removed by a rotary evaporator. Dichloromethane (100 mL) was added followed by drop-wise addition of ice water (100 mL). The organic layer was washed with 30 mL of water twice before the solvent was removed. The brown oil obtained was purified with a column of silica gel with hexane/dichloromethane (v/v: 1/1) as the eluent. After removal of the solvent, the product was obtained as a yellow oil (2.49 g, 53% yield).

¹H NMR (CDCl$_3$, 500 MHz): δ 7.45 (s, 1H), 7.19 (s, 1H), 7.30 (d, 1H, J=5.0), 2.61 (t, 2H, J=7.5), 1.60 (b, 2H), 1.29 (b, 18H), 0.88 (t, 3H, J=7.5). ¹³C NMR (CDCl$_3$, 500 MHz): δ 144.12, 138.34, 127.48, 114.62, 109.36, 31.93, 30.32, 29.96, 29.67, 29.66, 29.65, 29.64, 29.55, 29.37, 29.11, 22.72, 14.16.

Step 4: 3,6-Bis-(4-dodecyl-thiophen-2-yl)-2,5-dihydro-pyrrolo[3,4-c]pyrrole-1,4-dione (4)

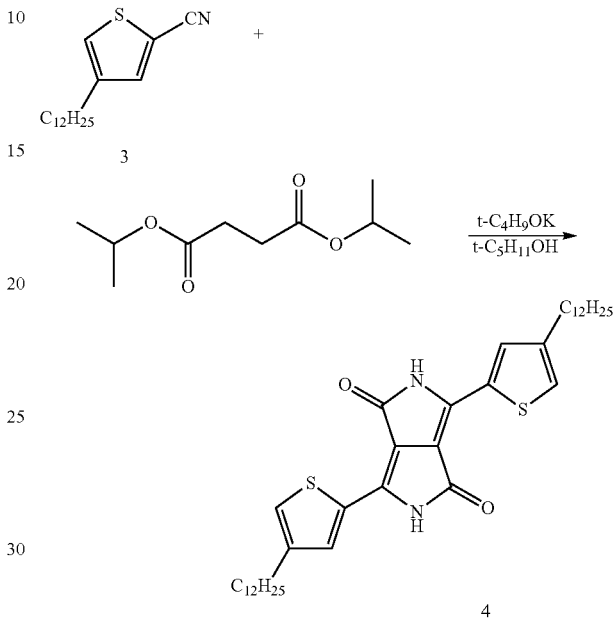

A 50 mL flask was flushed with argon and then potassium tert-butoxide (t-BuOK) (1.01 g, 9.0 mmol) and t-amyl alcohol (10 mL) were added. The mixture was warmed to 50° C. until all solids were dissolved. 4-Dodecyl-thiophene-2-carbonitrile 3 (1.68 g, 6.0 mmol) in 5 mL of t-amyl alcohol was added in one portion. The solution was warmed further to 85° C. for 20 minutes to dissolve all solids. Succinic acid diisopropyl ester (0.60 g, 3.0 mmol) in 2 mL of t-amyl alcohol was added and the reaction mixture was heated at 85° C. overnight. The temperature was decreased to 50° C. before 20 mL of methanol and 5 mL of acetic acid were added. A deep red powder was collected by vacuum filtration, then washed with water and hot methanol. After drying in vacuo, the crude product obtained (1.91 g) was used in the next step without further purification.

Step 5: 3,6-Bis-(4-dodecyl-thiophen-2-yl)-2,5-bis-(2-ethyl-hexyl)-2,5-dihydro-pyrrolo[3,4-c]pyrrole-1,4-dione (5)

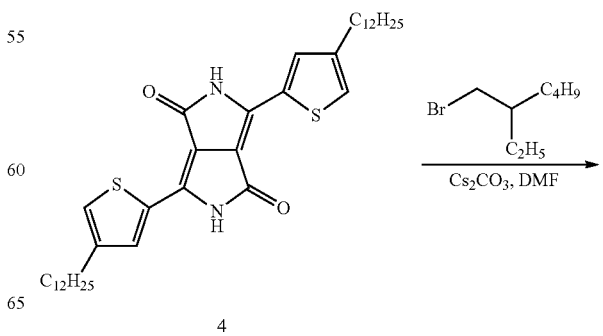

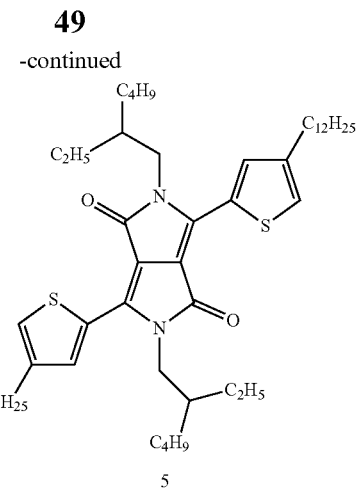

5

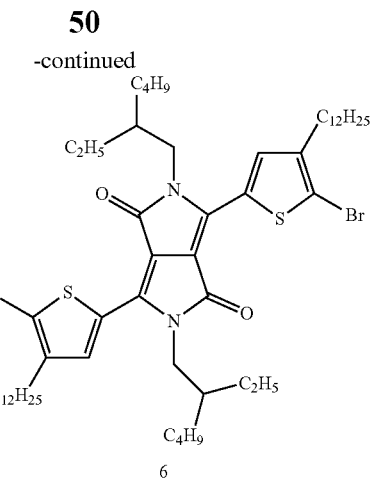

6

A 100 mL flask was charged with 3,6-bis-(4-dodecyl-thiophen-2-yl)-2,5-dihydro-pyrrolo[3,4-c]pyrrole-1,4-dione 4 (1.91 g, 3.0 mmol), 3-bromomethyl-heptane (1.54 g, 8.0 mmol), Cs$_2$CO$_3$ (2.93 g, 9.0 mmol) and then purged with argon for 10 minutes before 100 mL of dimethylformamide (DMF) was added. The mixture was heated at 60° C. overnight and then cooled to room temperature. Dichloromethane (50 mL) was added. The organic layer was washed with water (50 mL for 3 times) and then dried over anhydrous Na$_2$SO$_4$. Black solids were obtained after removal of the solvent and precipitation from methanol. The product was purified by column with dichloromethane/hexane (v/v: 2/1) as the eluent and weighed 0.55 g (overall yield: 21.3% from 4-dodecyl-thiophene-2-carbonitrile 3) after being dried.

$^1$H NMR (CDCl$_3$, 500 MHz): δ 8.72 (d, 2H, J=1.0), 7.23 (d, 2H, J=1.0), 4.01 (m, 4H), 2.70 (t, 4H, J=7.5), 1.86 (b, 2H), 1.68 (t, 4H, J=7.5), 1.26 (m, 56H), 0.88 (m, 18H). $^{13}$C NMR (CDCl$_3$, 500 MHz): δ 161.76, 144.82, 140.29, 136.30, 129.54, 125.82, 107.69, 45.81, 39.03, 31.94, 30.48, 30.32, 30.19, 29.69, 29.68, 29.67, 29.64, 29.45, 29.39, 29.38, 28.35, 23.56, 23.12, 22.72, 14.16, 14.07, 10.60.

Step 6: 3,6-bis-(5-bromo-4-dodecyl-thiophen-2-yl)-2,5-bis-(2-ethyl-hexyl)-2,5-dihydro-pyrrolo[3,4-c]pyrrole-1,4-dione (6)

3,6-Bis-(4-dodecyl-thiophen-2-yl)-2,5-bis-(2-ethyl-hexyl)-2,5-dihydro-pyrrolo[3,4-c]pyrrole-1,4-dione 5 (0.50 g, 0.58 mmol) was purged with argon before 20 mL of chloroform was added. The system was kept in dark before 0.238 g of NBS (1.22 mmol) was added in several portions. The mixture was stirred overnight before being quenched with 50 mL of water. The aqueous layer was extracted with chloroform (50 mL) twice. The combined organic layer was dried over anhydrous Na$_2$SO$_4$. The product was further purified by silica gel column with chloroform as the eluent after removal of the solvent. Recrystallization in iso-proanol/methanol offered 0.55 g of a red solid product (93.2% yield).

$^1$H NMR (CDCl$_3$, 500 MHz): δ 8.57 (s, 2H), 3.53 (m, 4H), 2.64 (t, 4H, J=7.5), 1.85 (b, 2H), 1.65 (m, 4H), 1.55 (m, 4H), 1.26 (m, 56H), 0.88 (m, 18H). $^{13}$C NMR (CDCl$_3$, 500 MHz): δ 161.49, 114.00, 139.38, 135.64 129.28, 116.31, 107.28, 45.96, 39.09, 31.98, 30.17, 29.74, 29.73, 29.71, 29.70, 29.65, 29.50, 29.42, 29.34, 28.31, 23.60, 23.12, 22.75, 14.19, 14.10, 10.60.

Example 1B

Preparation of 3,6-bis-(5-bromo-4-dodecyl-thiophen-2-yl)-2,5-bis-(2-butyl-octyl)-2,5-dihydro-pyrrolo[3,4-c]pyrrole-1,4-dione (8)

Step 1: 2,5-Bis-(2-butyl-octyl)-3,6-bis-(4-dodecyl-thiophen-2-yl)-2,5-dihydro-pyrrolo[3,4-c]pyrrole-1,4-dione

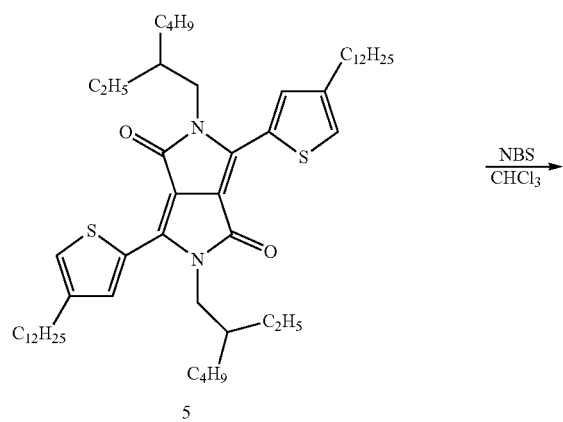

5

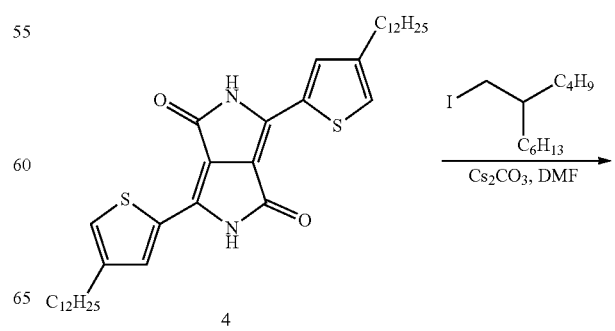

4

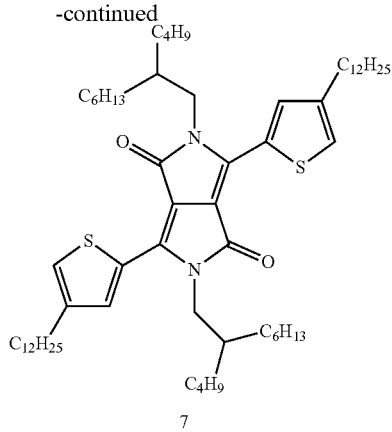

7

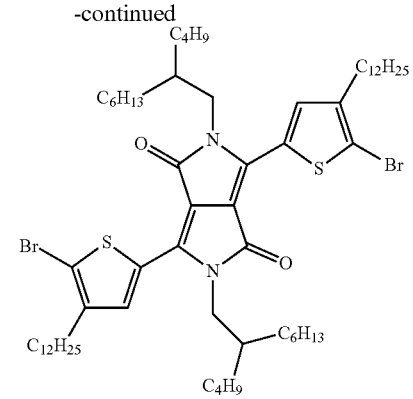

8

A 100 mL flask was charged with 3,6-bis-(4-dodecyl-thiophen-2-yl)-2,5-dihydro-pyrrolo[3,4-c]pyrrole-1,4-dione 4 (4.3 g, 6.75 mmol), 5-iodomethyl-undecane (6.22 g, 21.0 mmol), $Cs_2CO_3$ (7.82 g, 24.0 mmol) and then purged with argon for 10 minutes before 150 mL of dimethylformamide (DMF) was added. The mixture was heated at 60° C. for 36 hours, then at 90° C. for 8 hours, and cooled to room temperature before 200 mL of hexane was added. The organic layer was washed with water (200 mL, 3 times), then dried over anhydrous $Na_2SO_4$. Black solids were obtained after removal of the solvent and precipitation from methanol. The product was purified by column with dichloromethane/hexane (v/v: 2/1 with $R_f$=0.25) as the eluent and weighed 1.43 g (21.7% yield from 4-dodecyl-thiophene-2-carbonitrile 3) after drying.

$^1$H NMR ($CDCl_3$, 500 MHz): δ 8.71 (d, 2H, J=1.5), 7.24 (d, 2H, J=1.5), 4.02 (d, 4H, J=8.0), 2.71 (t, 4H, J=7.5), 1.93 (b, 2H), 1.70 (t, 4H, J=7.5), 1.27 (m, 72H), 0.86 (m, 18H). $^{13}$C NMR ($CDCl_3$, 500 MHz): δ 161.80, 144.82, 140.33, 136.24, 129.56, 125.81, 107.73, 45.11, 37.67, 31.97, 31.96, 31.82, 31.13, 30.87, 30.53, 30.36, 29.73, 29.72, 29.70, 29.68, 29.49, 29.42, 29.41, 28.45, 26.20, 23.13, 22.75, 22.69, 14.19, 14.15, 14.10.

Step 2: 3,6-Bis-(5-bromo-4-dodecyl-thiophen-2-yl)-2,5-bis-(2-butyl-octyl)-2,5-dihydro-pyrrolo[3,4-c]pyrrole-1,4-dione

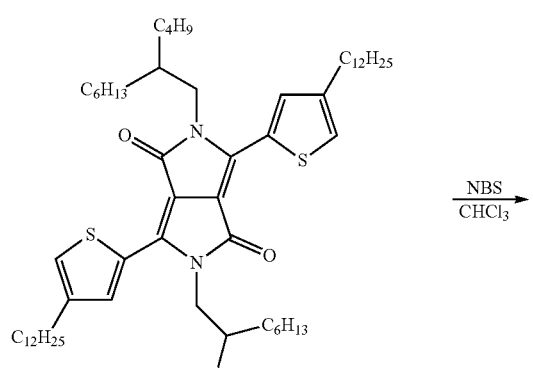

7

2,5-Bis-(2-butyl-octyl)-3,6-bis-(4-dodecyl-thiophen-2-yl)-2,5-dihydro-pyrrolo[3,4-c]pyrrole-1,4-dione 7 (1.43 g, 1.47 mmol) was purged with argon before 30 mL of chloroform was added. The system was kept in darkness before 0.549 g of NBS (3.08 mmol) was added in several portions. The mixture was stirred overnight before being quenched with 50 mL of water. The aqueous layer was extracted with chloroform (50 mL) twice. The combined organic layer was dried over anhydrous $Na_2SO_4$. The product was purified by silica gel column with dichloromethane/hexane (v/v: 1/1) as the eluent after removal of the solvent. Recrystallization in iso-proanol/methanol offered 1.40 g of a red solid product (84.3% yield).

Example 1C

Preparation of 3,6-Bis-(5-bromo-6-undecyl-thieno[3,2-b]thiophen-2-yl)-2,5-bis-(2-butyl-octyl)-2,5-dihydro-pyrrolo[3,4-c]pyrrole-1,4-dione Step 1:
6-Undecyl-thieno[3,2-b]thiophene-2-carboxylic acid

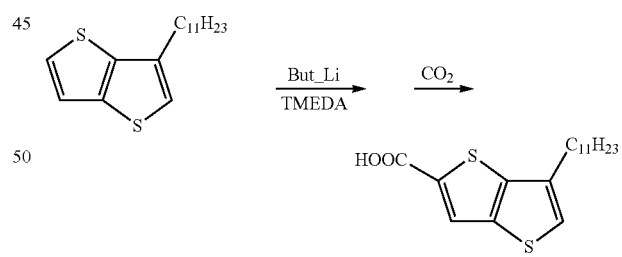

3-Undecyl-thieno[3,2-b]thiophene (3.80 g, 12.9 mmol) was added into a 100 mL flask and the system was vacuumed and backfilled with argon 3 times before 30 mL of anhydrous THF was injected. The solution was cooled down to −78° C. for 30 minutes before 5.16 mL of But_Li (2.5 M in hexane, 12.9 mmol) was added, followed by addition of tetramethyl-ethylenediamine (TMEDA, 1.5 g, 12.9 mmol). The mixture was heated to reflux for 1 hour before it was cooled down to −40° C. Then $CO_2$ gas was bubbled through the solution overnight. Ethyl acetate (200 mL) was added and the resulting mixture was washed with 1 M HCl 3 times before it was dried over $Na_2SO_4$ to give 4.2 g (yield: 96.1%) of a brown powder.

¹H NMR (DMSO-d₆, 500 MHz): δ 8.07 (s, 1H), 7.26 (s, 1H), 7.25 (b, 1H), 2.74 (t, 2H, J=8.0), 1.75 (m, 2H), 1.26 (b, 16H), 0.88 (t, 3H, J=7.0)

Step 2:
6-Undecyl-thieno[3,2-b]thiophene-2-carboxylic acid amide

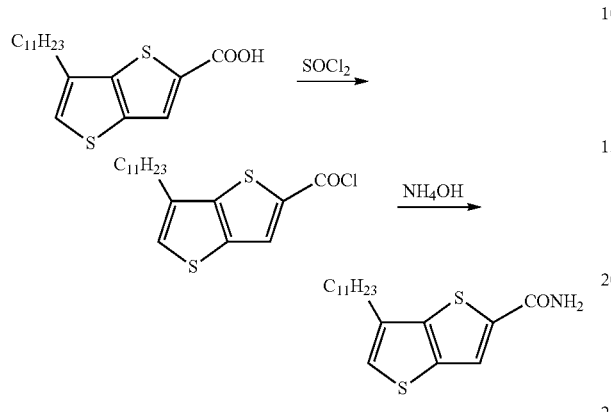

To 6-undecyl-thieno[3,2-b]thiophene-2-carboxylic acid (4.2 g) was added 30 mL of thionyl chloride and one drop of DMF. The mixture was heated to reflux for 3 hours before excess thionyl chloride was removed by a rotary evaporator. Dichloromethane (100 mL) was added and the resulting solution was added slowly drop-wise into a mixture of NH₄OH (30 mL, 28-30%) in 50 mL of dichloromethane cooled in an ice/salt bath and the reaction temperature was kept below −5° C. White precipitate formed immediately. The mixture was stirred for 20 more minutes. The brown precipitate was collected by vacuum filtration and washed with water three times and weighed 4.2 g (yield 100%) after it was dried in vacuo at 60° C.

Step 3:
6-Undecyl-thieno[3,2-b]thiophene-2-carbonitrile

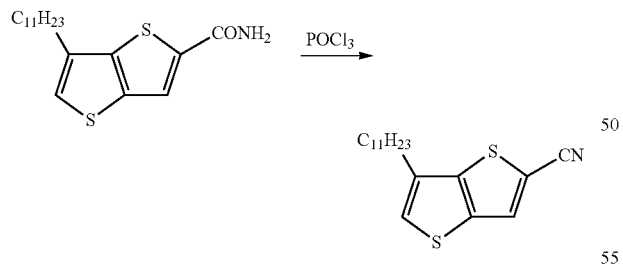

To 6-undecyl-thieno[3,2-b]thiophene-2-carboxylic acid amide (4.2 g) was added 30 mL of POCl₃ and the mixture was heated to reflux for 2 hours before POCl₃ was removed by a rotary evaporator. Dichloromethane (50 mL) was added and then 100 mL of ice water was added dropwise. The organic layer was further washed with 30 mL of water twice and then dried over anhydrous Na₂SO₄ before the solvent was removed. The obtained brown oil was passed through a column of silica gel with hexane/dichloromethane (v/v, 3/2) as the eluent. The solvent was removed to give a yellow oil (2.3 g, 75.7% yield).

¹H NMR (CDCl₃, 500 MHz): δ 7.76 (s, 1H), 7.30 (s, 1H), 2.70 (t, 2H, J=7.5), 1.73 (b, 2H), 1.26 (b, 18H), 0.88 (t, 3H, J=7.5)

Step 4: 3,6-Bis-(6-undecyl-thieno[3,2-b]thiophen-2-yl)-2,5-dihydro-pyrrolo[3,4-c]pyrrole-1,4-dione

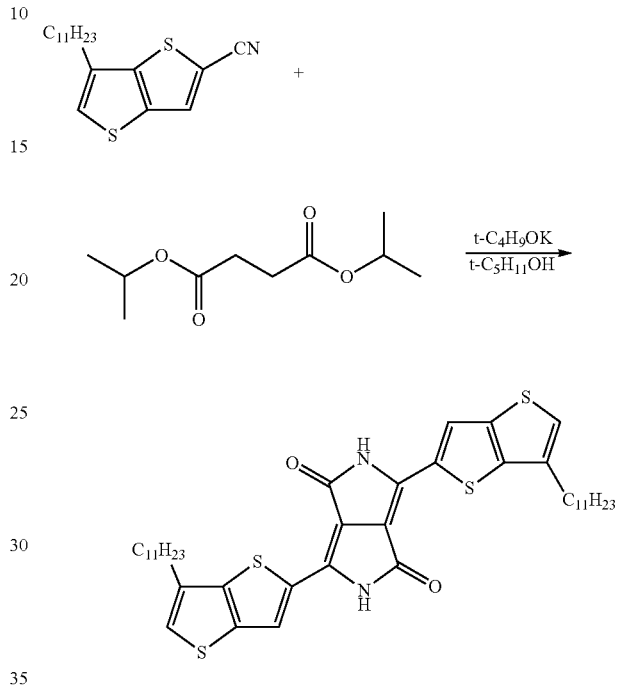

A 50 mL flask was flushed with argon and then into it was added potassium tert-butoxide (t-BuOK) (0.51 g) and 5 mL of t-amyl alcohol. The mixture was warmed to 50° C. until all solids were dissolved. 6-Undecyl-thieno[3,2-b]thiophene-2-carbonitrile (0.96 g) in 5 mL of t-amyl alcohol was added in one portion. The solution was warmed to 85° C. for 20 minutes to dissolve all solids. Succinic acid diisopropyl ester (0.303 g) in 2 mL of t-amyl alcohol was added and the reaction mixture was heated at 85° C. overnight. The temperature was decreased to 50° C. before 20 mL of methanol and 5 mL of acetic acid were added. A deep red powder was collected by vacuum filtration and washed with water, hot methanol. The crude product weighed 1.08 g after it was dried in vacuo, and was pure enough for use in the next step.

Step 5: 2,5-Bis-(2-butyl-octyl)-3,6-bis-(6-undecyl-thieno[3,2-b]thiophen-2-yl)-2,5-dihydro-pyrrolo[3,4-c]pyrrole-1,4-dione

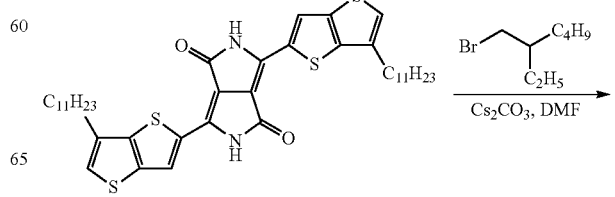

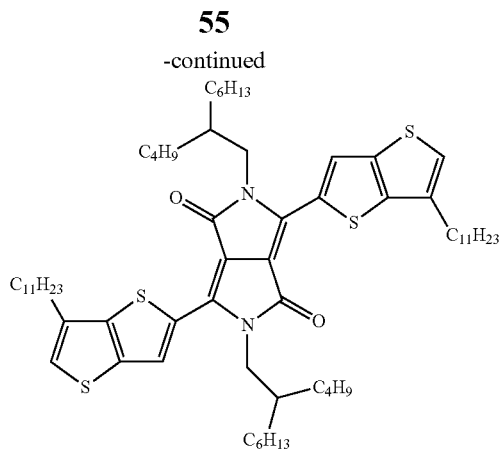

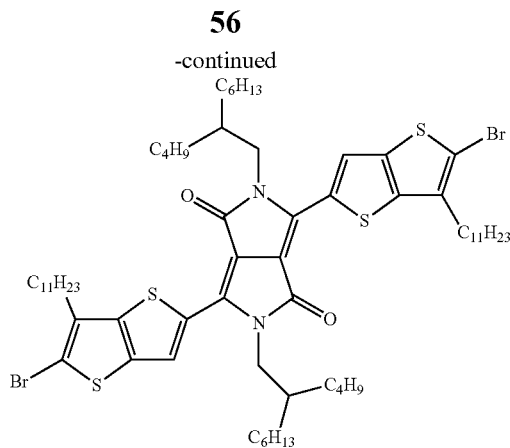

A 100 mL flask was charged with 3,6-bis-(6-undecyl-thieno[3,2-b]thiophen-2-yl)-2,5-dihydro-pyrrolo[3,4-c]pyrrole-1,4-dione (1.08 g, 1.5 mmol), 3-bromomethyl-heptane (1.33 g, 4.5 mmol), and Cs$_2$CO$_3$ (1.63 g, 5.0 mmol), then purged with argon for 10 minutes before 100 mL of dimethylformamide (DMF) was added. The mixture was heated at 60° C. for overnight and then cooled to room temperature. Dichloromethane (50 mL) was added. The organic layer was washed with water (50 mL, 3 times) and then dried over anhydrous Na$_2$SO$_4$. After removal of the solvent and precipitation from methanol, a black solid was obtained, which then was purified by column chromatography with a mixture of dichloromethane and hexane (v/v, 2/3) as the eluent. The purified product weighed 0.70 g (44.3% yield) after it was dried.

$^1$H NMR (CDCl$_3$, 500 MHz): δ 9.28 (d, 2H, J=1.0), 7.23 (d, 2H, J=1.0), 4.11 (d, 4H, J=8.0), 2.79 (m, 4H), 2.01 (b, 2H), 1.79 (m, 4H), 1.68 (t, 4H, J=7.5), 1.26 (m, 64H), 0.88 (m, 18H)

Step 6: 3,6-Bis-(5-bromo-6-undecyl-thieno[3,2-b]thiophen-2-yl)-2,5-bis-(2-butyl-octyl)-2,5-dihydro-pyrrolo[3,4-e]pyrrole-1,4-dione 2,5-Bis-(2-butyl-octyl)-3,6-bis-(6-undecyl-thieno[3,2-b]thiophen-2-yl)-2,5-dihydro-pyrrolo[3,4-c]pyrrole-1,4-dione (0.35 g, 0.33 mmol) was purged with argon before 20 mL of chloroform was added. The system was kept out of light before 0.130 g of NBS (0.728 mmol) was added in several portions. The mixture was stirred overnight before it was quenched with 50 mL of water. The aquatic layer was further extracted with chloroform (50 mL×2). The combined organic layer was dried over anhydrous Na$_2$SO$_4$. The solvent was removed, then the product was purified through a silica gel column with hexane/DCM (v/v, 3/2) as the eluent. Recrystallization in iso-propanol/methanol gave a red solid (0.29 g, 72.6% yield).

$^1$H NMR (CDCl$_3$, 500 MHz): δ 9.21 (s, 2H), 4.07 (t, 4H, J=7.5), 2.77 (m, 4H), 1.95 (b, 2H), 1.72 (m, 4H), 1.55 (m, 4H), 1.25 (m, 56H), 0.82 (m, 18H)

Example 2

Polymer Synthesis

Example 2A

Preparation of Polymer 1

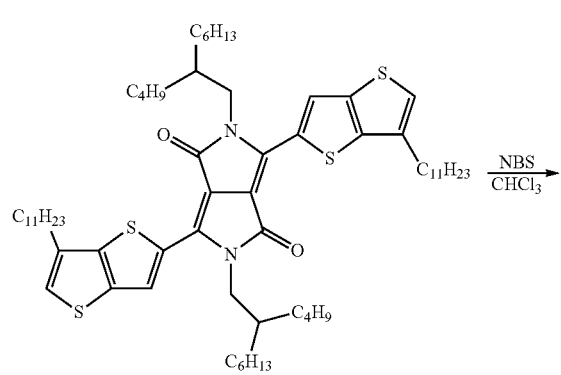 $\xrightarrow{\text{NBS}}{\text{CHCl}_3}$ 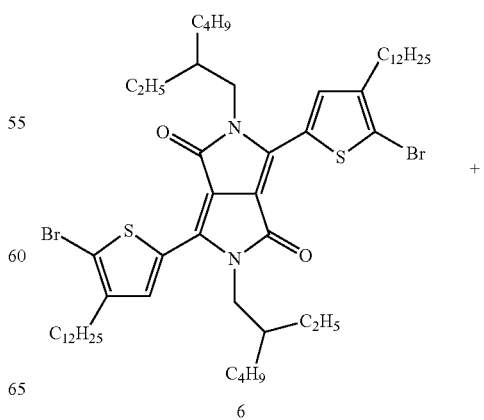 +

-continued

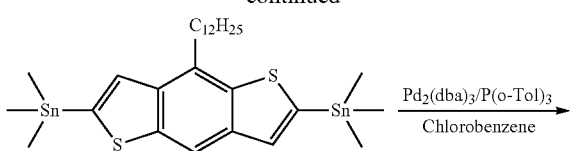
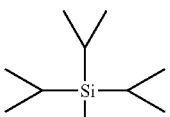

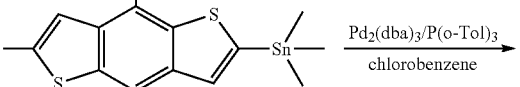

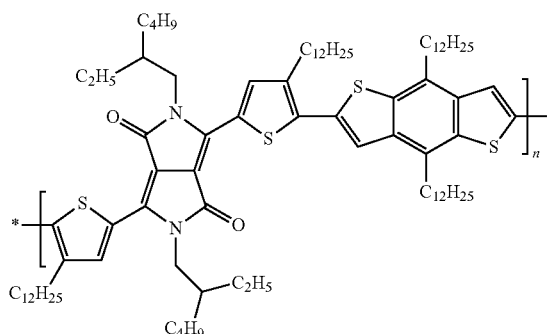

Polymer 1

3,6-Bis-(4-dodecyl-thiophen-2-yl)-2,5-bis-(2-ethyl-hexyl)-2,5-dihydro-pyrrolo[3,4-c]pyrrole-1,4-dione 6 (50.96 mg, 0.05 mmol), 2-dimethylstannanyl-4,8-didodecyl-6-trimethylstannanyl-1,5-dithia-s-indacene (42.6 mg, 0.05 mmol), Pd$_2$(dba)$_3$ (1.83 mg, 2.0 µmol), P(o-Tol)$_3$ (2.43 mg, 8.0 µmol) were combined in a 50 mL flask. The system was purged with argon before 10 mL of anhydrous chlorobenzene was added. The reaction mixture was heated at 130° C. for 18 hours. After cooling to room temperature, the polymer was precipitated out from methanol and further purified by Soxhlet extraction with methanol, hexane, THF and toluene, chloroform. The product was purified one more time by Soxhlet extraction with chlorobenzene and weighed 5.8 mg (8.4% yield) after being dried in vacuo.

Example 2B

Preparation of Polymer 2

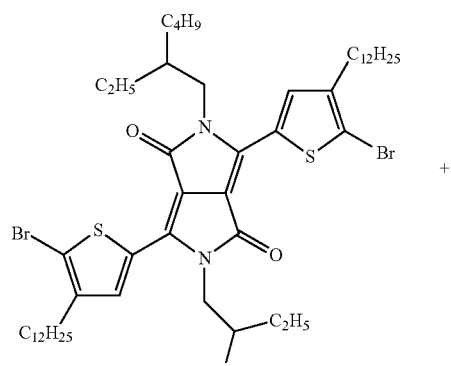

6

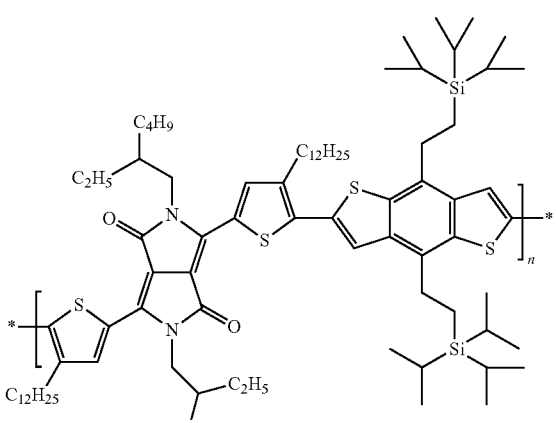

Polymer 2

3,6-Bis-(4-dodecyl-thiophen-2-yl)-2,5-bis-(2-ethyl-hexyl)-2,5-dihydro-pyrrolo[3,4-c]pyrrole-1,4-dione 6 (50.96 mg, 0.05 mmol), 4,8-bis-(2-triisopropylsilanyl-ethyl)-2,6-bis-trimethylstannanyl-benzo[1,2-b:4,5-b']dithiophene (44.3 mg, 0.05 mmol), Pd$_2$(dba)$_3$ (1.83 mg, 2.0 µmol), P(o-Tol)$_3$ (2.43 mg, 8.0 µmol) were combined in a 50 mL flask. The system was purged with argon before 10 mL of anhydrous chlorobenzene was added. The reaction mixture was heated at 130° C. for 18 hours. After cooling to room temperature, the polymer was precipitated out from methanol and further purified by Soxhlet extraction with methanol and hexane. The product was purified with Soxhlet extraction one more time with hexane and weighed 7.5 mg (10.6% yield) after being dried in vacuo.

Example 2C

Preparation of Polymer 3

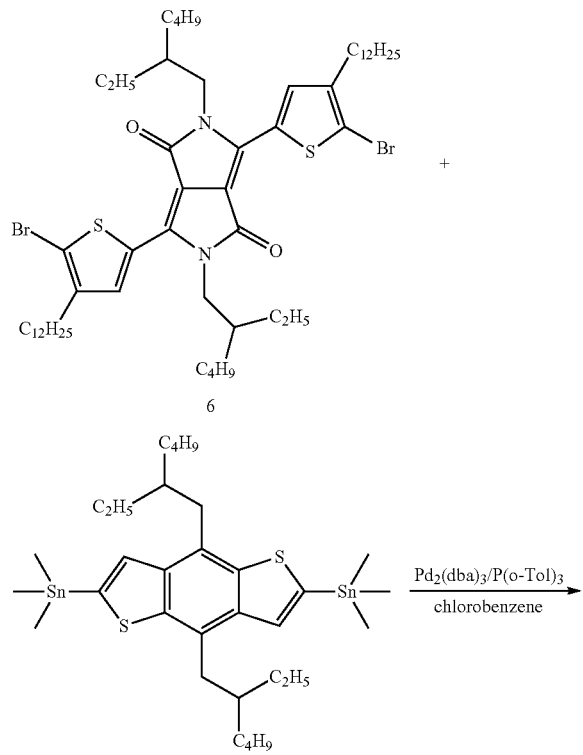

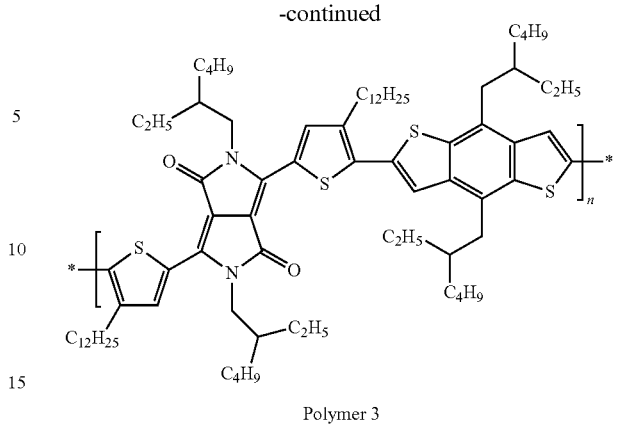

Polymer 3

3,6-Bis-(4-dodecyl-thiophen-2-yl)-2,5-bis-(2-ethyl-hexyl)-2,5-dihydro-pyrrolo[3,4-c]pyrrole-1,4-dione 6 (50.96 mg, 0.05 mmol), 4,8-bis-(2-ethyl-hexyl)-2,6-bis-trimethyl-stannanyl-1,5-dithia-s-indacene (37.01 mg, 0.05 mmol), $Pd_2(dba)_3$ (1.83 mg, 2.05 μmol), P(o-Tol)$_3$ (2.43 mg, 7.98 μmol) were combined in a 50 mL flask. The system was purged with argon before 10 mL of anhydrous chlorobenzene was added. The reaction mixture was heated at 130° C. for 18 hours. After cooling to room temperature, the polymer was precipitated out from methanol and further purified by Soxhlet extraction with methanol, then hexane. The product was purified by Soxhlet extraction one more time with THF and weighed 25.8 mg (40.5% yield) after being dried in vacuo.

Example 2D

Preparation of Polymer 4

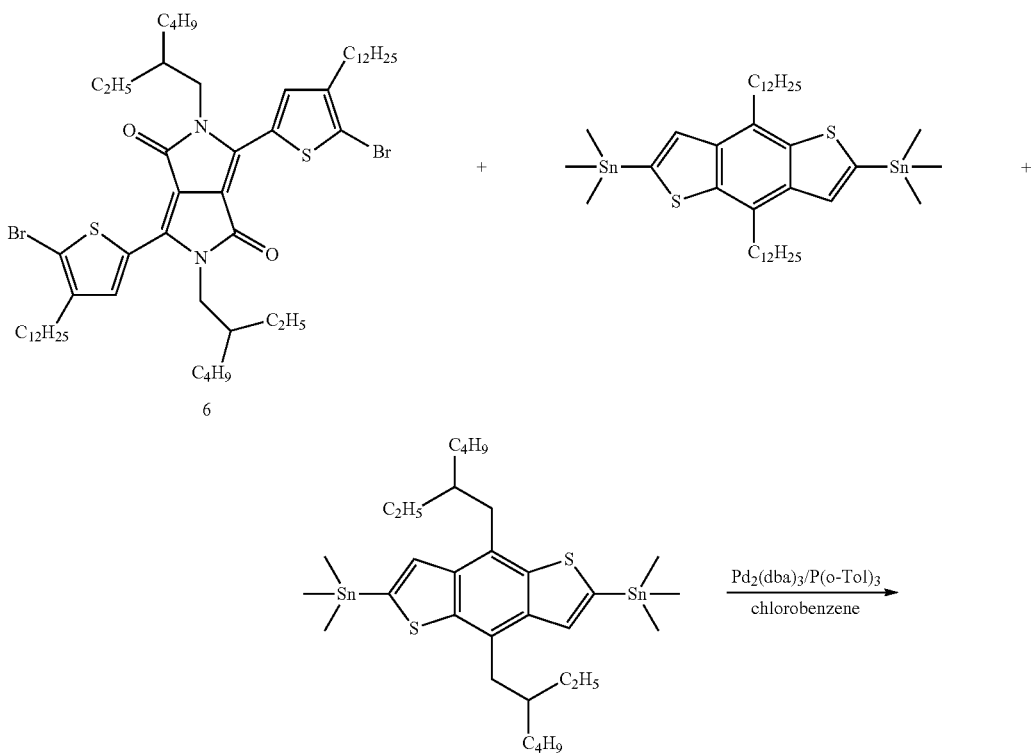

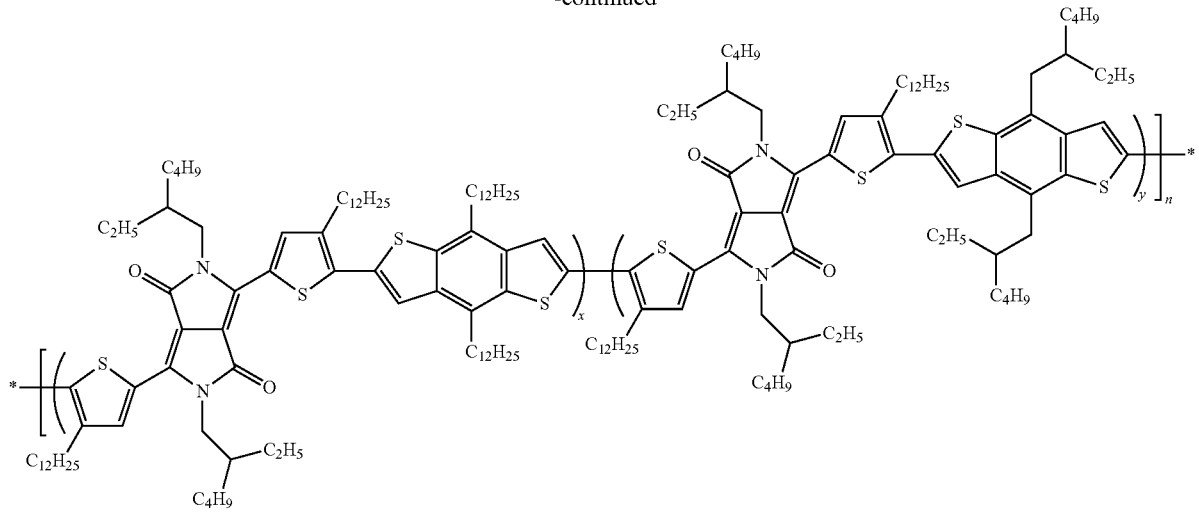

x = 0.5, y = 0.5

Polymer 4

3,6-Bis-(4-dodecyl-thiophen-2-yl)-2,5-bis-(2-ethyl-hexyl)-2,5-dihydro-pyrrolo[3,4-c]pyrrole-1,4-dione 6 (50.96 mg, 0.05 mmol), 2-dimethylstannanyl-4,8-didodecyl-6-trimethylstannanyl-1,5-dithia-s-indacene (21.3 mg, 0.025 mmol), 4,8-bis-(2-ethyl-hexyl)-2,6-bis-trimethylstannanyl-1,5-dithia-s-indacene (18.51 mg, 0.025 mmol), $Pd_2(dba)_3$ (1.83 mg, 2.05 mmol), P(o-Tol)$_3$ (2.43 mg, 7.98 μmol) were combined in a 50 mL flask. The system was purged with argon before 10 mL of anhydrous chlorobenzene was added. The reaction mixture was heated at 130° C. for 18 hours. After cooling to room temperature, the polymer was precipitated out from methanol and further purified by Soxhlet extraction with methanol, hexane, THF, and toluene. The product was purified by Soxhlet extraction one more time with chloroform and weighed 5.0 mg (7.53% yield) after being dried in vacuo.

Example 2E

Preparation of Polymer 5

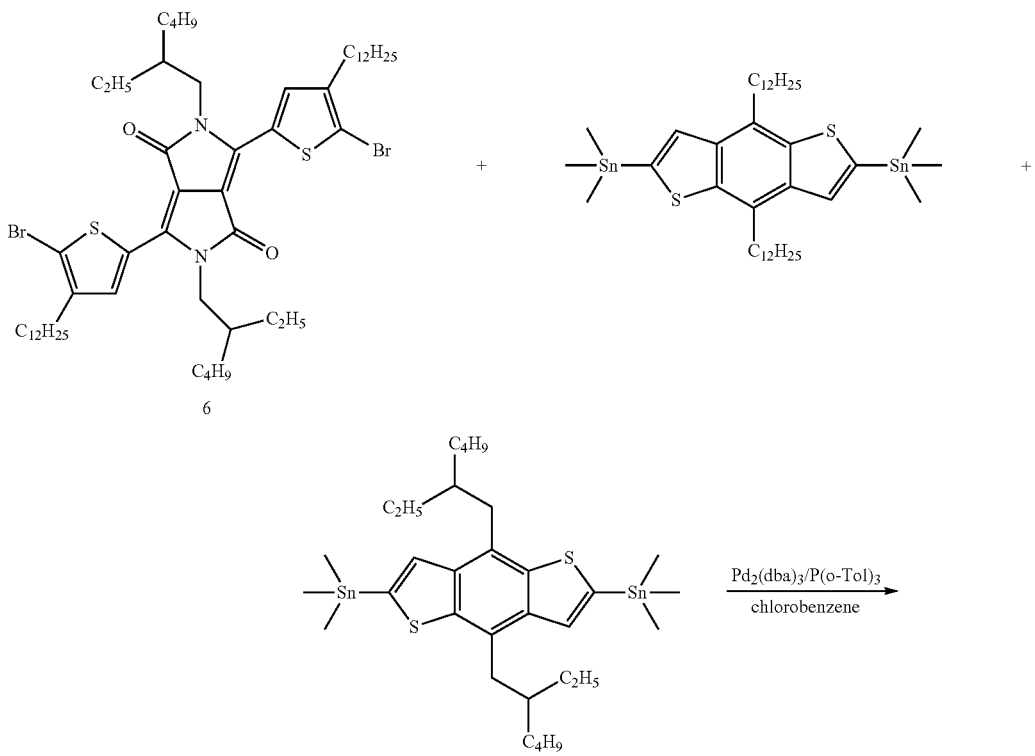

-continued

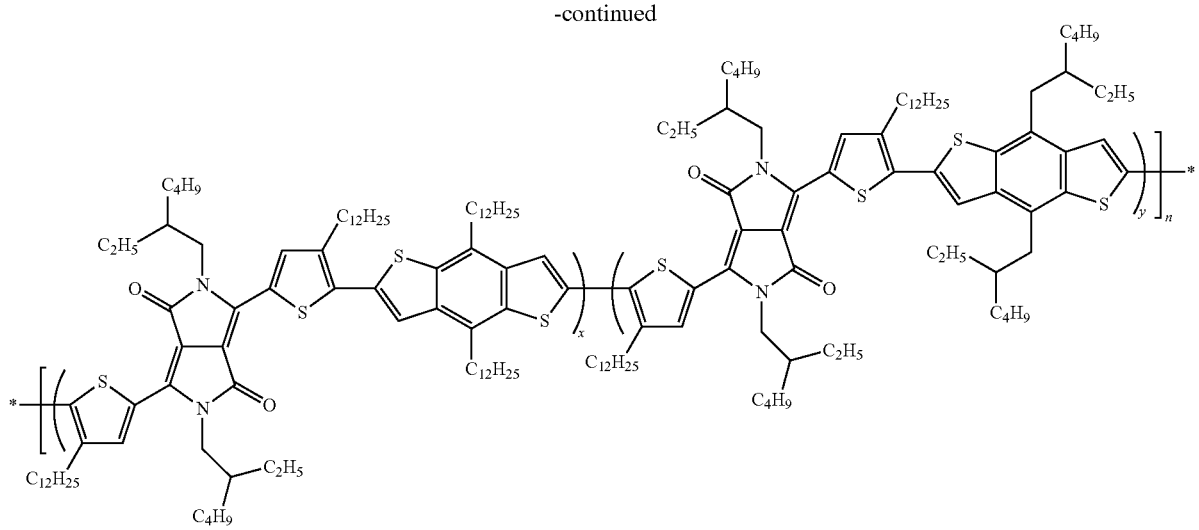

x = 0.55, y = 0.45

$C_{168}H_{260}N_4O_4S_8$**
Mol. Wt.: 2656.41

Polymer 5

3,6-Bis-(4-dodecyl-thiophen-2-yl)-2,5-bis-(2-ethyl-hexyl)-2,5-dihydro-pyrrolo[3,4-c]pyrrole-1,4-dione 6 (81.54 mg, 0.08 mmol), 2-dimethylstannanyl-4,8-didodecyl-6-trimethylstannanyl-1,5-dithia-s-indacene (37.51 mg, 0.044 mmol), 4,8-bis-(2-ethyl-hexyl)-2,6-bis-trimethylstannanyl-1,5-dithia-s-indacene (26.65 mg, 0.036 mmol), Pd$_2$(dba)$_3$ (2.93 mg, 3.2 mmol), P(o-Tol)$_3$ (3.89 mg, 12.8 µmol) were combined in a 50 mL flask. The system was purged with argon before 16 mL of anhydrous chlorobenzene was added. The reaction mixture was heated at 130° C. for 18 hours. After cooling to room temperature, the polymer was precipitated out from methanol and further purified by Soxhlet extraction with methanol, hexane, THF, toluene, and chloroform. The product was purified by Soxhlet extraction one more time with chlorobenzene and weighed 19.5 mg (29.4% yield) after being dried in vacuo.

Example 2F

Preparation of Polymer 6

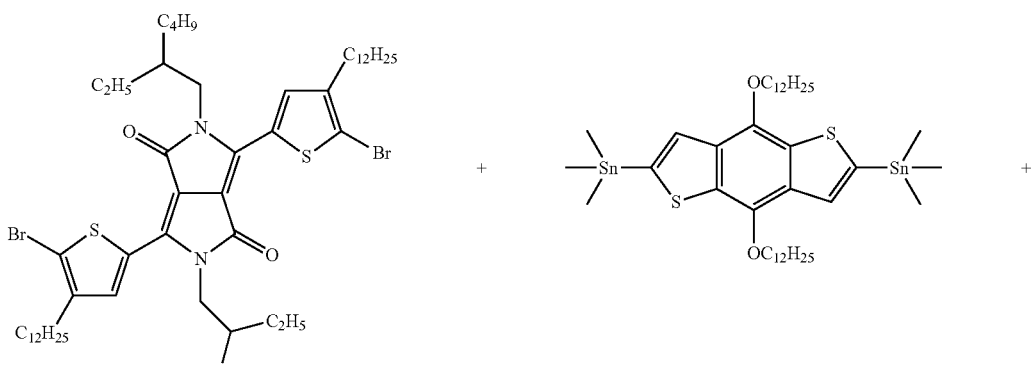

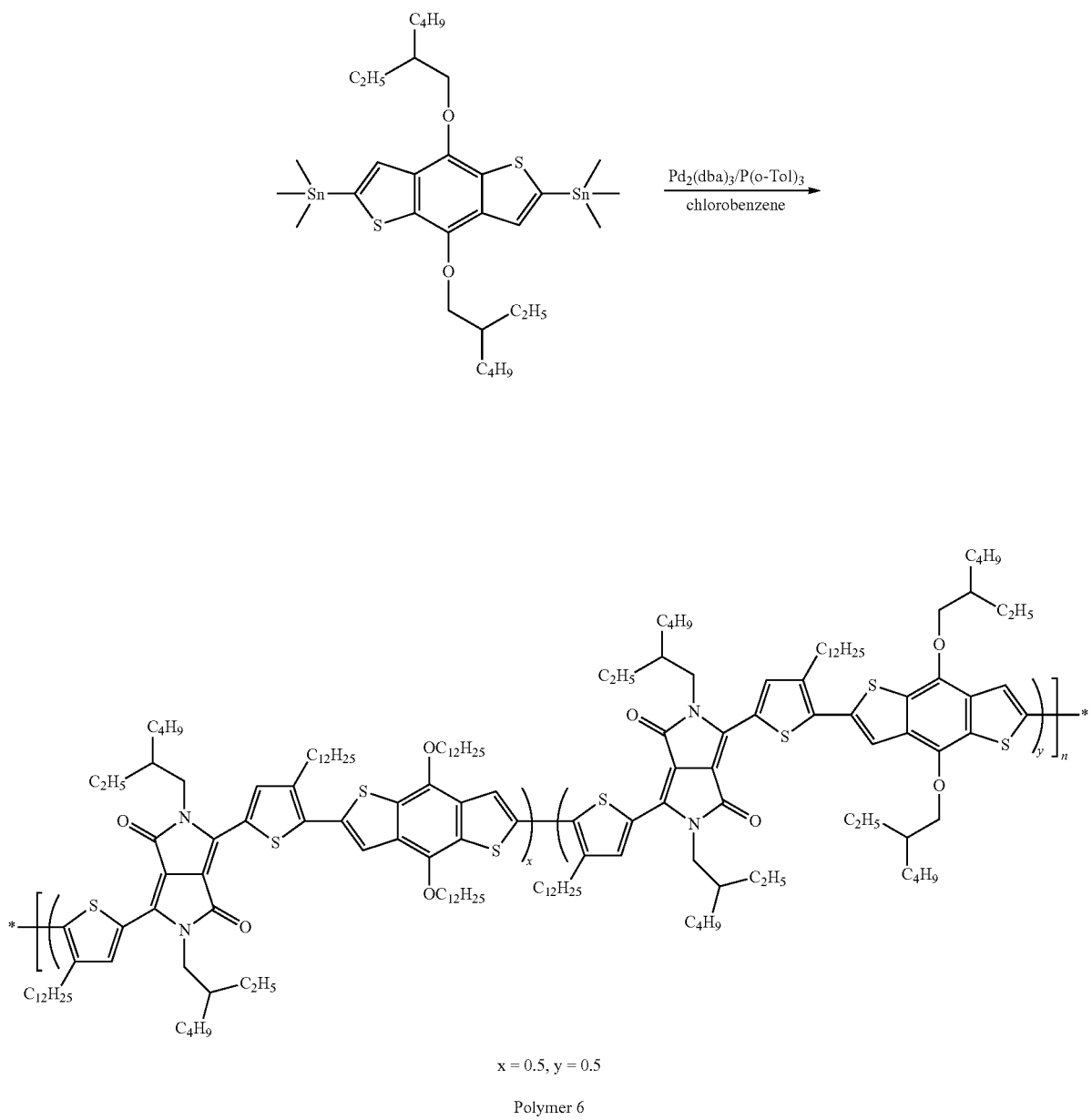

x = 0.5, y = 0.5

Polymer 6

3,6-Bis-(4-dodecyl-thiophen-2-yl)-2,5-bis-(2-ethyl-hexyl)-2,5-dihydro-pyrrolo[3,4-c]pyrrole-1,4-dione 6 (50.96 mg, 0.05 mmol), 4,8-bis-dodecyloxy-2,6-bis-trimethylstannanyl-1,5-dithia-s-indacene (23.22 mg, 0.026 mmol), 4,8-bis-(2-ethyl-hexyloxy)-2,6-bis-trimethylstannanyl-1,5-dithia-s-indacene (20.28 mg, 0.026 mmol), $Pd_2(dba)_3$ (1.83 mg, 2.05 μmol), $P(o\text{-Tol})_3$ (2.43 mg, 7.98 μmol) were combined in a 50 mL flask. The system was purged with argon before 10 mL of anhydrous chlorobenzene was added. The reaction mixture was heated at 130° C. for 18 hours. After cooling to room temperature, the polymer was precipitated out from methanol and further purified by Soxhlet extraction with methanol, hexane, dichloromethane, and chloroform. The product was purified by Soxhlet extraction one more time with chloroform and weighed 56.0 mg (82.3% yield) after being dried in vacuo.

Example 2G

Preparation of Polymer 7

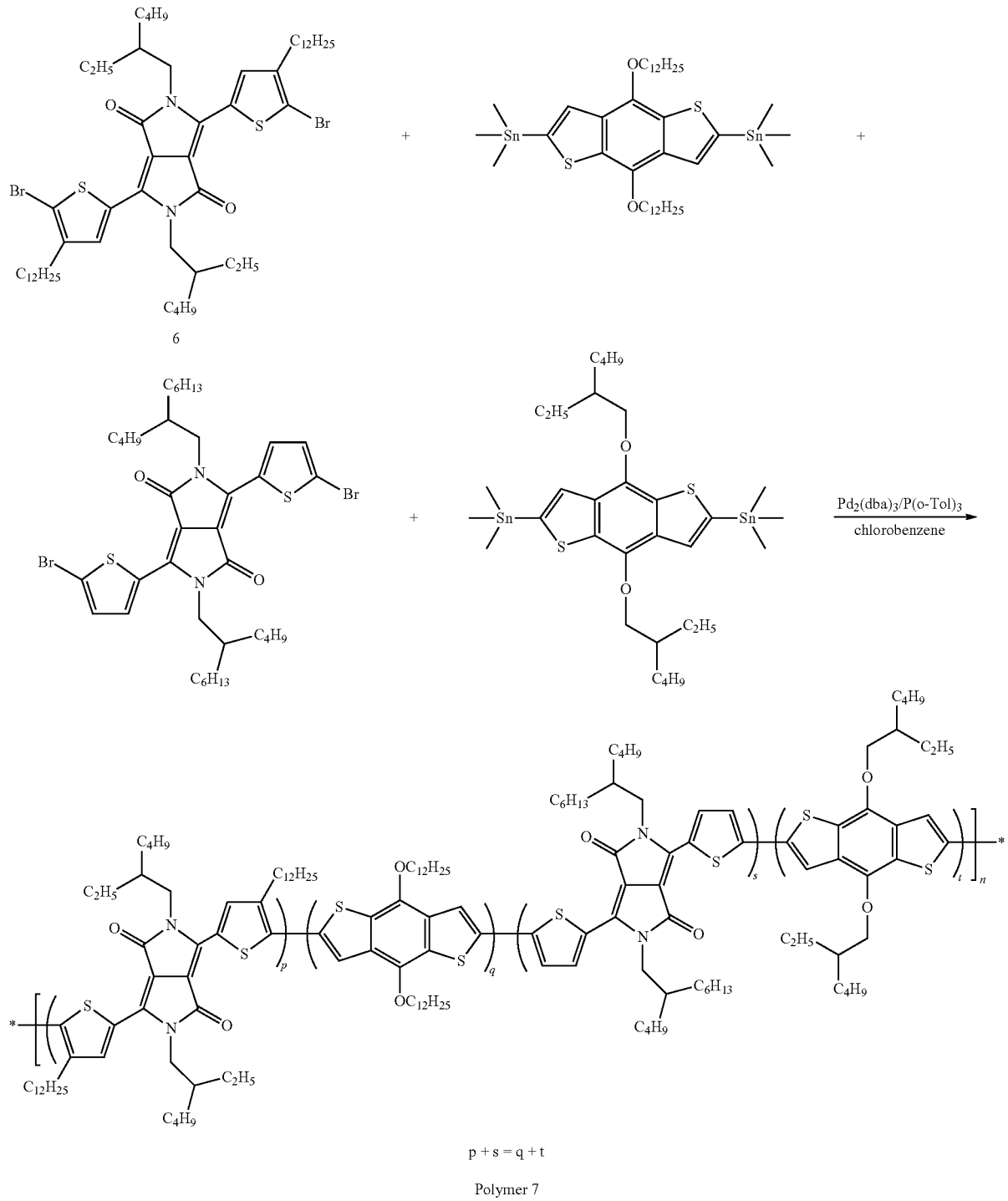

Polymer 7

3,6-Bis-(4-dodecyl-thiophen-2-yl)-2,5-bis-(2-ethyl-hexyl)-2,5-dihydro-pyrrolo[3,4-c]pyrrole-1,4-dione 6 (40.77 mg, 0.04 mmol), 3,6-bis-(5-bromo-thiophen-2-yl)-2,5-bis-(2-butyl-octyl)-2,5-dihydro-pyrrolo[3,4-c]pyrrole-1,4-dione (31.79 mg, 0.04 mmol), 4,8-bis-dodecyloxy-2,6-bis-trimethylstannanyl-1,5-dithia-s-indacene (35.38 mg, 0.042 mmol), 4,8-bis-(2-ethyl-hexyloxy)-2,6-bis-trimethylstannanyl-1,5-dithia-s-indacene (32.43 mg, 0.042 mmol), $Pd_2(dba)_3$ (2.93 mg, 3.28 µmol), $P(o\text{-}Tol)_3$ (3.89 mg, 12.8 µmol) were combined in a 50 mL flask. The system was purged with argon before 16 mL of anhydrous chlorobenzene was added. The reaction mixture was heated at 130° C. for 18 hours. After cooling to room temperature, the polymer was precipitated out from methanol and further purified by Soxhlet extraction with methanol, hexane, THF, toluene, and chloroform. The product was purified by Soxhlet extraction one more time with chlorobenzene and weighed 84 mg (84.2% yield) after being dried in vacuo.

Example 2H

Preparation of Polymer 8

3,6-Bis-(4-dodecyl-thiophen-2-yl)-2,5-bis-(2-ethylhexyl)-2,5-dihydro-pyrrolo[3,4-c]pyrrole-1,4-dione 6 (81.54 mg, 0.08 mmol), 2-dimethylstannanyl-4,8-didodecyl-6-trimethylstannanyl-1,5-dithia-s-indacene (52.26 mg, 0.06 mmol), 3,6-bis-(5-bromothiophen-2-yl)-2,5-bis-(2-butyloctyl)-pyrrolo[3,4-c]pyrrole-1,4-dione (31.79 mg, 0.04 mmol), Pd$_2$(dba)$_3$ (2.93 mg, 3.2 µmol), and P(o-Tol)$_3$ (3.89 mg, 12.8 µmol) were combined in a 50 mL flask. The system was purged with argon before 16 mL of anhydrous chlorobenzene was added. The reaction mixture was heated at 130° C. for 18 hours. After cooling down to room temperature, the polymer was precipitated out from methanol and further purified by a Soxhlet extractor with methanol, ethyl acetate, and dichlo-

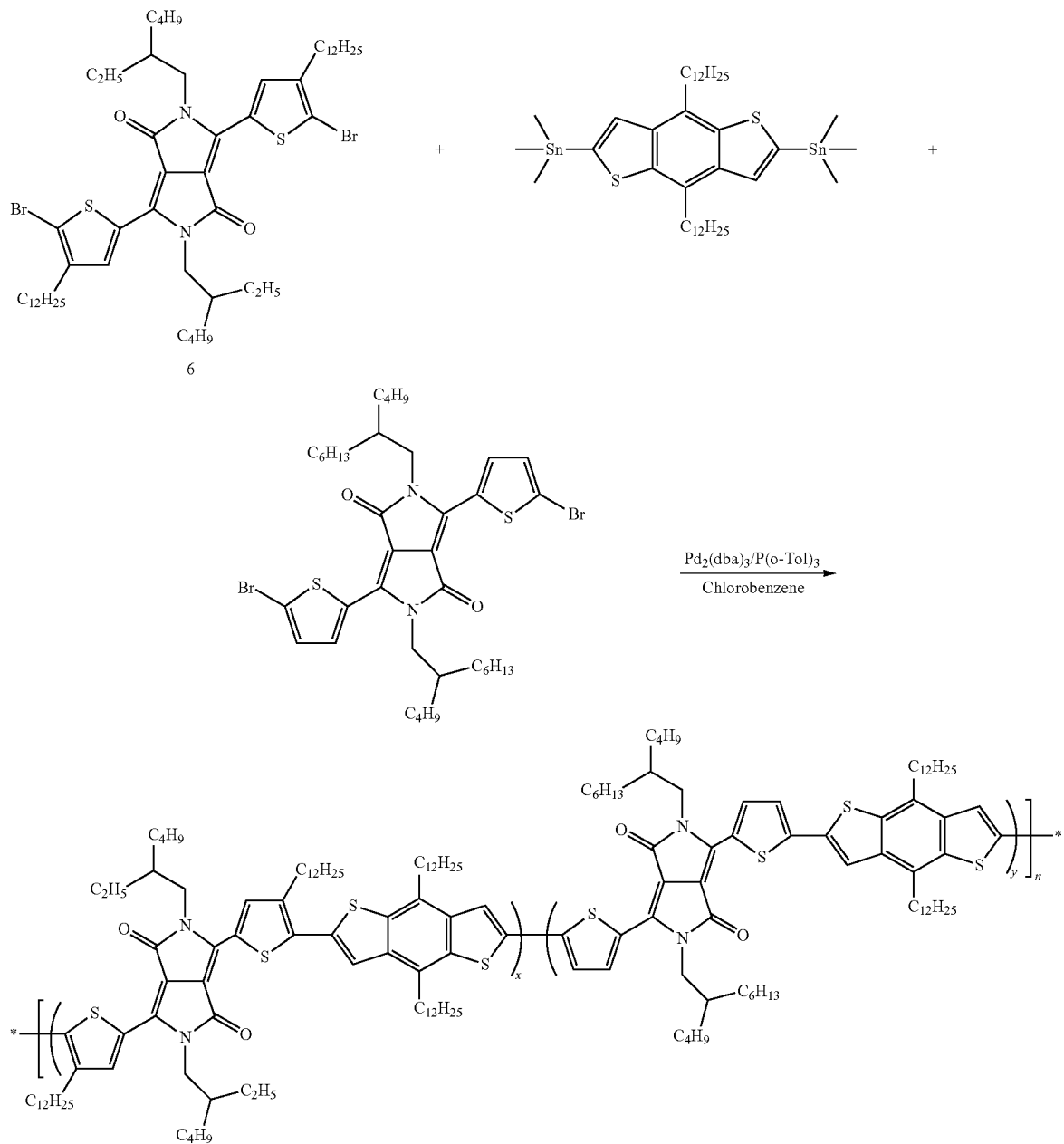

x/y = 1/2

Polymer 8 romethane. The product was extracted using a Soxhlet setup with chloroform, and weighed 70.0 mg (94.5% yield) after drying in vacuo.

Example 2I

Preparation of Polymer 9

3,6-Bis-(5-bromo-thieno[3,2-b]thiophen-2-yl)-2,5-bis-(2-ethyl-hexyl)-2,5-dihydro-pyrrolo[3,4-c]pyrrole-1,4-dione (18.14 mg, 0.02 mmol), 2-dimethylstannanyl-4,8-didodecyl-6-trimethylstannanyl-1,5-dithia-s-indacene (42.63 mg, 0.05 mmol), 3,6-bis-(5-bromo-6-undecyl-thieno[3,2-b]thiophen-2-yl)-2,5-bis-(2-butyl-octyl)-2,5-dihydro-pyrrolo[3,4-c]pyrrole-1,4-dione (36.46 mg, 0.03 mmol), Pd$_2$(dba)$_3$ (1.83 mg, 2.0 µmol), and P(o-Tol)$_3$ (2.43 mg, 8.0 µmol) were combined

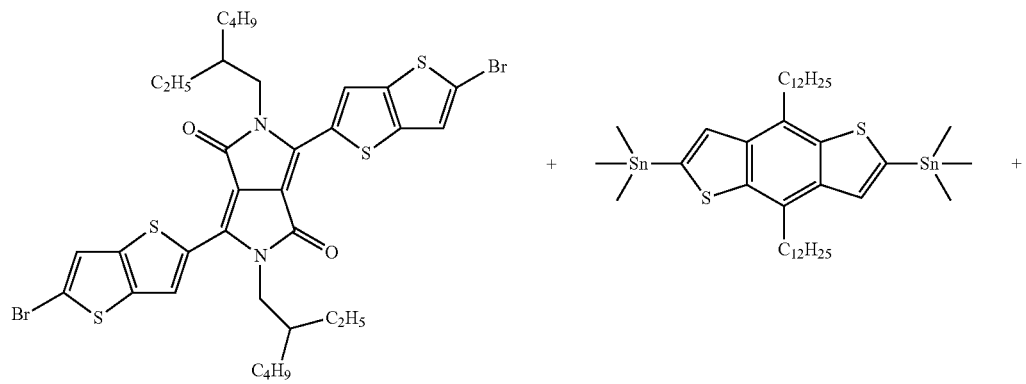

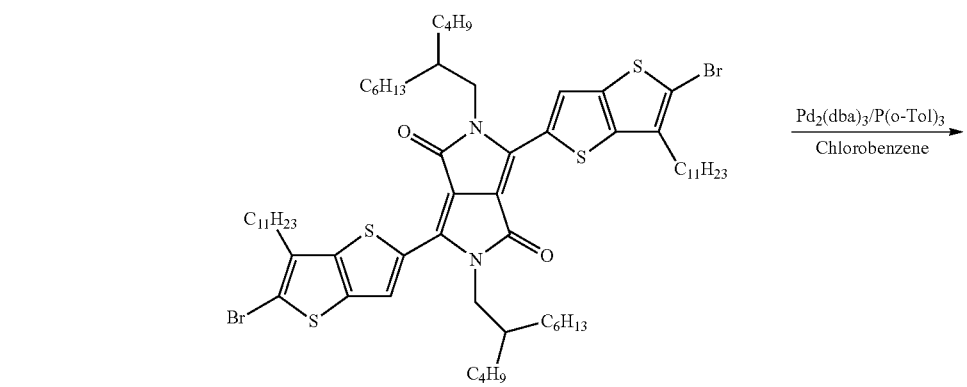

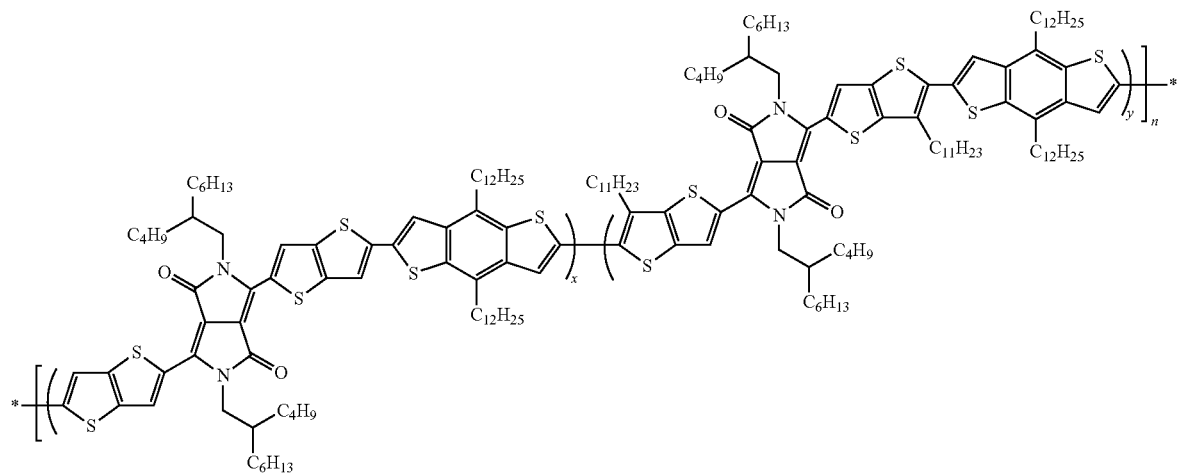

x:y = 2:3

Polymer 9 in a 50 mL flask. The system was purged with argon before 10 mL of anhydrous chlorobenzene was added. The reaction mixture was heated at 130° C. for 18 hours. After cooling down to room temperature, the polymer was precipitated out from methanol and further purified by a Soxhlet extractor with methanol, ethyl acetate, hexane, and dichloromethane. The product was extracted using a Soxhlet setup with chloroform, and weighed 36 mg (49.1% yield) after drying in vacuo.

Example 2J

Preparation of Polymer 10

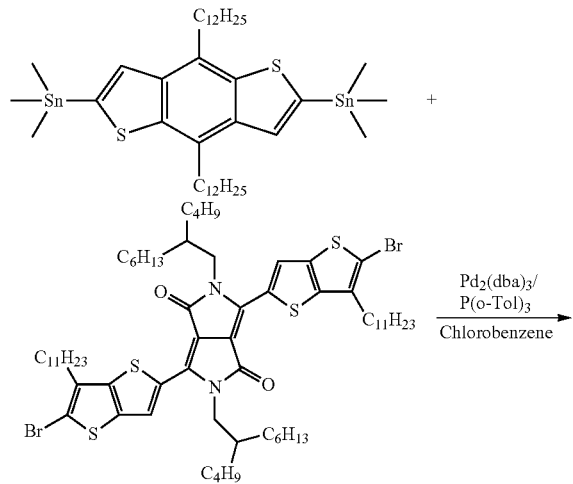

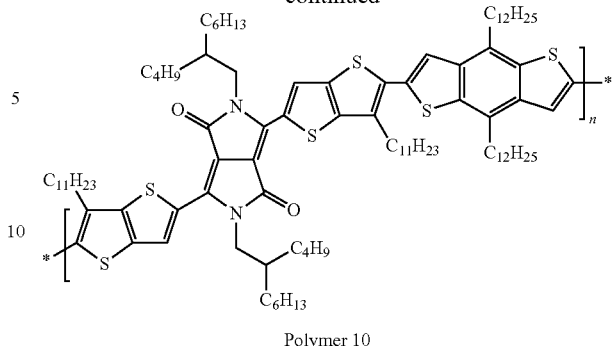

Polymer 10

2-Dimethylstannanyl-4,8-didodecyl-6-trimethylstannanyl-1,5-dithia-s-indacene (40.34 mg, 0.047 mmol), 3,6-bis-(5-bromo-6-undecyl-thieno[3,2-b]thiophen-2-yl)-2,5-bis-(2-butyl-octyl)-2,5-dihydro-pyrrolo[3,4-c]pyrrole-1,4-dione (54.78 mg, 0.045 mmol), Pd$_2$(dba)$_3$ (1.83 mg, 2.0 μmol), and P(o-Tol)$_3$ (2.43 mg, 8.0 μmol) were combined in a 50 mL flask. The system was purged with argon before 10 mL of anhydrous chlorobenzene was added. The reaction mixture was heated at 130° C. for 18 hours. After cooling down to room temperature, the polymer was precipitated out from methanol, followed by purification by Soxhlet extraction with methanol, EtOAc, hexane, and DCM. The product was extracted with chloroform using a Soxhlet setup and weighed 9.0 mg (11.3% yield) after drying in vacuo.

Example 2K

Preparation of Polymer 11

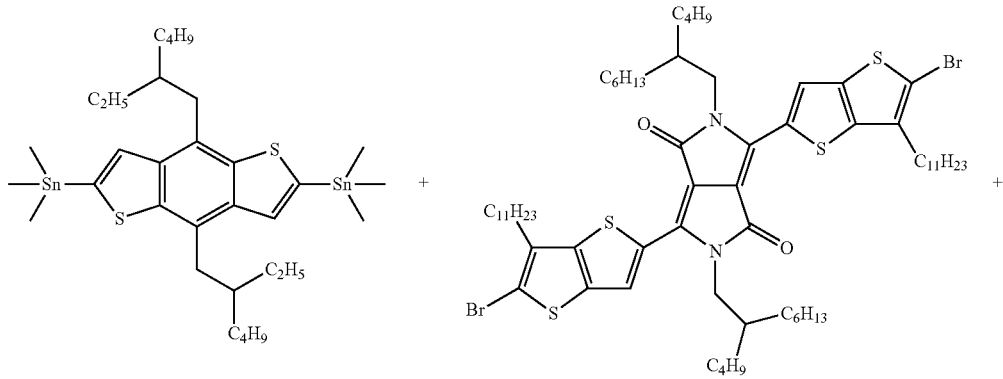

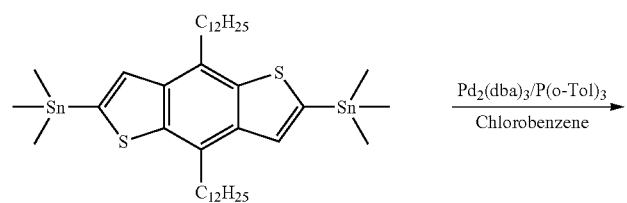

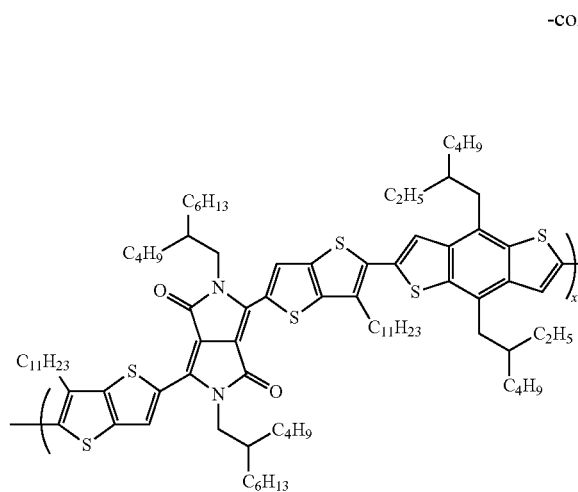

x:y = 1:3

Polymer 11

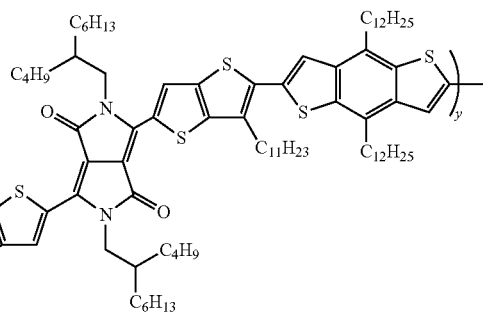

2-Dimethylstannanyl-4,8-didodecyl-6-trimethylstannanyl-1,5-dithia-s-indacene (8.53 mg, 0.01 mmol), 3,6-bis-(5-bromo-6-undecyl-thieno[3,2-b]thiophen-2-yl)-2,5-bis-(2-butyl-octyl)-2,5-dihydro-pyrrolo[3,4-c]pyrrole-1,4-dione (48.62 mg, 0.04 mmol), 4,8-bis-(2-ethyl-hexyloxy)-2,6-bis-trimethylstannanyl-1,5-dithia-s-indacene (22.21 mg, 0.03 mmol), $Pd_2(dba)_3$ (1.46 mg, 1.6 μmol), and $P(o-Tol)_3$ (1.94 mg, 7.2 μmol) were combined in a 50 mL flask. The system was purged with argon before 10 mL of anhydrous chlorobenzene was added. The reaction mixture was heated at 130° C. for 18 hours. After cooling down to room temperature, the polymer was precipitated out from methanol, followed by purification by Soxhlet extraction with methanol, EtOAc, hexane, and DCM. The product was extracted with chloroform using a Soxhlet setup and weighed 45.0 mg (yield 74.6%) after dried in vacuo.

Comparative Example

Preparation of Polymer A

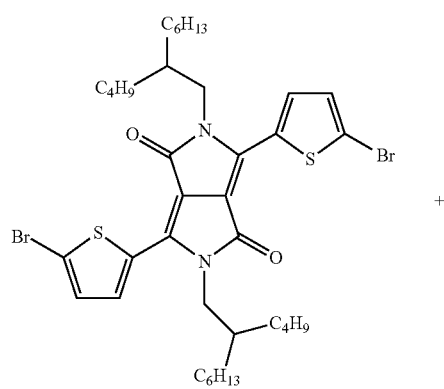

+

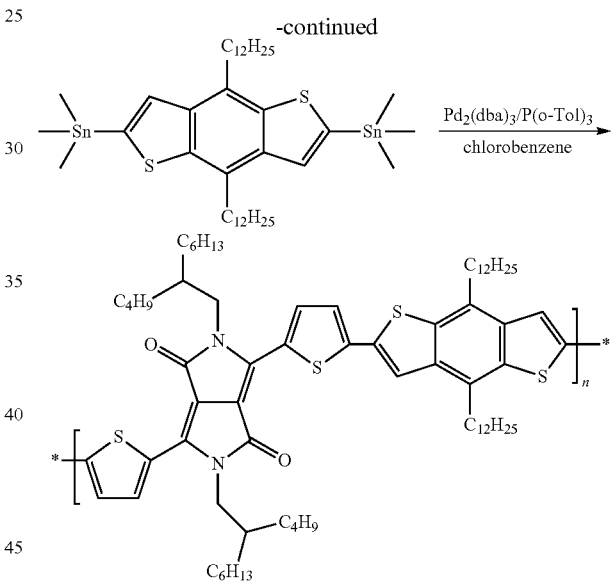

Polymer A

To a 100 mL storage vessel, 3,6-bis-(5-bromothiophen-2-yl)-2,5-bis-(2-butyloctyl)-pyrrolo[3,4-c]pyrrole-1,4-dione (27.8 mg, 35 μmol), 2,6-di(trimethylstannyl)-4,8-didodecyl-benzo[1,2-b:4,5-b']dithiophene (29.8 mg, 35 μmol), $Pd_2(dba)_3$ (1.3 mg, 4 mol %) and tri(o-tolyl)phosphine (1.7 mg, 16 mol %) were mixed in anhydrous chlorobenzene (5 mL) under argon and stirred at 133° C. for 72 hours. After cooling, it was poured into MeOH (50 mL), filtered and dried under vacuum to give a black solid (38.6 mg, yield 95%). The crude product was subjected to Soxhlet extraction with ethyl acetate, 1,4-dioxane, and chloroform, successively. The chloroform extract was poured into MeOH (100 mL) and the solid was collected by filtration. Finally, a maroon solid (32.1 mg, yield 79%, Mn=27 kDa, d=6.5) was obtained. Elemental Analysis: Calcd. C, 74.56; H, 9.21; N, 2.42. Found: C, 74.68, H, 8.97, N, 2.49.

Example 3

Device Fabrication and Characterization

Photovoltaic devices incorporating polymers according to the present teachings were fabricated and characterized. Comparative photovoltaic devices incorporating Polymer A were fabricated and characterized in an analogous manner. Before device fabrication, the patterned ITO-coated glass substrates were cleaned by ultrasonic treatment in detergent, de-ionized water, acetone, and isopropyl alcohol sequentially, and UV-ozone treatment for 40 minutes. A PEDOT:PSS layer of about 40 nm thickness was spin-coated from an aqueous solution (HC Stark, Baytron AI 4083) onto ITO-coated glass substrates, followed by baking at 150° C. for 30 minutes in air. The present polymers (and similarly Polymer A) was mixed with C70-PCBM (purchased from SES Research) in chloroform at a ratio of 5:10 mg/mL with different solvent additives such as dichlorobenzene. The resulting solution was stirred for more than two hours at 55° C. in a glove box and then spin-coated on top of the PEDOT:PSS layer. To complete the device fabrication, a thin layer (about 0.6 nm) of lithium fluoride (LiF) and a thin layer of aluminum (about 100 nm) were successively deposited thermally under vacuum of ~$10^{-6}$ Torr. The active area of the device was 0.93 cm$^2$. The devices were then encapsulated with a cover glass using EPO-TEK OG112-6 UV curable epoxy (Epoxy Technology) in the glove box.

The photovoltaic characteristics of the encapsulated devices were tested in air. The current density-voltage (J-V) curves were obtained by a Keithley 2400 source-measure unit. The photocurrent was measured under simulated AM1.5G irradiation (100 mW cm$^{-2}$) using a xenon-lamp-based solar simulator (Newport 91160A 300 W Class-A Solar Simulator, 2 inch by 2 inch uniform beam) with an air mass 1.5 global filter. The light intensity was set using a NREL calibrated silicon photodiode with a color filter. External quantum efficiency was measured using Newport's QE setup. Incident light from a xenon lamp (300 W) passing through a monochromator (Newport, Cornerstone 260) was focused on the active area of the cell. The output current was measured using a current pre-amplifier (Newport, 70710QE) and a lock-in amplifier (Newport, 70105 Dual channel Merlin). A calibrated silicon diode (Newport 70356) was used as a reference.

The results are reported in Table 1 below.

TABLE 1

Performance Data of Solar Cells Fabricated with Blends of Polymer 4 and Polymer A with C70-PCBM

| Material | $V_{oc}$ [V] | $J_{sc}$ [mA/cm$^2$] | FF [%] | PCE [%] |
|---|---|---|---|---|
| Polymer 4 | 0.70 | 13.97 | 66.8 | 6.53 |
| Polymer 5 | 0.70 | 14.54 | 63.7 | 6.51 |
| Polymer 8 | 0.70 | 13.18 | 71.2 | 6.56 |
| Polymer A | 0.70 | 11.9 | 61.1 | 5.1 |

Figure 2:
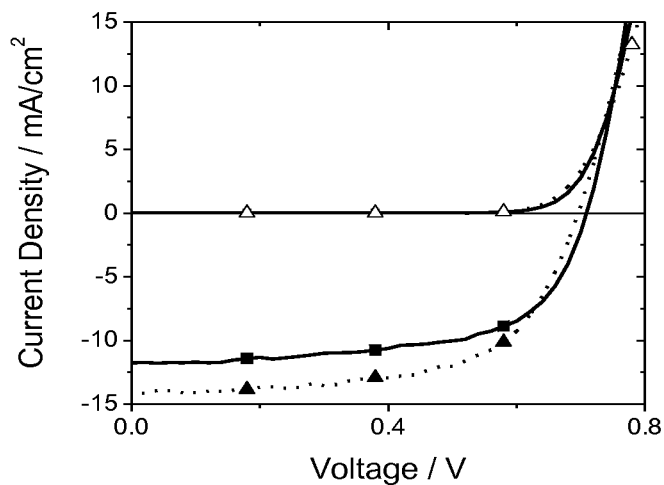
FIG. 2 compares the current density-voltage (J-V) plot of a representative photovoltaic device (triangles) having a blend heterojunction layer prepared from a mixture of a polymer of the present teachings (Polymer 4) and C70-PCBM to that of a comparative photovoltaic device (squares) having a blend heterojunction layer prepared from a mixture of comparative Polymer A and C70-PCBM. Open symbols show dark JV-curves and solid symbols show illuminated JV-curves (simulated AM1.5G, 100 mW/cm$^2$).
Figure 3:
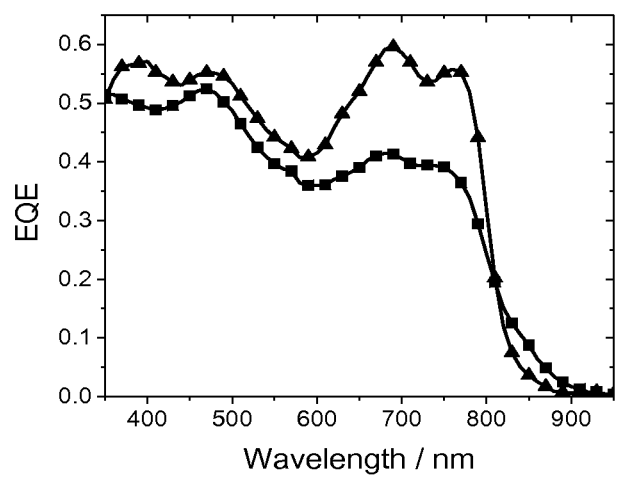
FIG. 3 shows representative EQE-spectra of the two devices described in FIG. 2, namely, the device incorporating an active layer based upon a blend of Polymer 4:C70-PCBM (triangles) and the device incorporating an active layer based upon a blend of Polymer A:C70-PCBM (squares).

FIG. 2 provides the current density-voltage (J-V) plots, whereas FIG. 3 shows the External Quantum Efficiency (EQE) spectra of the devices incorporating Polymer 4 and Polymer A, respectively. An EQE curve shows how efficient a photovoltaic device converts incoming photons to extracted electrons at each wavelength of incoming light. EQE values therefore are directly related to the short circuit current density ($J_{sc}$) of a device. Referring to FIG. 3, it can be seen that the device incorporating Polymer 4 converts photons to electrons more efficiently than the comparative device incorporating Polymer A. Without wishing to be bound by any particular theory, it is believed that the higher efficiencies provided by the present polymers can be attributed to optimized crystallinity of the pristine polymer (Polymer 4), and more specifically, optimized crystalline domain size in the polymer blend (Polymer 4:C70-PCBM).

Further experiments were conducted to compare the external quantum efficiency between a photovoltaic device incorporating Polymer 4 and a comparative photovoltaic device incorporating a random copolymer comprising a 2,1,3-benzothiadiazole moiety (Polymer B) in place of a diketopyrrolopyrrole moiety. The structure of Polymer B is shown below, where each R is a branched $C_{6-40}$ alkyl group and each R' is a linear $C_{6-20}$ alkyl group:

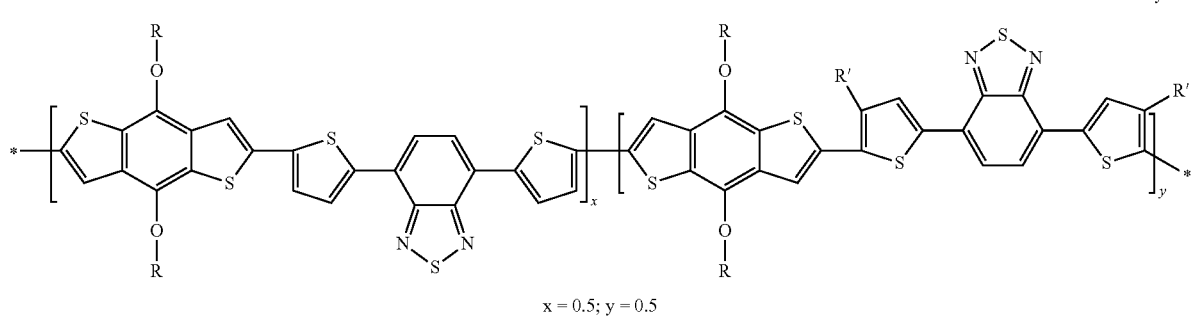

Polymer B x = 0.5; y = 0.5

Figure 4:
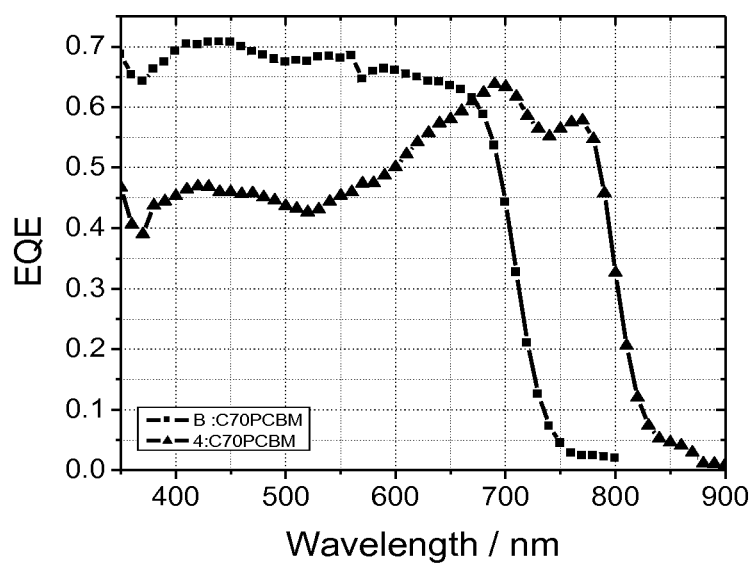
FIG. 4 compares the EQE-spectra of a representative photovoltaic device (triangles) having a blend heterojunction layer prepared from a mixture of a polymer of the present teachings (Polymer 4) and C70-PCBM to that of a comparative photovoltaic device (squares) having a blend heterojunction layer prepared from a mixture of comparative Polymer B and C70-PCBM.

FIG. 4 shows the EQE spectra of the devices incorporating Polymer 4 and Polymer B, respectively. It can be seen that Polymer 4 peaks at about 710 nm, with a shoulder between about 750-800 nm. By comparison, the EQE of Polymer B decreases significantly at wavelengths larger than about 700 nm.

Figure 5:
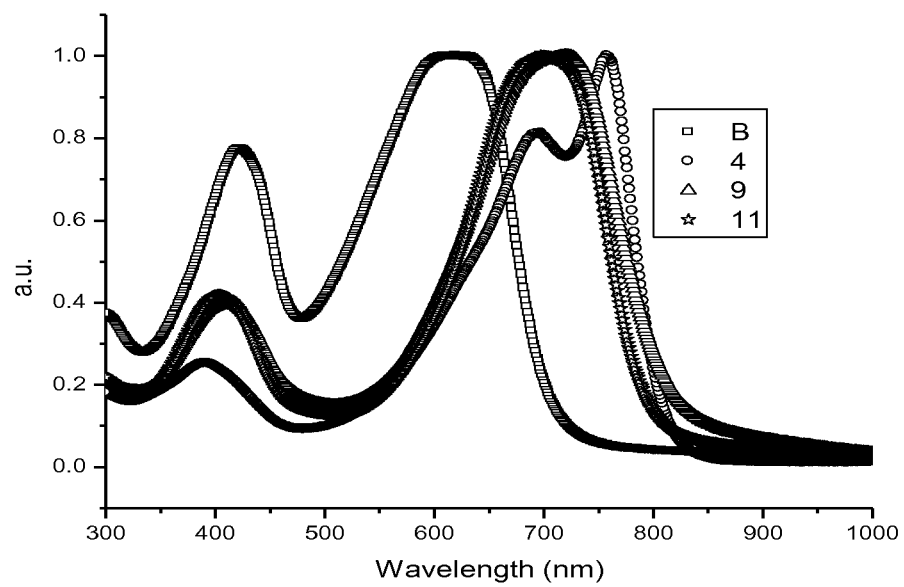
FIG. 5 shows the absorbance spectra of several representative polymers according to the present teachings. The absorbance spectrum of Polymer B is included for comparison.

FIG. 5 shows the absorbance spectra of representative polymers according to the present teachings, specifically, Polymer 4, Polymer 9, and Polymer 11. The absorbance spectrum of Polymer B is included for comparison. It can be seen that random copolymers according to the present teachings absorb effectively within the range of about 700-750 nm.

The present teachings encompass embodiments in other specific forms without departing from the spirit or essential characteristics thereof. The foregoing embodiments are therefore to be considered in all respects illustrative rather than limiting on the present teachings described herein. Scope of the present invention is thus indicated by the appended claims rather than by the foregoing description, and all changes that come within the meaning and range of equivalency of the claims are intended to be embraced therein.

The invention claimed is:

1. An optoelectronic device comprising an anode, a cathode optionally one or more anode interlayers, optionally one or more cathode interlayers, and in between the anode and the cathode a photoactive component, the photoactive component comprising a fullerene compound and a random copolymer, wherein the random copolymer is represented by formula (IVa) or (VIIIa):

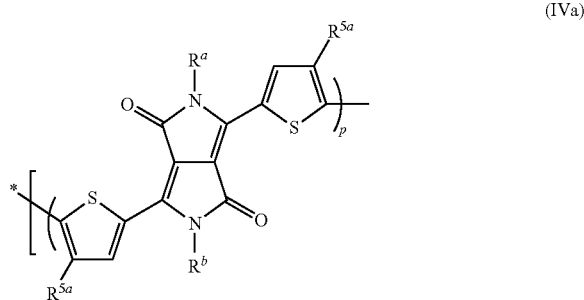
(IVa)

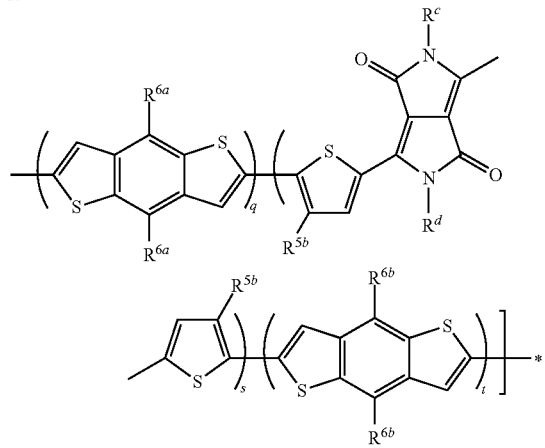
(VIIIa)

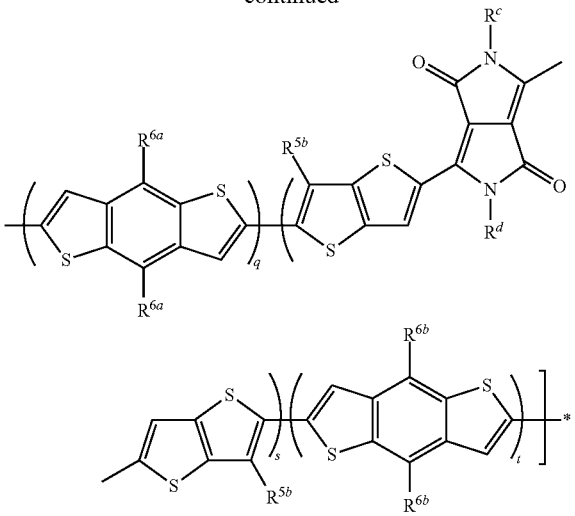

wherein:
$R^a$ and $R^b$ are $C_{6-40}$ alkyl groups;
$R^c$ and $R^d$ are $C_{6-40}$ alkyl groups identical to or different from $R^a$ and $R^b$;
$R^{5a}$ is a $C_{6-40}$ alkyl group;
$R^{5b}$ is H or a $C_{6-40}$ alkyl group;
$R^{6a}$ and $R^{6b}$ are identical or different and independently are selected from —$R^5$, —$OR^5$, —$SR^5$ and —Y—$R^5$, wherein Y is a divalent $C_{6-14}$ aryl group or a divalent 5-14 membered heteroaryl group;
and $R^5$, at each occurrence, independently is a $C_{6-40}$ alkyl group optionally substituted with 1-5 substituents independently selected from a halogen, —CN, —$NH_2$, —NH($C_{1-20}$ alkyl), —N($C_{1-20}$ alkyl)$_2$, —$SiH_3$, —SiH($C_{1-20}$ alkyl)$_2$, —$SiH_2$($C_{1-20}$ alkyl), —Si($C_{1-20}$ alkyl)$_3$, an —O—$C_{1-20}$ alkyl group, and an —S—$C_{1-20}$ alkyl group; and
p, q, s and t are real numbers representing mole fractions, wherein $0.025 \leq p \leq 0.975$, $0.025 \leq q \leq 0.975$, $0.025 \leq s \leq 0.975$, $0.025 \leq t \leq 0.975$, and the sum of p, q, s, and t is about 1;
provided that at least one of the following is true: (a) $R^c$ and $R^d$ are $C_{6-40}$ alkyl groups different from $R^a$ and $R^b$, (b) $R^{5a}$ is a $C_{6-40}$ alkyl group and $R^{5b}$ is H; and (c) $R^{6a}$ and $R^{6b}$ are different; and
wherein the random copolymer has a molecular weight in the range of about 1,000 to about 500,000.

2. The device of claim 1, wherein each $R^{5b}$ is H.

3. The device of claim 1, wherein each $R^{5b}$ is a $C_{6-40}$ alkyl group.

4. The device of claim 1, wherein $R^{6a}$ and $R^{6b}$ are different from each other and independently are selected from —$R^5$ and —$OR^5$, wherein $R^5$, at each occurrence, independently is a linear or branched $C_{6-40}$ alkyl group.

5. The device of claim 1, wherein $R^{6a}$ and $R^{6b}$ are identical or different —O—$C_{6-40}$ alkyl groups optionally substituted with a —Si($C_{1-20}$ alkyl)$_3$ group.

6. The device of claim 1, wherein $R^{6a}$ and $R^{6b}$ are identical or different $C_{6-40}$ alkyl groups optionally substituted with a —Si($C_{1-20}$ alkyl)$_3$ group.

7. The device of claim 1, wherein $R^a$ and $R^b$ are different from $R^c$ and $R^d$; $R^{5b}$ is H; or $R^{6a}$ is different from $R^{6b}$.

8. The device of claim 1, wherein the photoactive component comprises a blend material, the blend material comprising the fullerene compound as an electron-acceptor and the random copolymer as an electron-donor.

9. The device of claim 1, wherein the fullerene compound is [6,6]-phenyl-$C_{61}$-butyric acid methyl ester (PCBM) or a derivative thereof.

10. The device of claim 1, wherein the device is an organic photovoltaic device having a power conversion efficiency of at least about 5%.

11. The device of claim 1, wherein the device is an organic photodetector.

12. The device of claim 1, wherein $R^a$, $R^b$, $R^c$ and $R^d$ are identical branched $C_{6-40}$ alkyl groups; $R^{5a}$ and $R^{5b}$ are identical linear $C_{6-40}$ alkyl groups; $R^{6a}$ is a linear $C_{6-40}$ alkyl group; and $R^{6b}$ is a branched $C_{6-40}$ alkyl group.

13. The device of claim 1, wherein $R^a$, $R^b$, $R^c$ and $R^d$ are identical branched $C_{6-40}$ alkyl groups; $R^{5a}$ and $R^{5b}$ are identical linear $C_{6-40}$ alkyl groups; $R^{6a}$ is an —O-linear $C_{6-40}$ alkyl group; and $R^{6b}$ is an —O-branched $C_{6-40}$ alkyl group.

14. The device of claim 1, wherein $R^a$, $R^b$, $R^c$ and $R^d$ are identical branched $C_{6-40}$ alkyl groups; $R^{5a}$ is a linear $C_{6-40}$ alkyl groups; $R^{5b}$ is H; and $R^{6a}$ and $R^{6b}$ are identical.

15. The device of claim 1, wherein $R^a$, $R^b$, $R^c$ and $R^d$ are identical branched $C_{6-40}$ alkyl groups; $R^{5a}$ is a linear $C_{6-40}$ alkyl groups; $R^{5b}$ is H; and $R^{6a}$ and $R^{6b}$ are identical $C_{6-40}$ alkyl groups.

16. The device of claim 1, wherein $R^a$, $R^b$, $R^c$ and $R^d$ are identical branched $C_{6-40}$ alkyl groups; $R^{5a}$ is a linear $C_{6-40}$ alkyl groups; $R^{5b}$ is H; and $R^{6a}$ and $R^{6b}$ are identical —O—$C_{6-40}$ alkyl groups.

17. The device of claim 1, wherein $R^a$, $R^b$, $R^c$ and $R^d$ are identical branched $C_{6-40}$ alkyl groups; $R^{5a}$ is a linear $C_{6-40}$ alkyl groups; $R^{5b}$ is H; and $R^{6b}$ is different from $R^{6a}$.

18. The device of claim 1, wherein $R^a$, $R^b$, $R^c$ and $R^d$ are identical branched $C_{6-40}$ alkyl groups; $R^{5a}$ is a linear $C_{6-40}$ alkyl groups; $R^{5b}$ is H; $R^{6a}$ is a linear $C_{6-40}$ alkyl group; and $R^{6b}$ is a branched $C_{6-40}$ alkyl group.

19. The device of claim 1, wherein $R^a$, $R^b$, $R^c$ and $R^d$ are identical branched $C_{6-40}$ alkyl groups; $R^{5a}$ is a linear $C_{6-40}$ alkyl groups; $R^{5b}$ is H; $R^{6a}$ is an —O-linear $C_{6-40}$ alkyl group; and $R^{6b}$ is an —O-branched $C_{6-40}$ alkyl group.

* * * * *